(12) United States Patent
Roth

(10) Patent No.: US 10,966,331 B2
(45) Date of Patent: Mar. 30, 2021

(54) MOUNTING SYSTEM, DEVICES, METHODS AND USES THEREOF

(71) Applicant: Core-Arms, LLC, Laguna Hills, CA (US)

(72) Inventor: David Roth, Laguna Hills, CA (US)

(73) Assignee: Core-Arms, LLC, Laguna Hills, CA (US)

( * ) Notice: Subject to any disclaimer, the term of this patent is extended or adjusted under 35 U.S.C. 154(b) by 0 days.

(21) Appl. No.: 16/749,973

(22) Filed: Jan. 22, 2020

(65) Prior Publication Data

US 2020/0236799 A1 Jul. 23, 2020

Related U.S. Application Data

(60) Provisional application No. 62/877,270, filed on Jul. 22, 2019, provisional application No. 62/796,494, (Continued)

(51) Int. Cl.
*F16B 2/18* (2006.01)
*F16B 2/10* (2006.01)
(Continued)

(52) U.S. Cl.
CPC ......... *H05K 5/0204* (2013.01); *H05K 5/0221* (2013.01); *B25B 1/2405* (2013.01);
(Continued)

(58) Field of Classification Search
CPC ........... B25B 1/103; B25B 1/22; B25B 1/125; B25B 1/2405; B25B 13/12; B25B 13/14; B25B 1/08; B25B 5/068; F16B 2/10; F16B 2/12; F16B 2/185; F16B 7/0493; F16B 1/02; F16B 2200/40; F16B 2200/403;
(Continued)

(56) References Cited

U.S. PATENT DOCUMENTS

| | | | |
|---|---|---|---|
| 2,734,409 A * | 2/1956 | Schum et al. | B25B 1/2405 |
| | | | 269/78 |
| 2002/0061225 A1* | 5/2002 | Boucher | F16B 7/0493 |
| | | | 403/386 |

(Continued)

OTHER PUBLICATIONS

WIPO, PCT Form ISA210, International Search Report for International Patent Application Serial No. PCT/US2020/014675, pp. 8 (dated Apr. 9, 2020).

(Continued)

*Primary Examiner* — Binh B Tran
*Assistant Examiner* — Michael A Matey
(74) *Attorney, Agent, or Firm* — UltimatEdge IP Law Group, P.C.; Dean G. Stathakis

(57) ABSTRACT

The present specification discloses systems, devices, and methods provide a mounting system which includes rail and a bracket which is selectively secured to the rail. The bracket is selectively and/or automatically locked to the rail when positioned on the rail, and may be removed from the rail by activating one or more buttons or actuators. The disclosed mounting systems, devices, and methods enable a device to be protected from impact and moisture exposure, enable a device to be securely mounted on a base, and/or enable a device to be quickly secured and removed from a base.

20 Claims, 35 Drawing Sheets

Related U.S. Application Data filed on Jan. 24, 2019, provisional application No. 62/795,539, filed on Jan. 22, 2019.

(51) Int. Cl.
| | | |
|---|---|---|
| *F16B 2/02* | (2006.01) | |
| *H05K 5/00* | (2006.01) | |
| *H05K 5/02* | (2006.01) | |
| *H05K 5/06* | (2006.01) | |
| *B25B 1/24* | (2006.01) | |
| *B25B 5/06* | (2006.01) | |
| *B25B 5/00* | (2006.01) | |

(52) U.S. Cl.
CPC . *B25B 5/00* (2013.01); *B25B 5/06* (2013.01); *F16B 2/10* (2013.01); *H05K 5/0008* (2013.01); *H05K 5/0086* (2013.01); *H05K 5/069* (2013.01)

(58) Field of Classification Search
CPC . F16B 2/18; F16B 5/121; F16B 5/126; H05K 5/0204; H05K 7/1474; H05K 5/0221; H05K 5/0008; H05K 5/0086; H05K 5/069; E05Y 2600/502
See application file for complete search history.

(56) References Cited

U.S. PATENT DOCUMENTS

| | | | | |
|---|---|---|---|---|
| 2003/0090048 | A1* | 5/2003 | Varzino | B25B 5/006 269/95 |
| 2004/0118886 | A1* | 6/2004 | Mirshafiee | B60R 9/045 224/315 |
| 2006/0120040 | A1* | 6/2006 | Chen | H05K 7/20172 361/695 |
| 2006/0255220 | A1* | 11/2006 | Skripps | A61G 13/101 248/228.4 |
| 2010/0181454 | A1 | 7/2010 | Vogt | |
| 2012/0296335 | A1* | 11/2012 | Mullaney | A61B 17/6466 606/59 |
| 2014/0007408 | A1* | 1/2014 | Nool | A61M 5/1418 29/525.01 |
| 2014/0021667 | A1 | 1/2014 | Wang | |
| 2015/0300386 | A1 | 10/2015 | Fong et al. | |
| 2015/0369564 | A1 | 12/2015 | Wilson | |
| 2016/0136028 | A1* | 5/2016 | Koch | F16M 13/022 5/503.1 |
| 2016/0281920 | A1* | 9/2016 | Perez | A61G 13/101 |
| 2017/0008155 | A1* | 1/2017 | Hanlon | B25B 1/2489 |
| 2017/0224569 | A1* | 8/2017 | Pfeuffer | B25B 5/08 |
| 2017/0326015 | A1* | 11/2017 | Katzenstein | F16B 2/10 |
| 2019/0339037 | A1* | 11/2019 | Burton | F16B 2/10 |
| 2019/0350093 | A1* | 11/2019 | Lin | F16M 13/022 |

OTHER PUBLICATIONS

WIPO, PCT Form ISA237, Written Opinion for International Patent Application Serial No. PCT/US2020/014675, pp. 6 (dated Apr. 9, 2020).

* cited by examiner

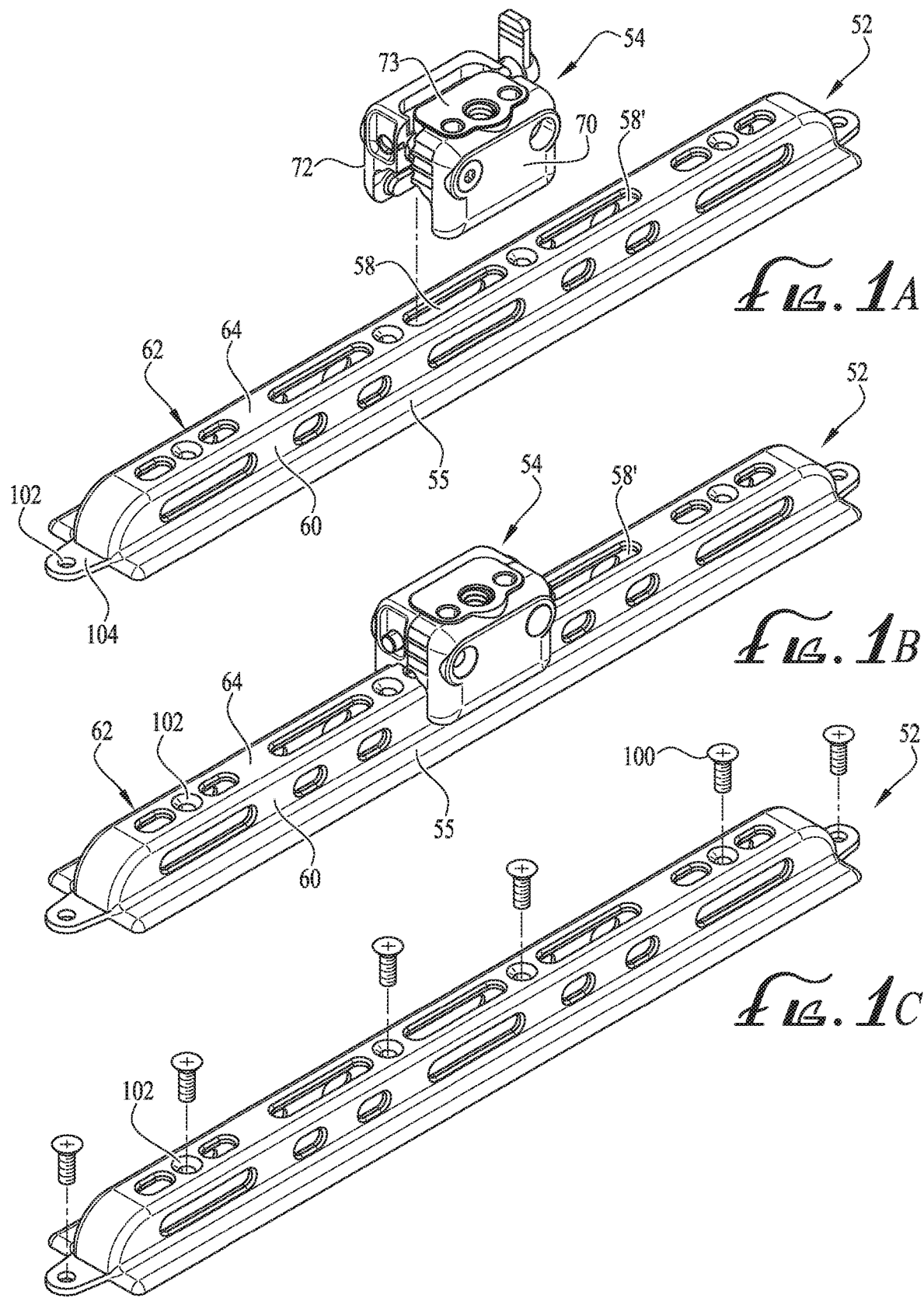

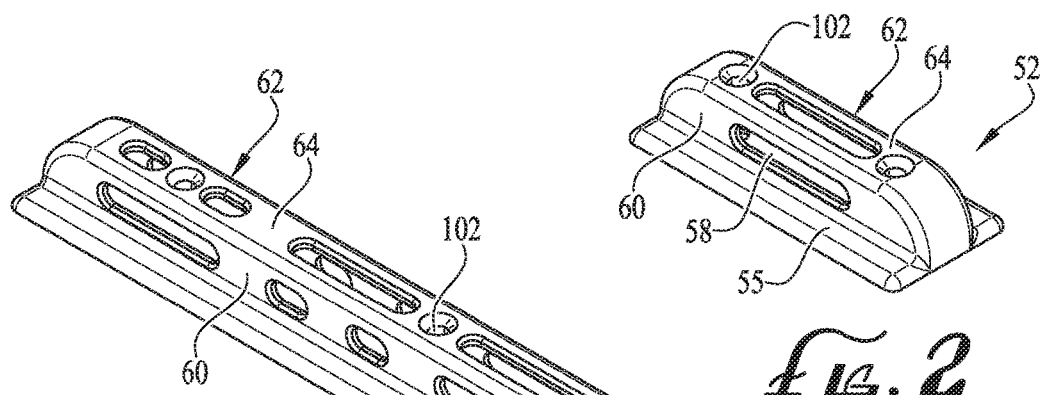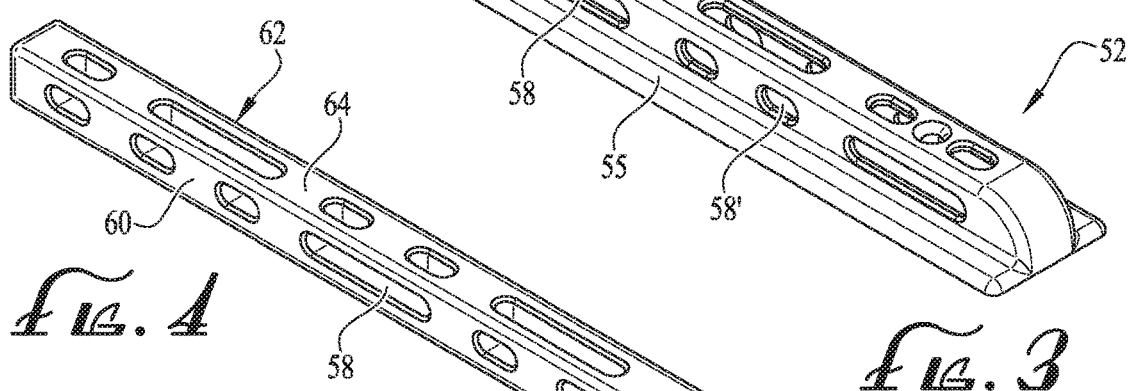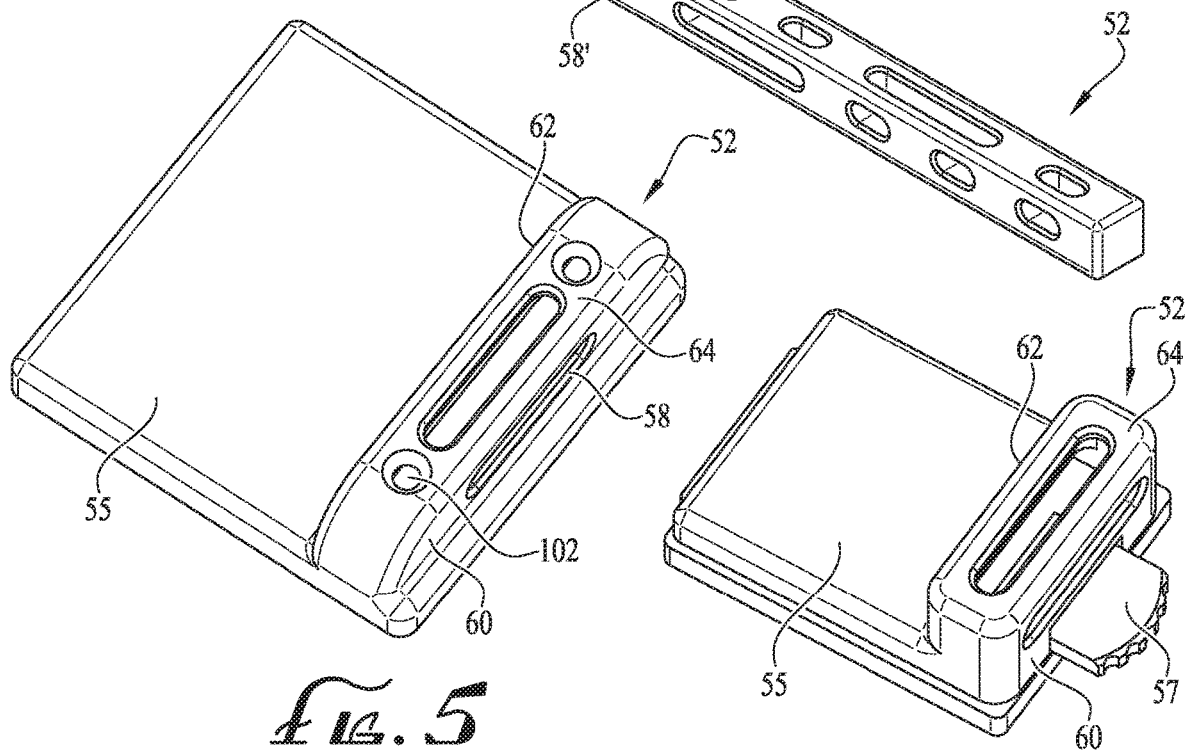

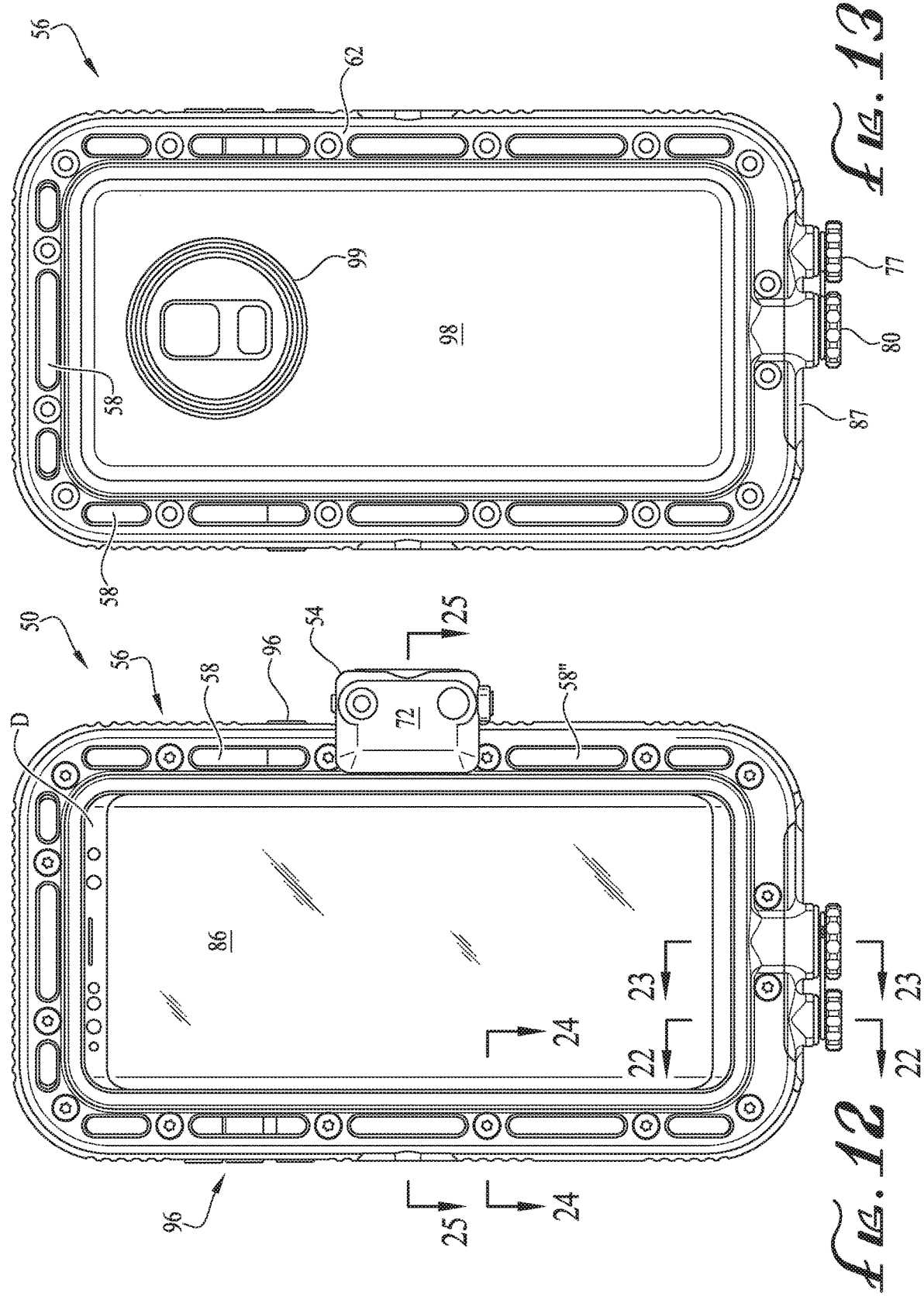

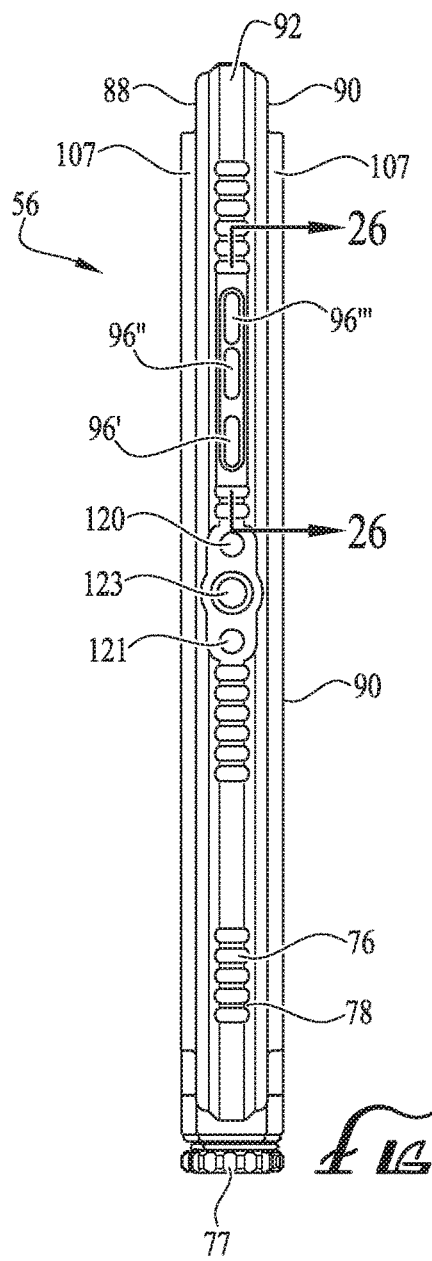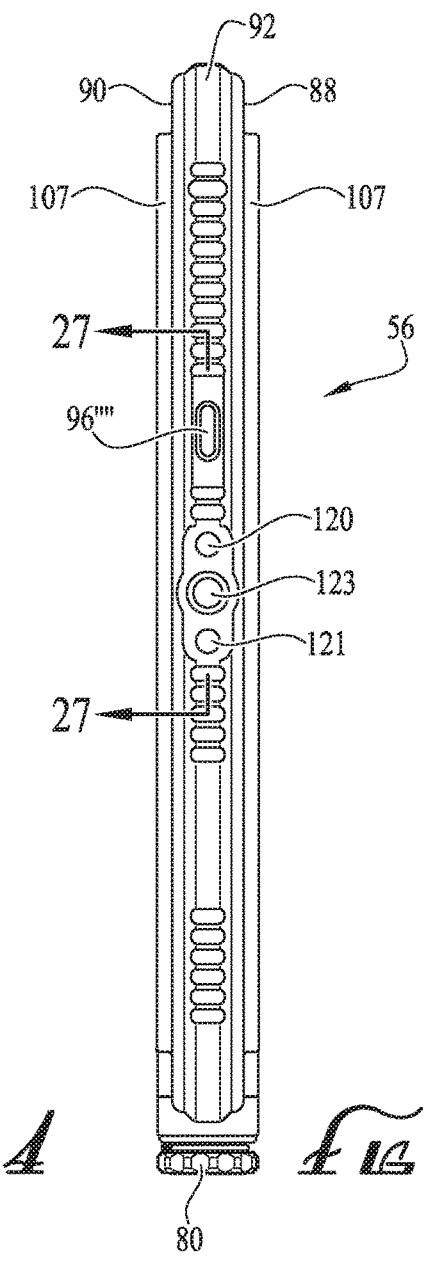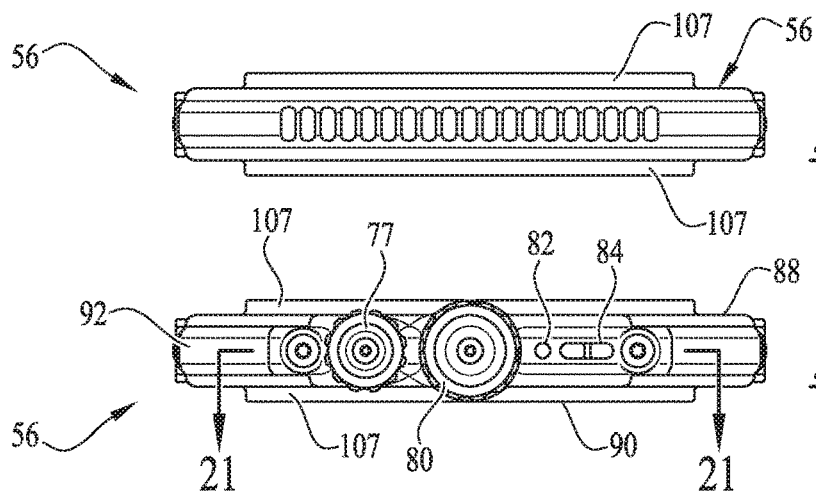

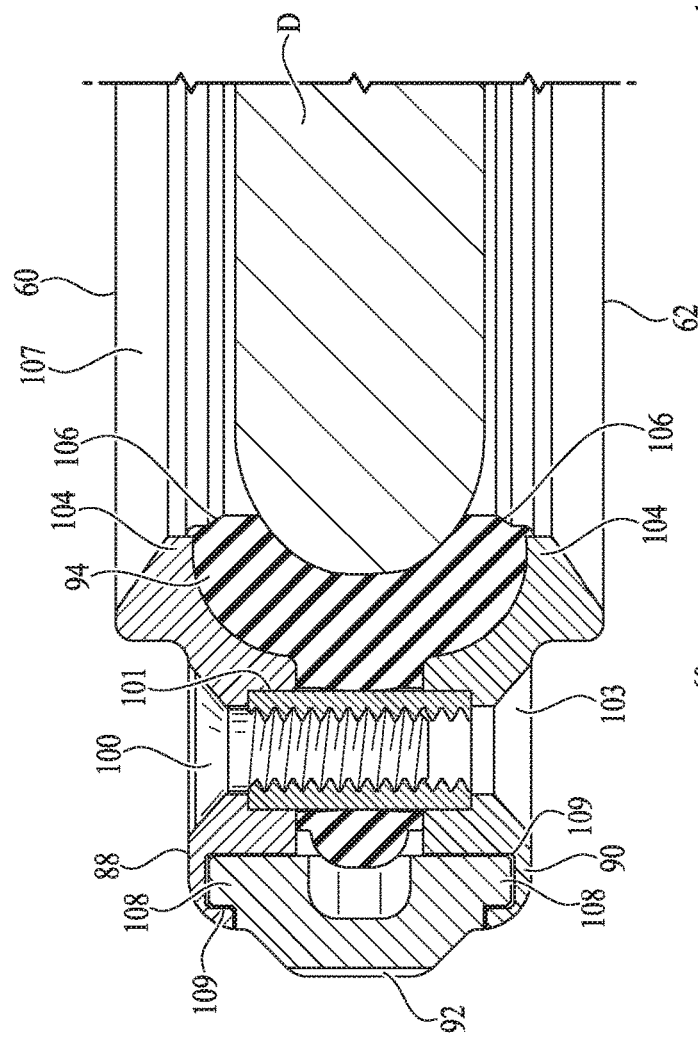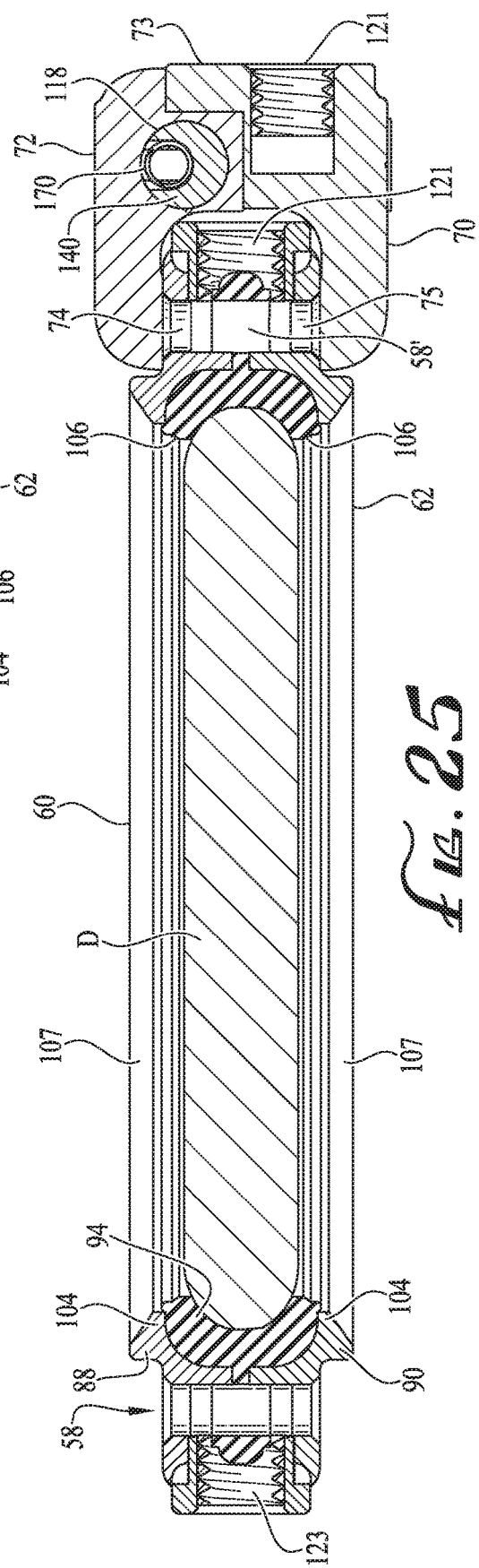

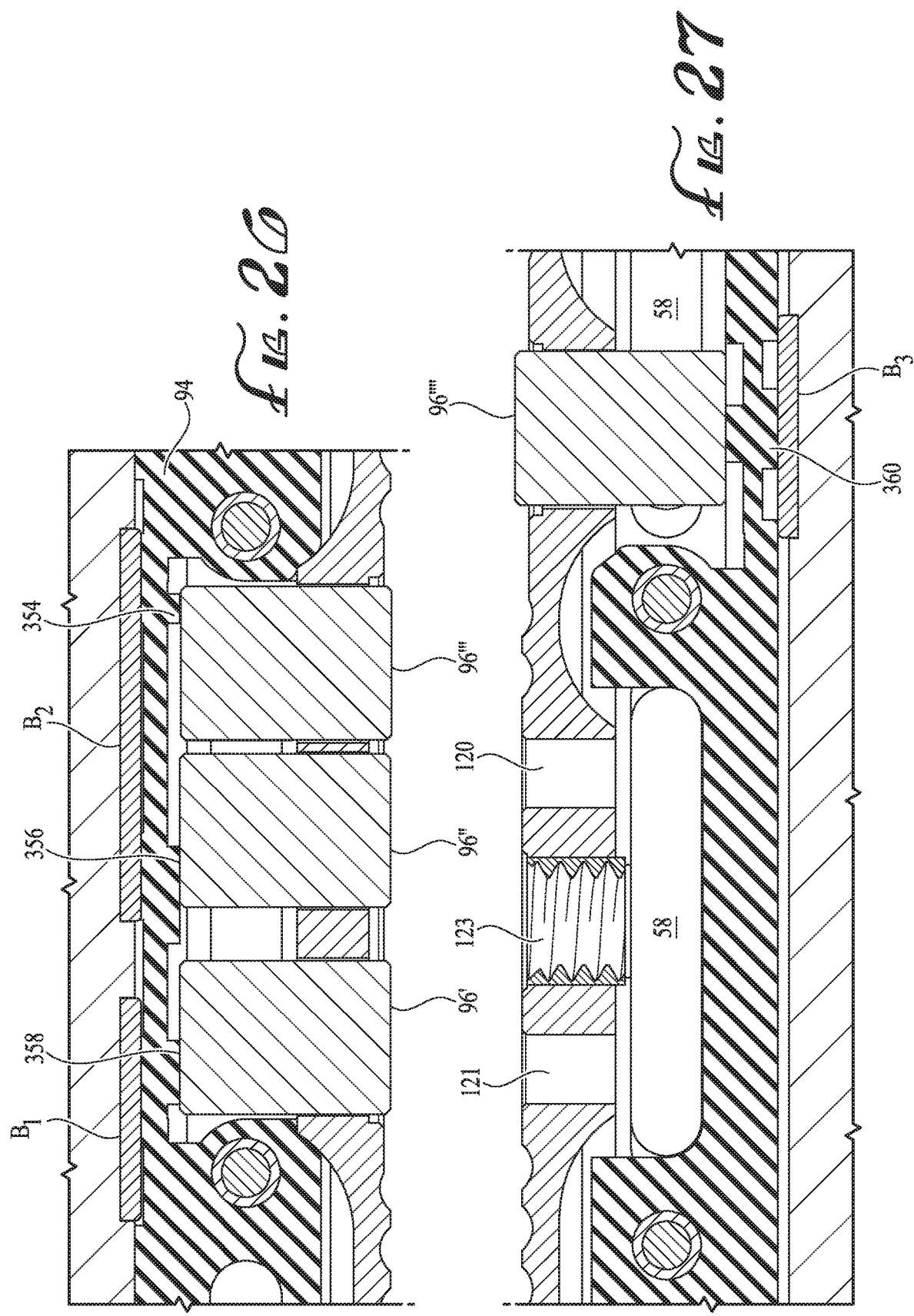

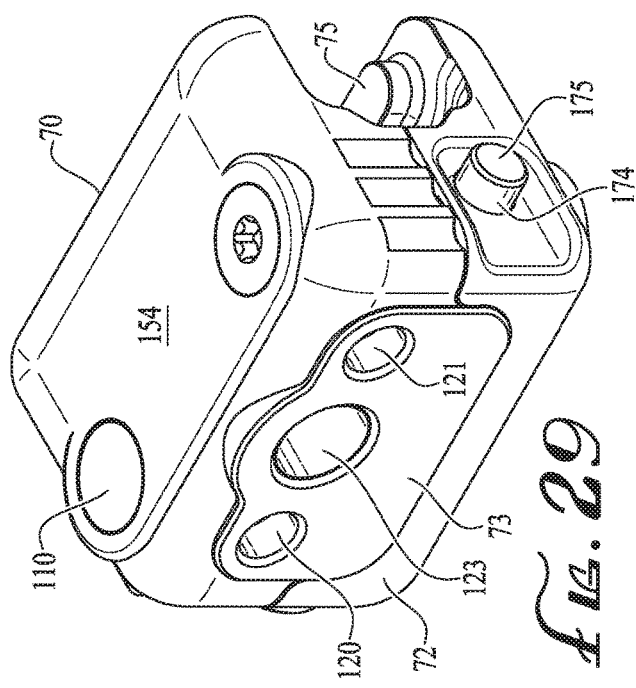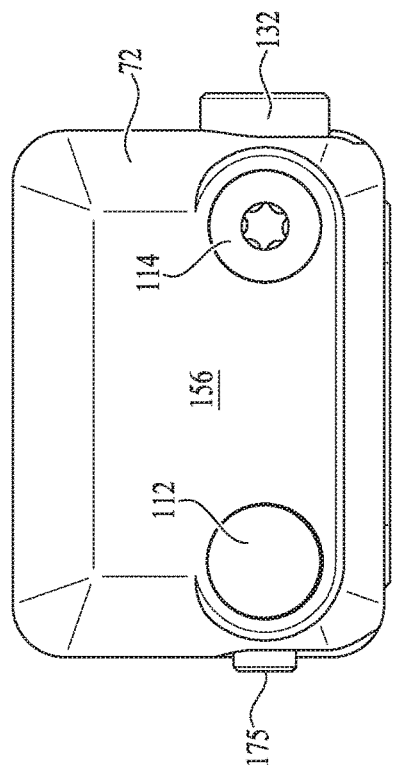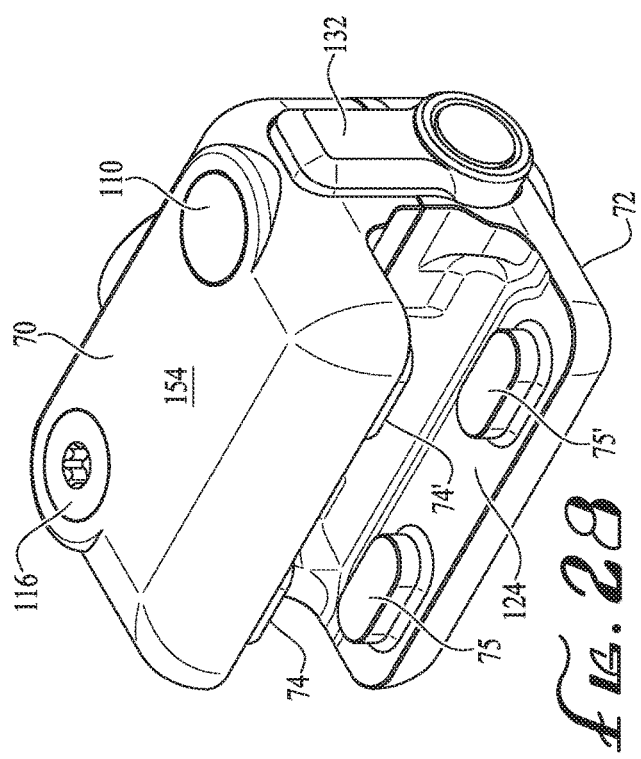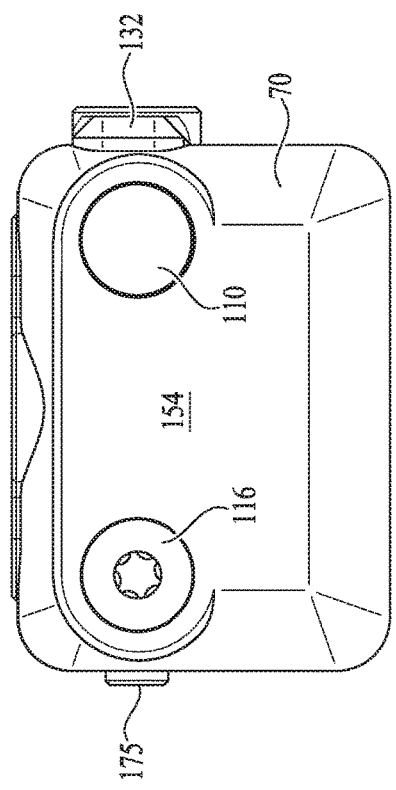

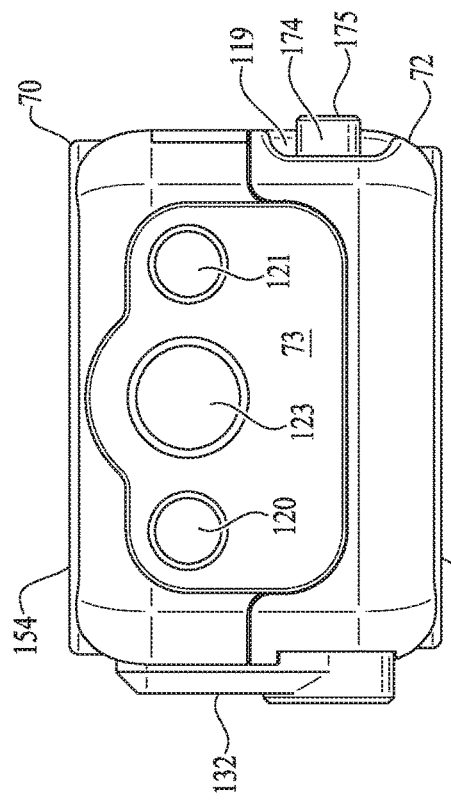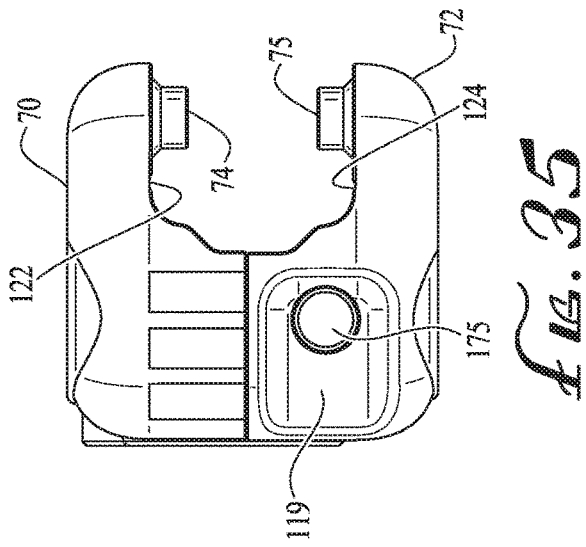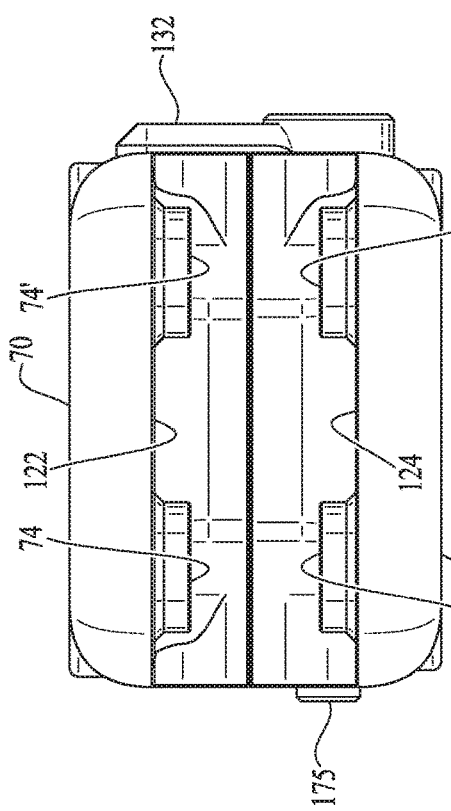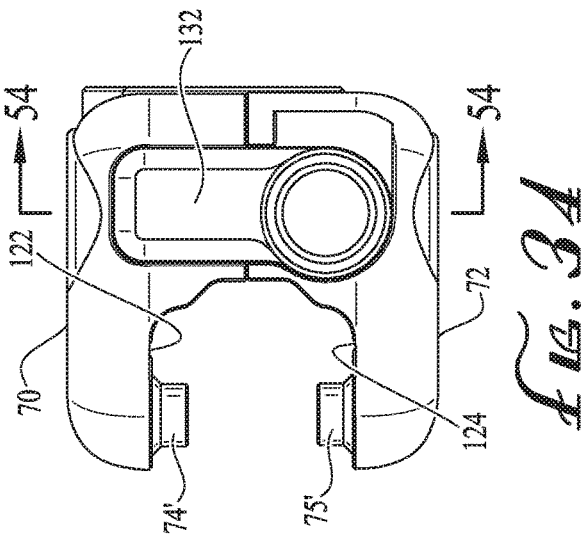

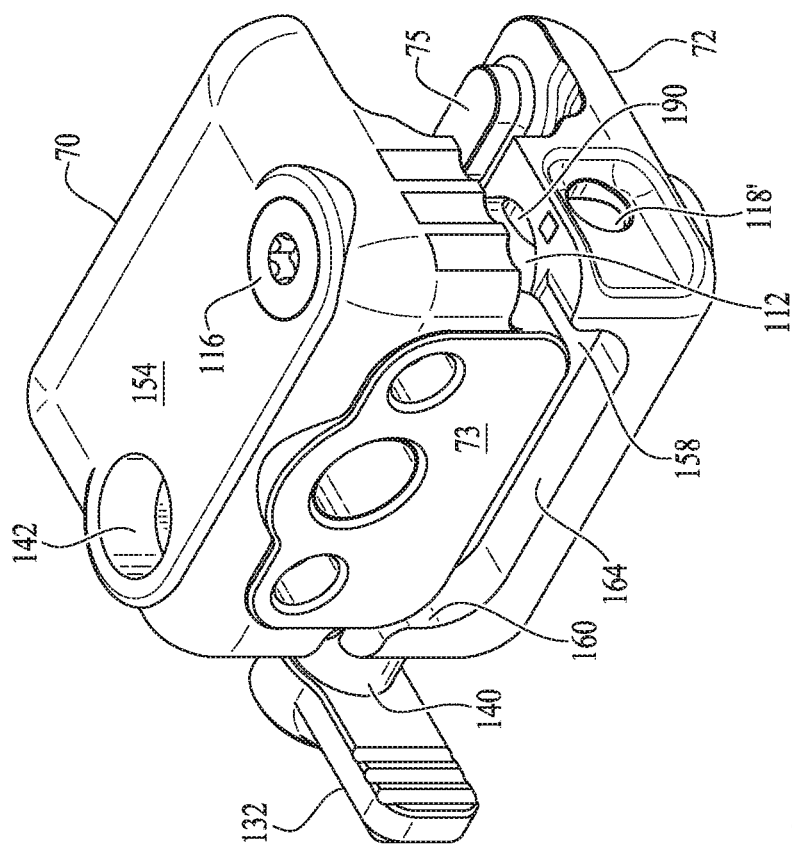
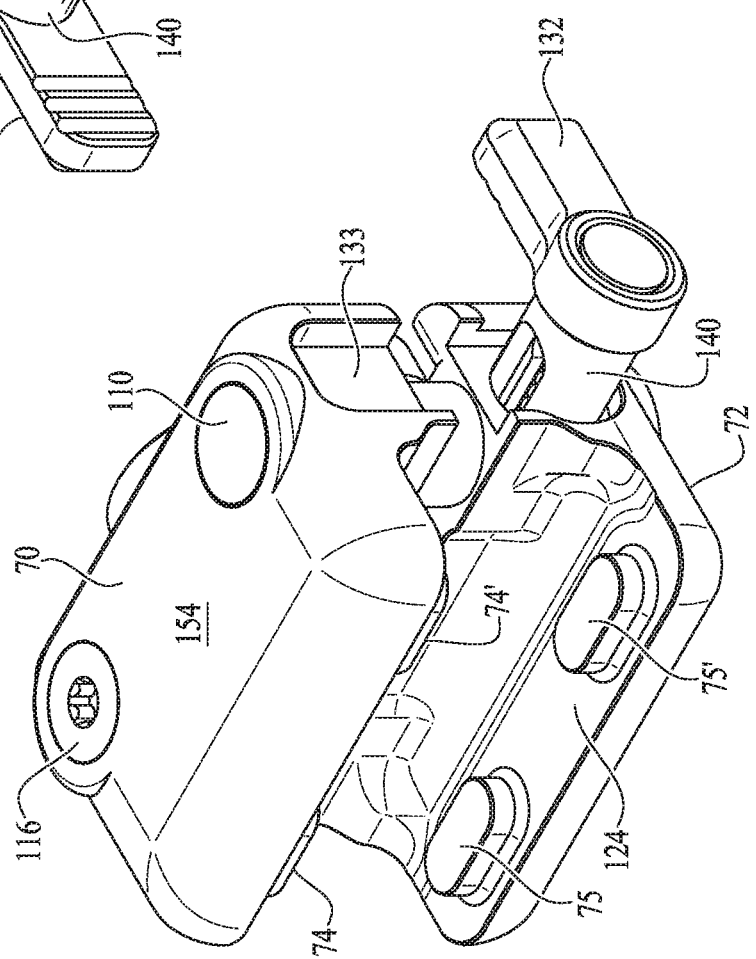

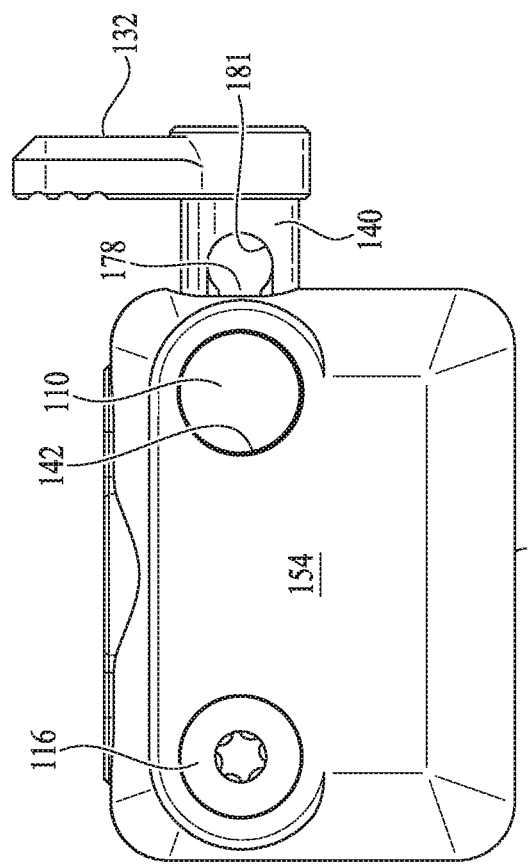
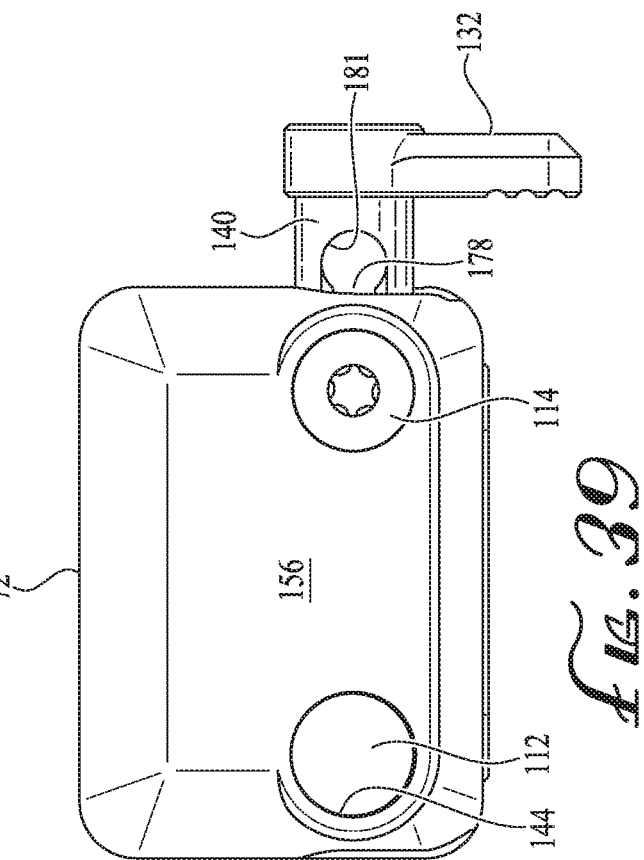

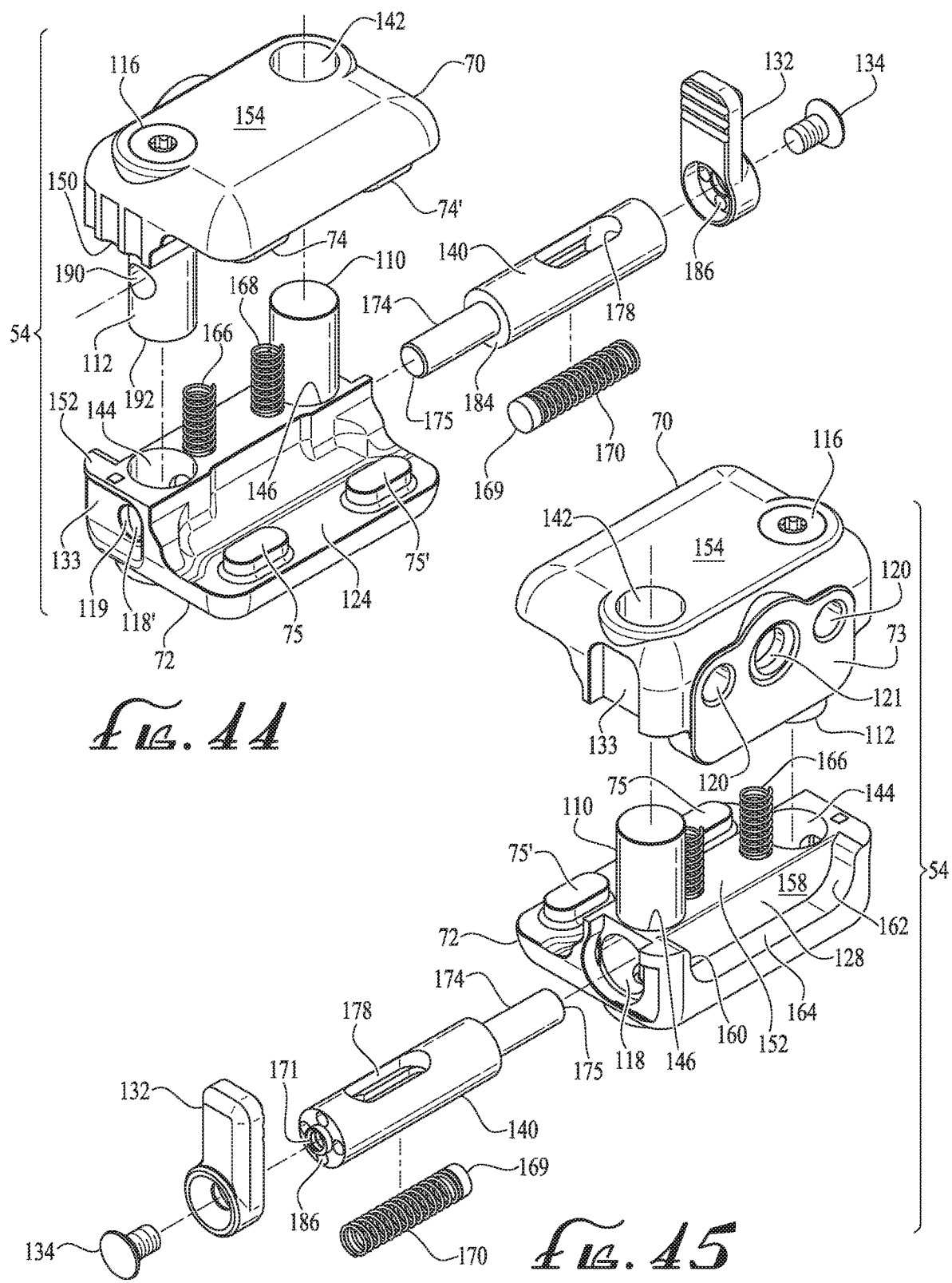

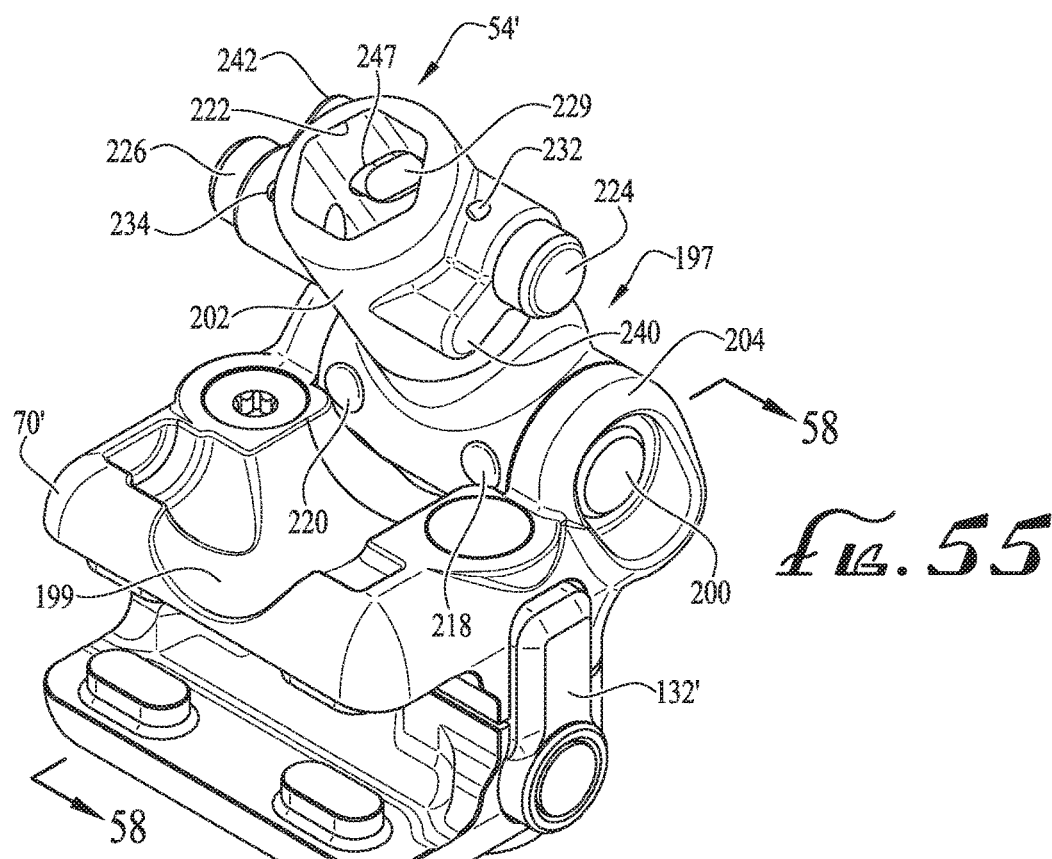
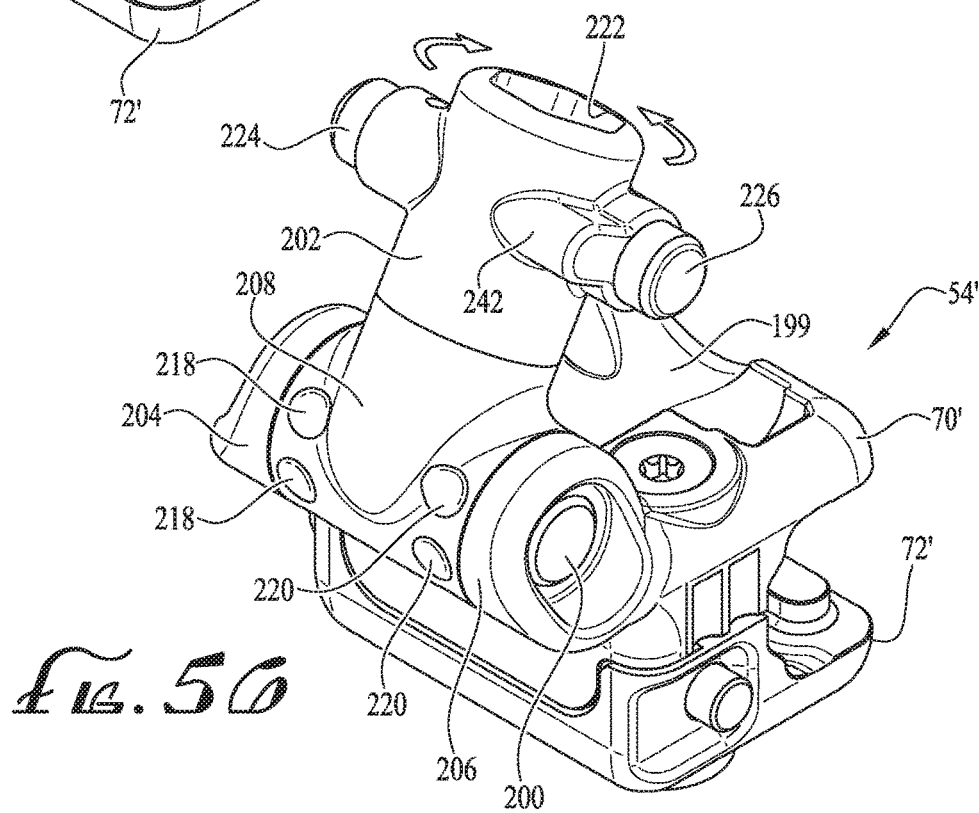

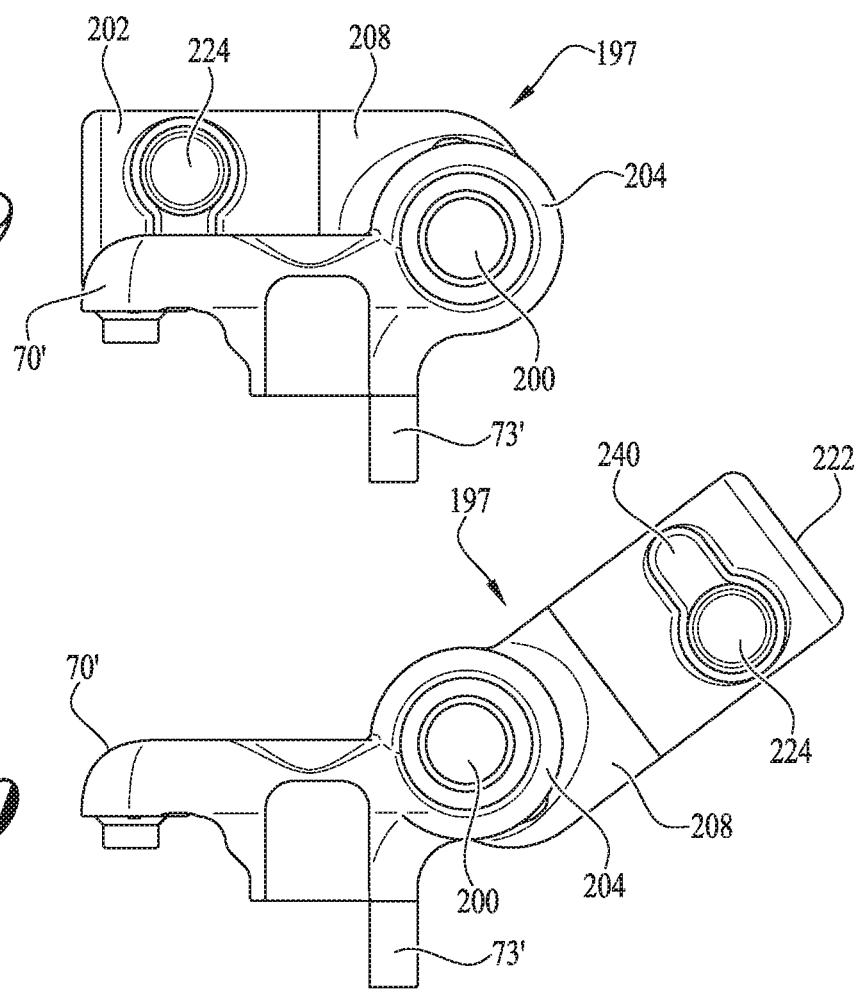
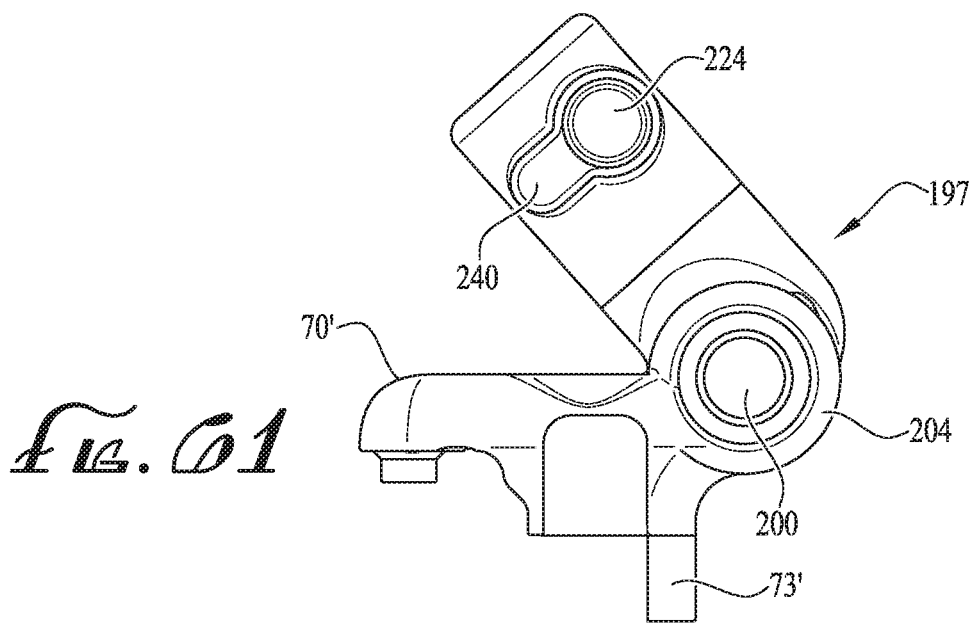

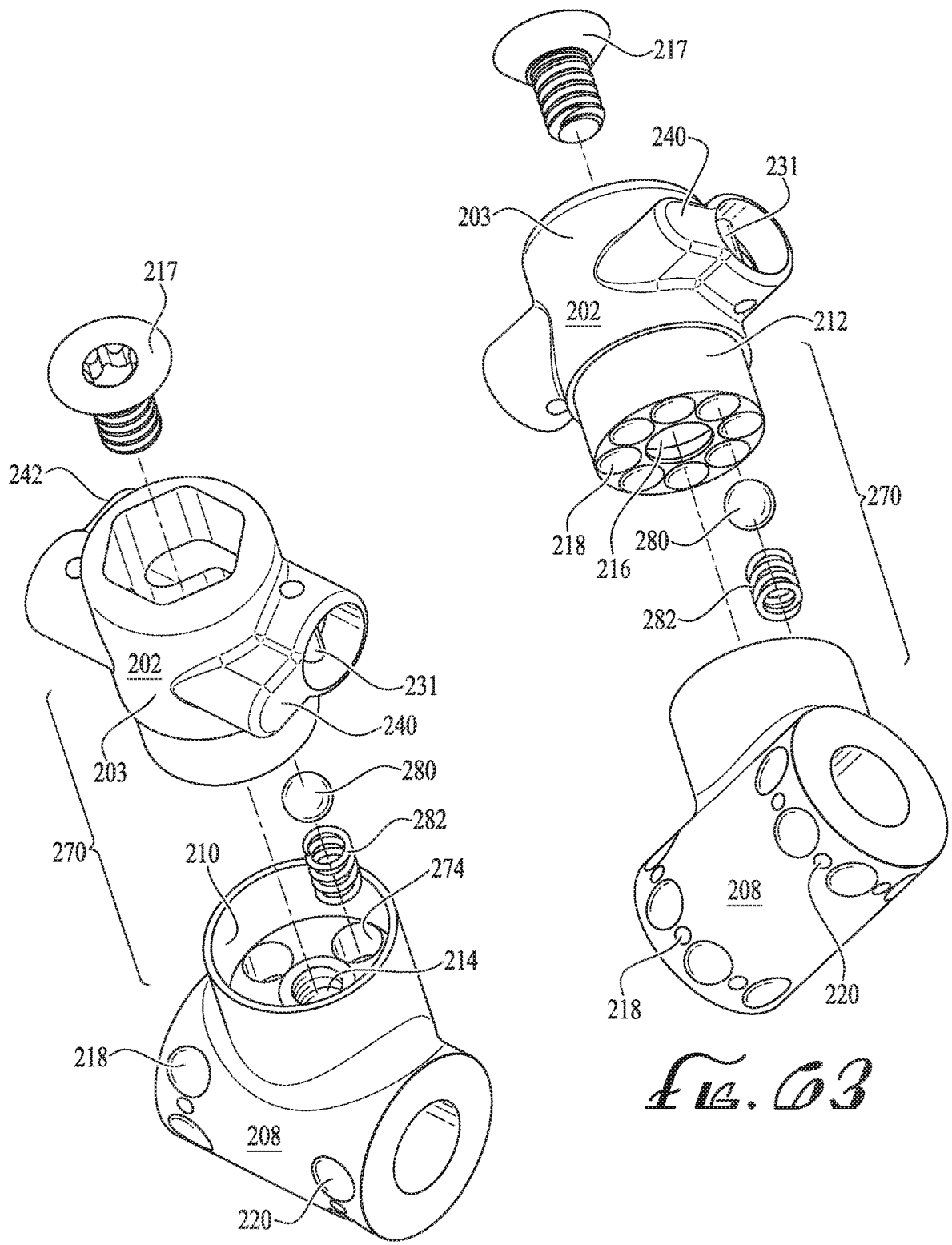

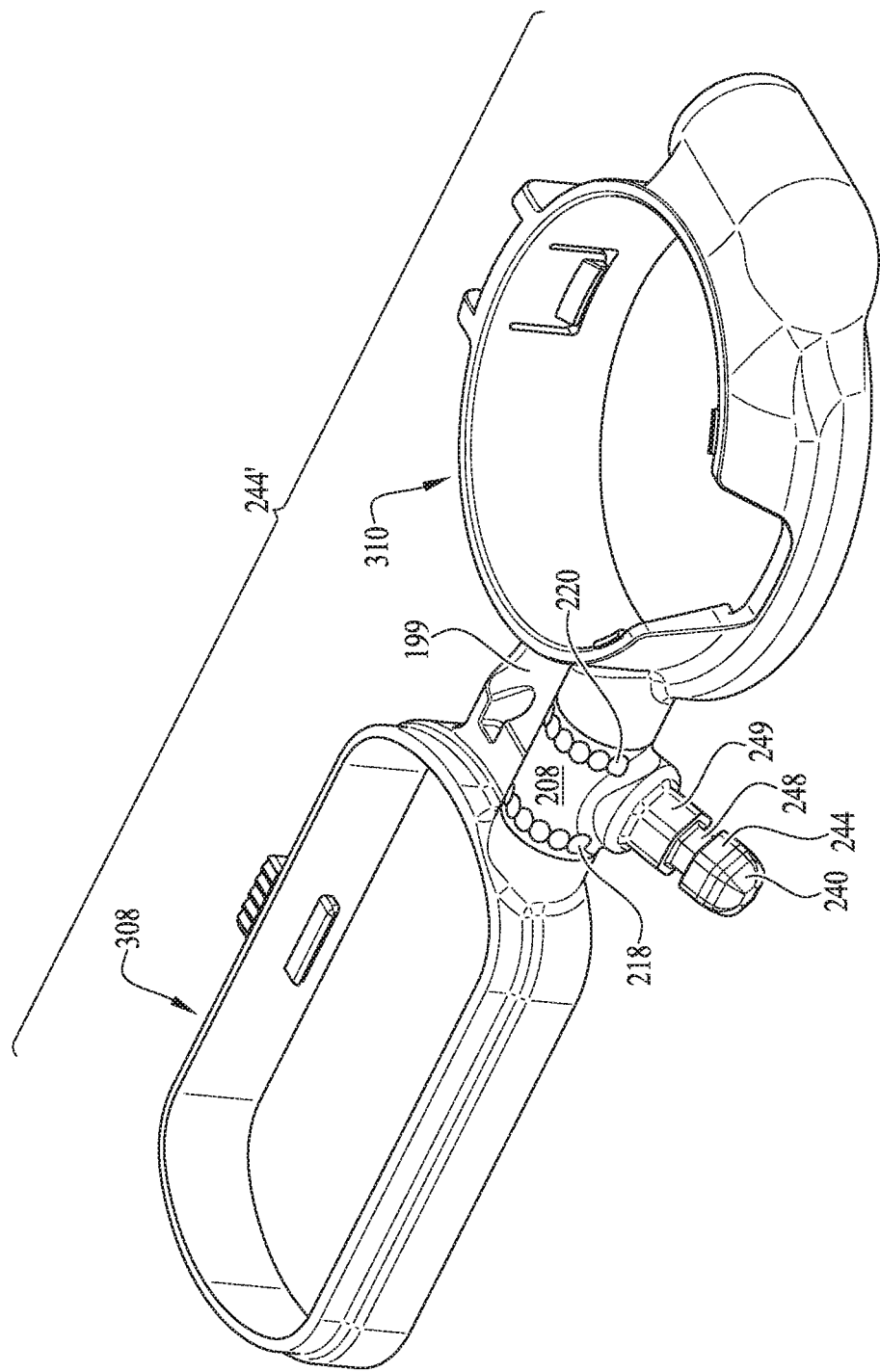

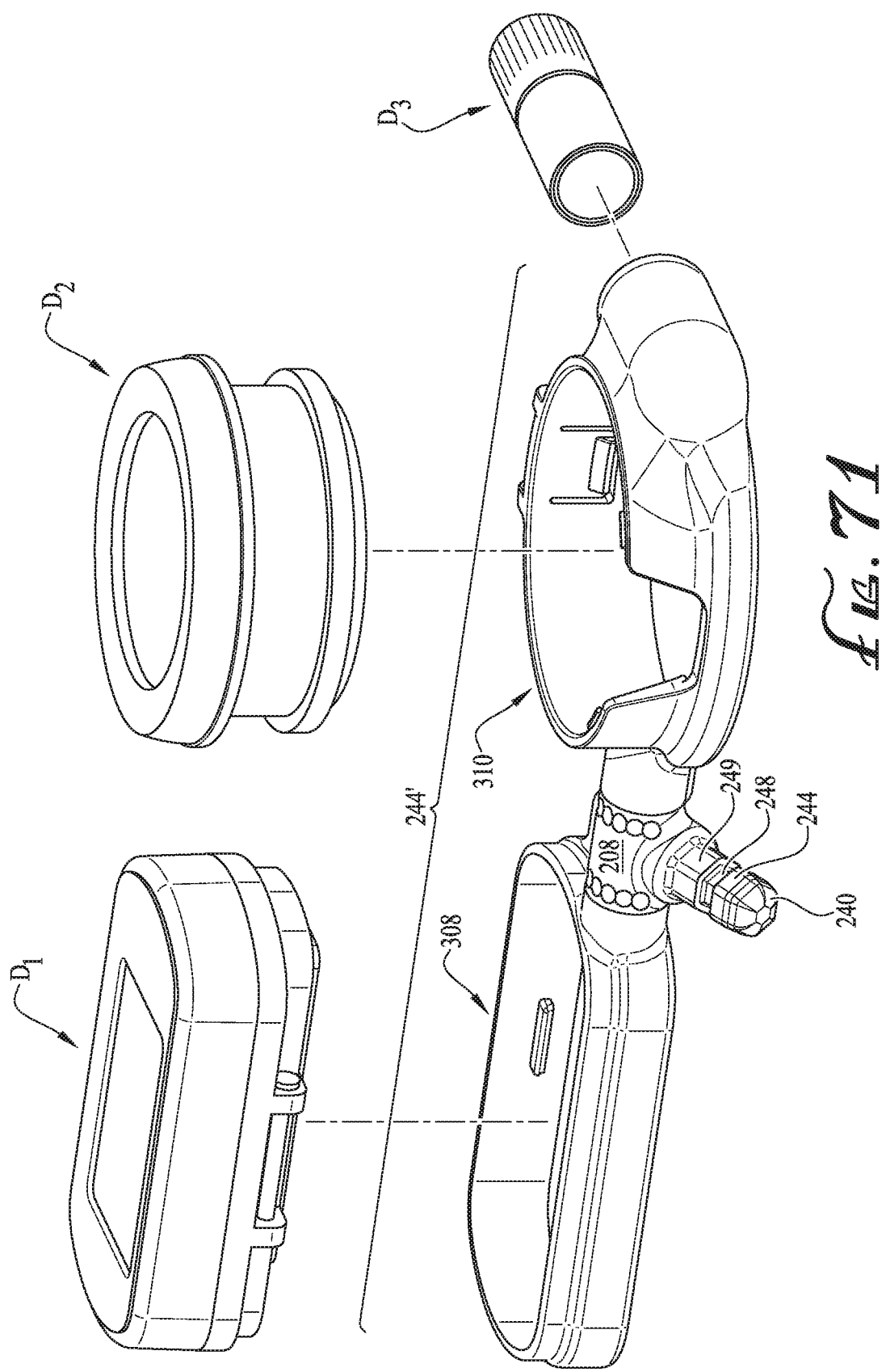

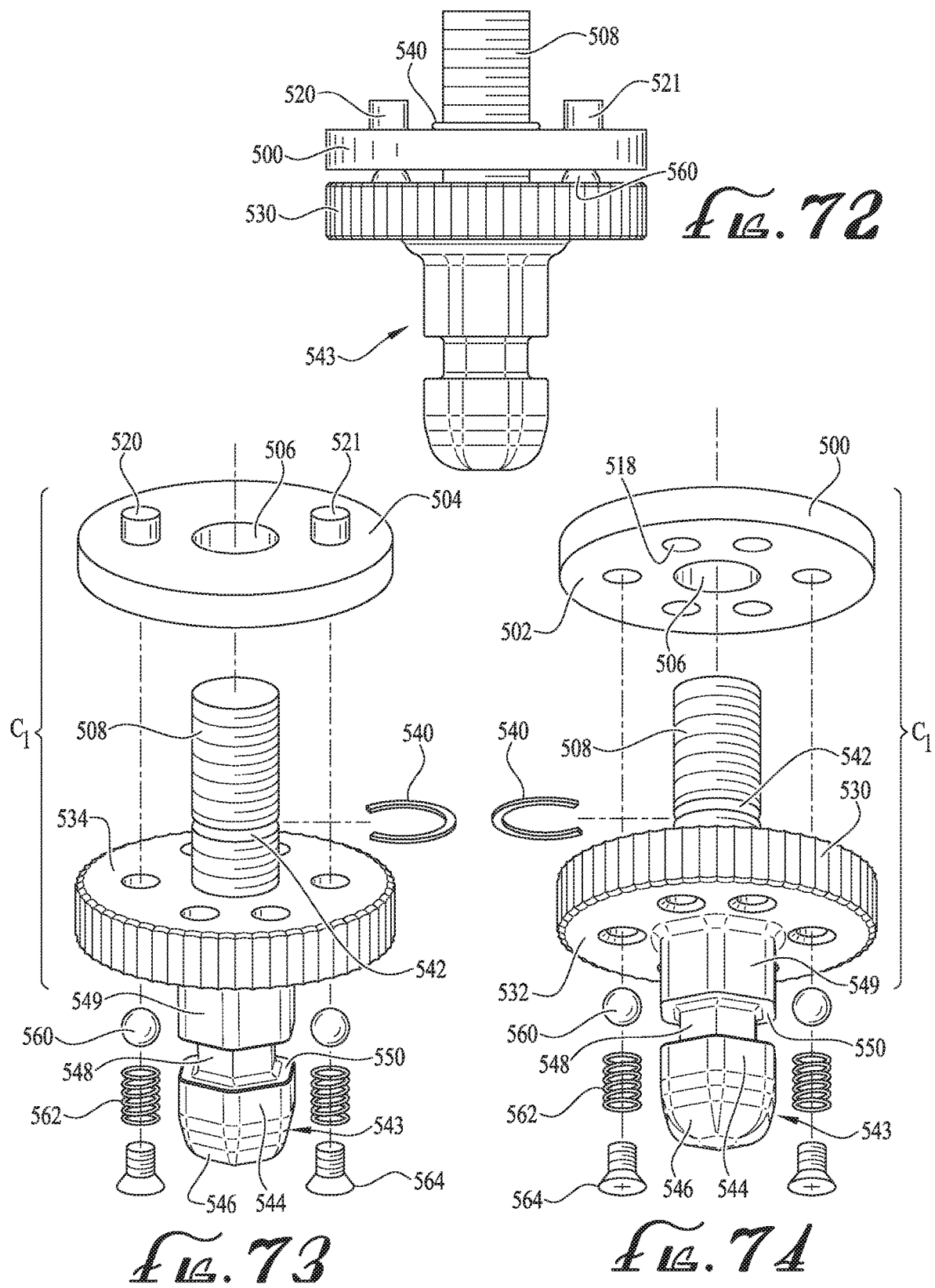

MOUNTING SYSTEM, DEVICES, METHODS AND USES THEREOF

This application claims the benefit of priority and the filing dates pursuant to 35 U.S.C. 119 to U.S. Provisional Patent Application Ser. No. 62/877,270, filed on Jul. 22, 2019, U.S. Provisional Patent Application Ser. No. 62/796,494, filed on Jan. 24, 2019, and U.S. Provisional Patent Application Ser. No. 62/795,539, filed on Jan. 22, 2019, each of which is hereby incorporated by reference in its entirety.

BACKGROUND

The subject of this patent application relates generally to devices for securely and releasably mounting and/or protecting devices, equipment or other apparatus (collectively referred to as "devices").

By way of background, in rugged applications and environments, there is a need for devices, equipment or other apparatus to be protected from impact and moisture. For example, both electrical and mechanical devices can become damaged and their operability impaired or lost upon exposure to moisture, such as, e.g., air moisture or humidity or being submerged in a liquid. Such moisture exposure can affect electronical and/or mechanical mechanisms to such a degree that the device becomes inoperable. Similar damage can occur from the resulting impact if a device is dropped or struck by another object.

In addition, in rugged applications and environments, a user of a device may desire to take a device into an environment where moisture exposure is highly likely or certain to occur and/or device impact is a risk. In such situations, the user wants to protect a device to prevent such damage before entering into this environment. For example, a user may wish to take a photographic device, such as, e.g., a camera or device such as a smart phone or tablet having a camera underwater in order to take pictures of the sea life or environment. Such devices need protection for the inevitable exposure to the fresh or salt-water exposure. Likewise, a user may wish to take a photographic device while hiking or climbing in rugged terrain where there is a real risk of dropping the device or having the device striking the terrain. Again, such devices need protection for the impact when the device is so struck.

Further, in rugged applications and environments, there is a need for a device to be securely mounted (through a mount) on a base. Such device mounting could be done to facilitate operation of the device and/or store the device when not in use. Such mounting could also enable free use of the hands of a user to do other things or complete other tasks. For example, a user may desire to mount a smart phone, tablet, night vision goggle (NVG), ground-positioning system (GPS) or similar device to the dashboard of a vehicle in order to operate a navigational system while operating the vehicle or take a video during vehicle operation. Similarly, a device can be mounted on clothing of a user, for example, vest or harness, in order to attach a device to the person of the user. For example, a use may wish to mount a device on a helmet or vest worn by the user in order to navigate terrain while hiking or riding a bike or videotape the experience.

Moreover, in rugged applications and environments, there is a need for these devices to be quickly removed from the mount and reattached to another mount (or simply stowed), while preventing unintended removal or fumbling. Such quick removal can reduce user frustration, enhances operability of the devices and imparts greater flexibility of use. For example, a user could mount a photographic device on the dashboard of a vehicle in order to navigate to a rock-climbing location, and once there, quickly remove the device from the dashboard and the quickly attach the device to a helmet or vest worn by the user.

However, current devices, systems and methods are unable to achieve or attain all of the attributes discussed above. For example, while certain devices may offer protection to impact or moisture exposure, these devices are either ineffective or so cumbersome that they interfere with the operability of the device. Similarly, while current mounting systems provide a means to secure a device to a base, these systems typically ignore or are ineffective in protecting a device from impact or moisture exposure. These mounting systems also suffer in that they tend to be incompatible with other mounting systems, forcing a user to purchase additional adaptors to enable compatibility or simply choice one mounting system over another. Likewise, although certain mounting systems may offer a means to secure a device quickly to a base or remove the device quickly from the base, attachment security is sacrificed to achieve such each of use. As such, a device can become dislodged from a base and incur damage from the resulting impact or moisture exposure.

Aspects of the present invention fulfill these needs and provide further related advantages as described in the following summary.

SUMMARY

The present systems, devices, and methods provide a mounting system which includes rail and a bracket which is selectively secured to the rail. The bracket is selectively and/or automatically locked to the rail when positioned on the rail, and may be removed from the rail by activating one or more actuators and, optionally, one or more safety actuators. The disclosed systems, devices, and methods enable a device to be protected from impact and moisture exposure, enable a device to be securely mounted on a base, and enable a device to be quickly secured and removed from a base.

Other features and advantages of aspects of the present invention will become apparent from the following more detailed description, taken in conjunction with the accompanying drawings, which illustrate, by way of example, the principles of aspects of the invention.

BRIEF DESCRIPTION OF THE DRAWINGS

FIG. 1A-C is a mounting system disclosed herein, with FIG. 1A showing a top perspective of a mounting system disclosed herein, illustrating a bracket aligned and ready for attachment to a rail, where the rail is configured as a base; FIG. 1B showing a top perspective of the mounting system of FIG. 1A, illustrating a bracket attached to a rail; and FIG. 1C showing an exploded top perspective view of the rail of FIG. 1A;

FIG. 2 is a front top perspective view of a rail disclosed herein;

FIG. 3 is a front top perspective view of a rail disclosed herein;

FIG. 4 is a front top perspective view of a rail disclosed herein;

FIG. 5 is a front top perspective view of a rail disclosed herein;

FIG. 6 is a front top perspective view of a rail disclosed herein;

FIG. 8B showing a top perspective of the mounting system of FIG. 8A, illustrating a bracket attached to a rail;

FIG. 12 is a top plan view of the mounting system of FIG. 8B;

FIG. 13 is a bottom plan view of the rail of FIG. 8A;

FIG. 14 is a first side plan view of the rail of FIG. 8A;

FIG. 15 is a second side plan view of the rail of FIG. 8A;

FIG. 16 is a first end plan view of the rail of FIG. 8A;

FIG. 17 is a second end plan view of the rail of FIG. 8A;

FIG. 24 is a magnified partial cross-sectional view of the mounting system of FIG. 12, taken at 24-24;

FIG. 25 is a cross-sectional view of the mounting system of FIG. 12, taken at 25-25;

FIG. 26 is a magnified partial cross-sectional view of the rail of FIG. 14, taken at 26-26;

FIG. 27 is a magnified partial cross-sectional view of the rail of FIG. 15, taken at 27-27;

FIG. 28 is a front top perspective view of a bracket disclosed herein in the closed configuration;

FIG. 29 is a back top perspective view of the bracket of FIG. 28 in the closed configuration;

FIG. 30 is a top plan view of the bracket of FIG. 28 in the closed configuration;

FIG. 31 is a bottom plan view of the bracket of FIG. 28 in the closed configuration;

FIG. 32 is a front plan view of the bracket of FIG. 28 in the closed configuration;

FIG. 33 is a back plan view of the bracket of FIG. 28 in the closed configuration;

FIG. 34 is a first end plan view of the bracket of FIG. 28 in the closed configuration;

FIG. 35 is a second end plan view of the bracket of FIG. 28 in the closed configuration;

FIG. 36 is a front top perspective view of the bracket of FIG. 28 in the open configuration;

FIG. 37 is a back top perspective view of the bracket of FIG. 28 in the open configuration;

FIG. 38 is a top plan view of the bracket of FIG. 28 in the open configuration;

FIG. 39 is a bottom plan view of the bracket of FIG. 28 in the open configuration;

FIG. 44 is an exploded front top perspective view of a bracket disclosed herein;

FIG. 45 is an exploded back top perspective view of the bracket of FIG. 44;

FIG. 55 is a front top perspective view of a bracket having a hinged coupler disclosed herein;

FIG. 56 is a back top perspective view of the hinged coupler of FIG. 55;

FIG. 59 is a first side plan view of the socket of the hinged coupler of FIG. 55, showing hinged coupler in a first angular position;

FIG. 60 is a first side plan view of the socket of the hinged coupler of FIG. 55, showing hinged coupler in a second angular position;

FIG. 61 is a first side plan view of the socket of the hinged coupler of FIG. 55, showing hinged coupler in a third angular position;

FIG. 62 is an exploded front top perspective view of a latching socket and inner knuckle of the hinged coupler of FIG. 55;

FIG. 63 is an exploded front bottom perspective view of a latching socket and inner knuckle of the hinged coupler of FIG. 55;

FIG. 70 is a back top perspective view of a coupler disclosed herein;

FIG. 71 is a back top perspective view of the coupler of FIG. 70; showing placement of components;

FIG. 72 is a side plan view of a device case adaptor disclosed herein;

FIG. 73 is an exploded bottom perspective view of the device case adaptor of FIG. 72, illustrating attachment of the device case adaptor to a device case disclosed herein; and FIG. 74 is an exploded top perspective view of the device case adaptor of FIG. 72, illustrating attachment of the device case adaptor to a device case disclosed herein.

Figure 7:
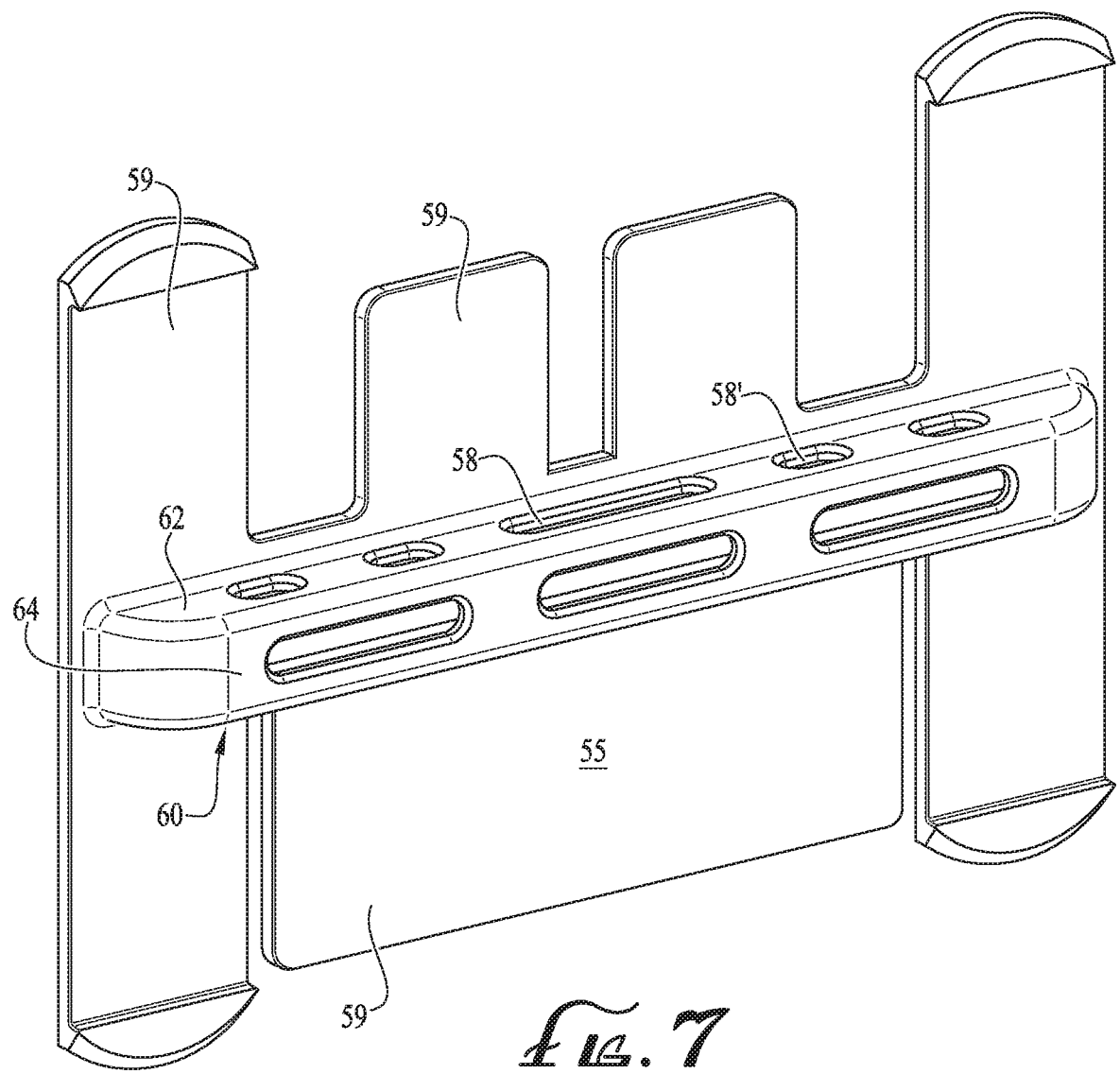
FIG. 7 is a front top perspective view of a rail disclosed herein.

The above described drawing figures illustrate aspects of the invention in at least one of its exemplary embodiments, which are further defined in detail in the following description. Features, elements, and aspects of the invention that are referenced by the same numerals in different figures represent the same, equivalent, or similar features, elements, or aspects, in accordance with one or more embodiments.

DETAILED DESCRIPTION

A mounting system disclosed herein comprises a rail and a bracket. A mounting system disclosed herein can be mounted on or be used as a mounting base for a wide variety of devices. A mounting system disclosed herein enables a device to be protected from impact and moisture exposure, enables a device to be securely mounted on a base, and enables a device to be quickly secured and removed from a base.

A device is an electrical or mechanical instrument, equipment or other apparatus. Exemplary devices include, without limitation, a computational device like a smart phone, a tablet or a computer, a navigational device such as a compass, a ground positioning system (GPS), an altimeter, a pedometer, a medical device, a health monitoring device such as heart rate monitor, blood pulse monitor, or breathing rate monitor, a lighting device such as a flashlight, a night vision goggle (NVG), or infrared laser, an audiovisual device such as a still camera, a video camera, or an audio recorder, a communications device such as a radio or any other device capable of transmitting and/or receiving an analog or digital signal.

A rail disclosed herein serves as an attachment point for a bracket disclosed herein. In aspects of this embodiment, a rail disclosed herein can be secured to a device. In other aspects of this embodiment, a rail disclosed herein can be secured to a surface and serve as a base. A rail is configured to the surface it is to be attached to.

In aspects of this embodiment, a rail is configured to the dimensions of a device, such as, e.g., fully or partially around the outside perimeter of a device. For example, in aspects where a device is a smart phone or tablet, a rail conforms to the perimeter of the smart phone or tablet, and is thus typically rectangular in shape. In other aspects of this embodiment, a rail is configured to the dimensions of a surface to which a device is to be mounted. For example, in aspects where a rail disclosed herein will serve as a base and be mounted on a dashboard, the rail can be a linear structure, for example, a line-structure, and L-shaped structure, or a polygonal structure like a triangular structure, a quadrilateral structure, a pentagonal structure, etc. In further aspects, where a rail disclosed herein will serve as a base and be mounted on a dashboard, rail can be a curvilinear structure, including an open curvilinear structure like a wave or S-shaped curvilinear structure or a closed curvilinear structure like a circle or oval.

A bracket is an apparatus that securely attaches to a rail. A bracket disclosed herein selectively and/or automatically secures or locks to a rail disclosed herein when positioned on the rail. In addition, a bracket disclosed herein may be removed from a rail, e.g., by activating one or more actuators and, optionally, one or more safety actuators. In aspects of this embodiment, a bracket disclosed herein securely and removably attaches to a rail secured to a device. In other aspects of this embodiment, a bracket disclosed herein securely and removably attaches to a rail configured to be a base. In yet other aspects of this embodiment, a bracket disclosed herein securely and removably attaches to a rail secured to a device as well as to a rail configured to be a base, thereby connecting the device to the base.

One exemplary embodiment of a mounting system disclosed herein is mounting system 50 as illustrated in FIG. 1. Mounting system 50 comprises a rail 52 and a bracket 54. In this configuration, rail 52 typically serves the singular purpose of receiving bracket 54, or can serve as a connection between bracket 54 and a support or can serve as a framework or case for containing or supporting another object. A support includes any solid support structure or a portion of a surface area from a solid support structure where a user desires to secure rail 54 in order to receive bracket 54 and employ mounting system 50 to mount a device or component thereof. In some embodiments, a support comprises an article of clothing or other item worn by a user including, without limitation, a helmet, personal protective equipment, a personal load bearing system, or any other item worn about the body. In some embodiments, a support comprises a hard surface or portion thereof, including, without limitation, a portion of an exterior or interior surface of a vehicle like a bicycle, automobile, truck, train, boat or aircraft, such portion of an exterior or interior surface including a dashboard, a handlebar, an exterior panel, or a windshield. In some embodiments, a support comprises an apparatus including, without limitation, a hand-held object, a tripod or other stand, a weapon or weapons system, an electronics housing, or any other apparatus.

Another exemplary embodiment of a mounting system disclosed herein is mounting system 50 as illustrated in FIG. 8. Mounting system 50 comprises a rail 52 and a bracket 54. In this configuration, rail 52 serves as a device case 56 as well as serving as an attachment framework for receiving bracket 54. In this embodiment, the shape of device case 56 conforms to the perimeter shape of the device that device case 56 is to contain or enclose. In some embodiments, and as shown in FIG. 8, rail 52 is a quadrilateral structure configured to the dimensions of a device D for protectively holding device D.

FIGS. 1-16 illustrate exemplary embodiments of rail 52. In some embodiments, and as shown in FIGS. 1-7, rail 52 comprises a rail body that is a linear line-structure, the length of which can vary depending on the desired application. For example, as shown in FIGS. 2, 5 & 6, rail body of rail 52 can be of a short length, comprising only a single engagement slot 58. In some embodiments, and as illustrated in FIGS. 1, 3, 4, & 7, rail body of rail 52 can be longer in length, comprising a plurality of engagement slots 58. In some embodiments, and as illustrated in FIGS. 1-3 & 5-7, rail 52 can further comprise a base support 55 which provides stability to rail body of rail 52 once secured to a support.

Rail 52 of mounting system 50 can be secured to a support by any known mechanism or process, such as, e.g., by being screwed, adhered, snap-fitted, insertion, welded, brazed, or other appropriate fastening means. In some embodiments, and as shown in FIGS. 1, 2, & 5, rail 52 comprises securing holes 102 which enable pass through of screws 100 so that rail 52 can be secured to a support using screws 100. In addition, and as shown in FIGS. 1A-1C, rail 52 can optionally include one or more securing tabs 104 which comprises a hole to receive screw 100. In some embodiments, for example rail 52 of FIG. 5, besides or in addition to the use of screws 100, base support 55 can have an adhesive layer on the side that will come in contact with a support to provide the sole or additional mechanism of securing rail 52 to a support. In some embodiments, and as shown in FIG. 6, base support 55 can be used as an insert into a base support mount by, e.g., a snap-fit mounting system, e.g., a shroud bracket system, and in this configuration can optionally include a thumb release lock 57 which releases a locking mechanism used to secure rail 52 to the base support mount as well as facilitates insertion and removal of rail 52. In some embodiments, and as shown in FIG. 7, base support 55 is formed into one or more tabs 59 configured for inserted into one or more pockets or pouches on a base support mount, e.g., one or more insert pockets or pouches of a Modular Lightweight Load-carrying Equipment (MOLLE) load bearing system, a Pouch Attachment Ladder System (PALS) load bearing system, Individual Integrated Fighting System (IIFS) load bearing system, or All-purpose Lightweight Individual Carrying Equipment (ALICE) load bearing system. In some embodiments, rail 52 as shown in FIGS. 1-7 can be secured to a base support mount by rivets or similar type fasteners. In some embodiments, rail 52 as shown in FIGS. 1-3 can be secured to or replace an existing rail system, such as, e.g., a Picatinny rail mount system, an Advanced Combat Helmet (ACH) Accessory Rail Connector (ARC) rail system, a Weaver rail mount system, a Monkey mount rail system, an ABS rail system, an E Track rail system, a VELCRO®-based mount system, and a RAM® Torque mount rail system.

In some embodiments, for example rail 52 of FIG. 4, rail 52 is secured to a hand grip or stand, like a tripod stand. In this configuration additional devices and then be secured to the free portions of rail 52. For example, a hand grip can be secured to a central portion of rail 52 of FIG. 4 and a video recorder and/or lights can be secured at either side of the hand grip.

Referring to FIGS. 1-8, rail 52 generally includes rail body comprising a first engagement surface 60 opposite a second engagement surface 62 with a third engagement surface 64 spanning between first engagement surface 60 and second engagement surface 62. In this example embodiment, first engagement surface 60 is generally parallel to second engagement surface 62, with third engagement surface 64 being substantially perpendicular to the two, In some embodiments, third engagement surface 64 is within 10 degrees of perpendicular of at least one of first engagement surface 60 and second engagement surface 62.

Referring to FIGS. 1-8, at least one of first engagement surface 60 and second engagement surface 62 includes one or more engagement slots 58. It is preferred that both first engagement surface 60 and second engagement surface 62 include one or more engagement slots 58. Although engagement slots 58 are shown as elongated slots with rounded ends, engagement slots 58 can be round, rectangular, square, or other appropriate though hole formed through or recess formed on first engagement surface 60 and/or second engagement surface 62. As discussed below, the shape of engagement slots 58 are configured to receive one or more engagement bosses 74, 75 of bracket 54.

In some embodiments, and as shown in FIGS. 1-7, first engagement surface 60, second engagement surface 62, and third engagement surface 64 are third engagement surface 64 are all part of a single component that forms rail 52, which generally does not require assembly. If rail 52 were to be made in a configuration not requiring assembly, then rail 52 can typically be made from a single type of material that is molded, machined, or manufactured by another appropriate process (although multiple types of material can be used, if appropriate for the application).

In some embodiments, and as best shown in FIG. 16, first engagement surface 60 and second engagement surface 62, and third engagement surface 64 are each part of separate components that are assembled to form rail 52. In these embodiments, third engagement surface 64 can be made integrally with one of first engagement surface 60 or second engagement surface 62. If rail 52 were to be made in a configuration requiring assembly, then each component part of rail 52 can be made from the same or different type material, such component parts being molded, machined, or manufactured by another appropriate process.

Referring again to FIGS. 1A, 1B, 8A, & 8B, bracket 54 of mounting system 50 selectively locks to rail 52 by engaging one or more engagement slots 58 (or engagement recesses) formed on rail 52. For example, as shown in FIGS. 1A, 1B, 8A, & 8B, bracket 54 is illustrated as selectively locked to slot 58'. Bracket 54 comprises a first jaw 70 and a second jaw 72, and a back plate 73 spanning between first jaw 70 and second jaw 72.

Although discussed in greater detail below (see, e.g., FIGS. 28, 32, 34-36, 40, 42, & 43), one or more engagement bosses 74 are located on a first clamping portion 122 of first jaw 70 of bracket 54 and one or more engagement bosses 75 are located on a second clamping portion 124 of second jaw 72 of bracket 54. One or more engagement bosses 74, 75 are arranged in direct opposition so that one or more engagement bosses 74 of first clamping portion 122 of first jaw 70 of bracket 54 engage one or more engagement slots 58 on first engagement surface 60 and one or more engagement bosses 75 of second clamping portion 124 of second jaw 72 of bracket 54 engage one or more engagement slots 58 on second engagement surface 62 (hidden from view, but similar or the same as first engagement surface 60). In some embodiments, engagement bosses 74 of first clamping portion 122 of first jaw 70 can be arranged in opposition, yet staggered (e.g., not in direct opposition or aligned) relative to engagement bosses 74 of second clamping portion 124 of first jaw 72. Preferably, engagement bosses 74 of first clamping portion 122 of first jaw 70 and engagement bosses 75 of second clamping portion 124 of second jaw 72 are sized and spaced apart so that they both selectively fit within a single engagement slot 58 in order to firmly hold bracket 54 to rail 52. Alternatively, or in addition to, engagement bosses 74 of first clamping portion 122 of first jaw 70 and engagement bosses 75 of second clamping portion 124 of second jaw 72 are sized and spaced apart so that they both selectively straddle between two adjacent engagement slots 58. For example, referring to FIGS. 1A, 1B, 8A & 8B, one engagement boss engaged within slot 58' and the other engagement boss engaged within slot 58" in order to firmly hold bracket 54 to rail 52. As further shown in FIGS. 9 & 10 bracket 54 is first shown attached to rail 52 by exclusively engaging first engagement slot 58. Then, as indicated by arrow 362, bracket 54 is moved to the left on rail 52 by opening bracket 54, and reconnected to rail 54 by engaging both first engagement slot 58 and second engagement slot 58'.

Figure 8A:
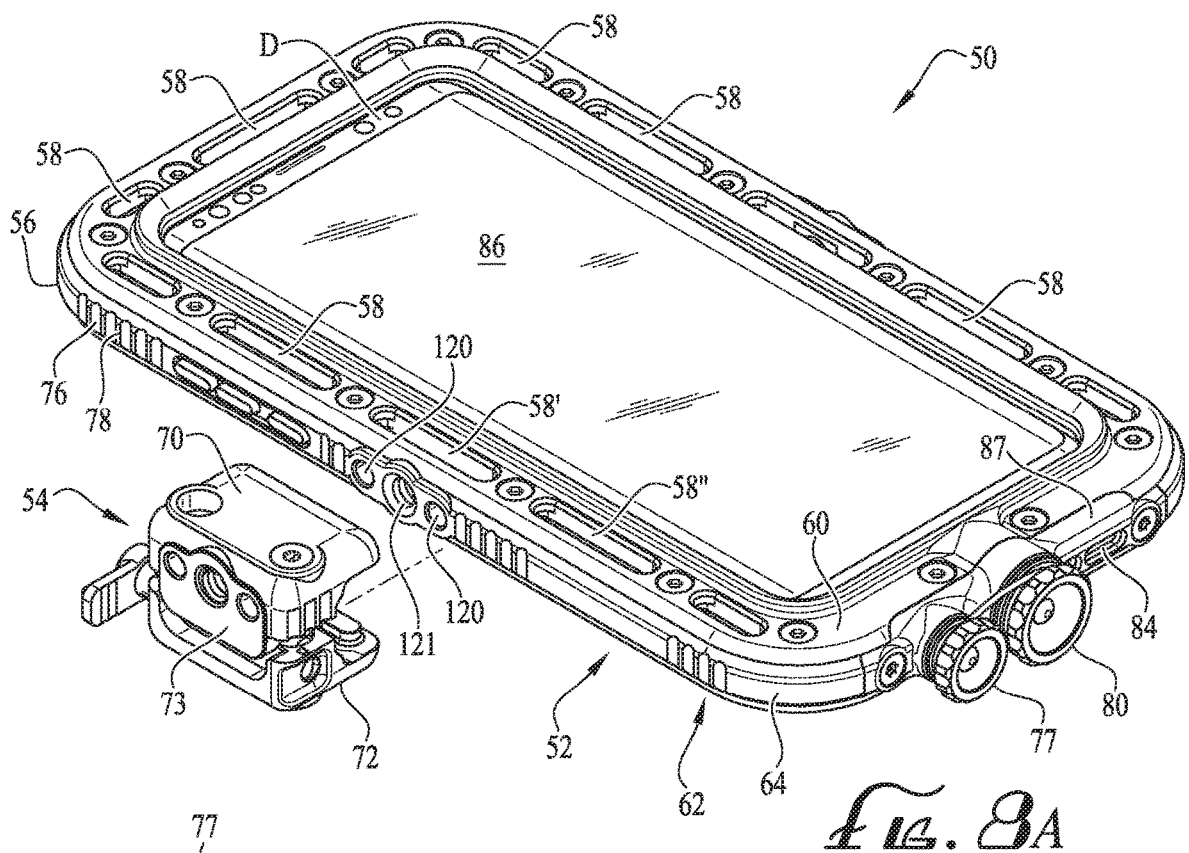
FIGS. 8A-B is a mounting system disclosed herein, with FIG. 8A showing a top perspective of a mounting system disclosed herein, illustrating a bracket aligned and ready for attachment to a rail, where the rail is configured as a case contains a device.
Figure 8B:
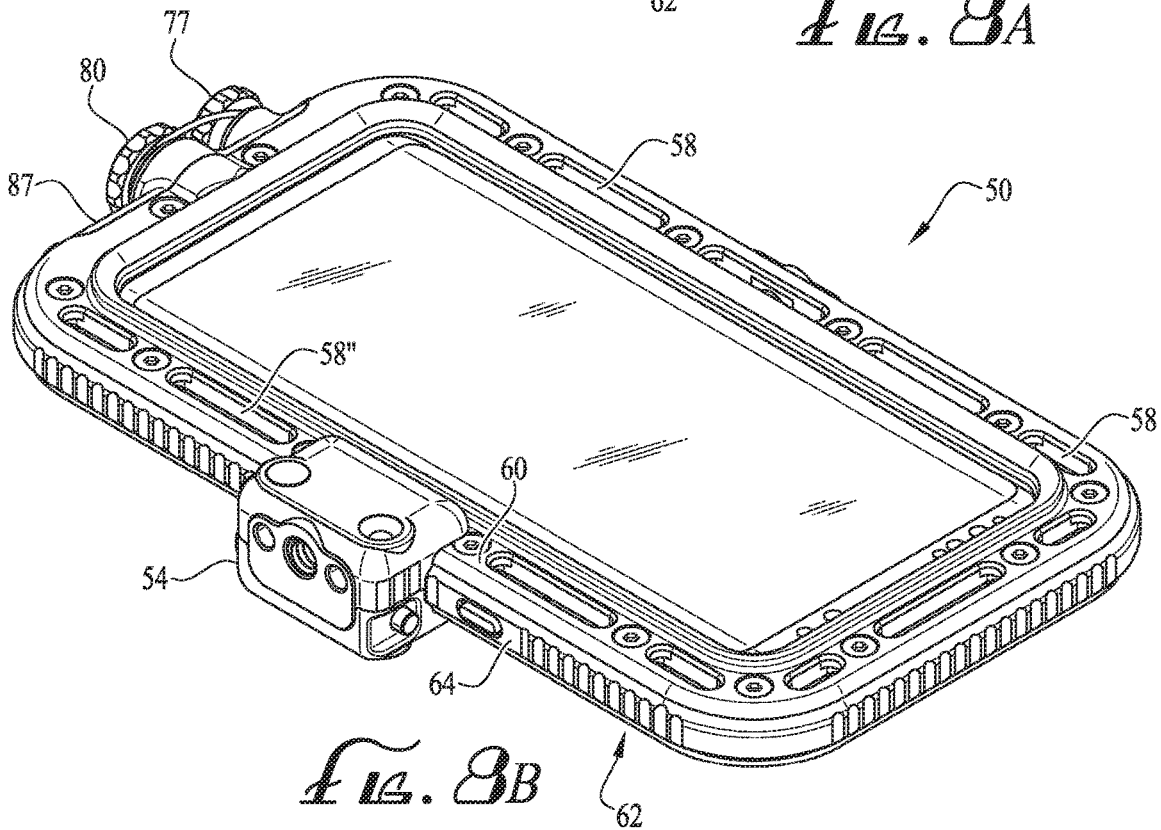

In some embodiments, and referring to FIG. 8A, third engagement surface 64 of rail 54 optionally includes series of alternating locking slots 76 and locking teeth 78 (where two adjacent slots 76 form a tooth 78 therebetween), for providing a textured surface to facilitate gripping, holding or otherwise handling device case 56.

Figure 18:
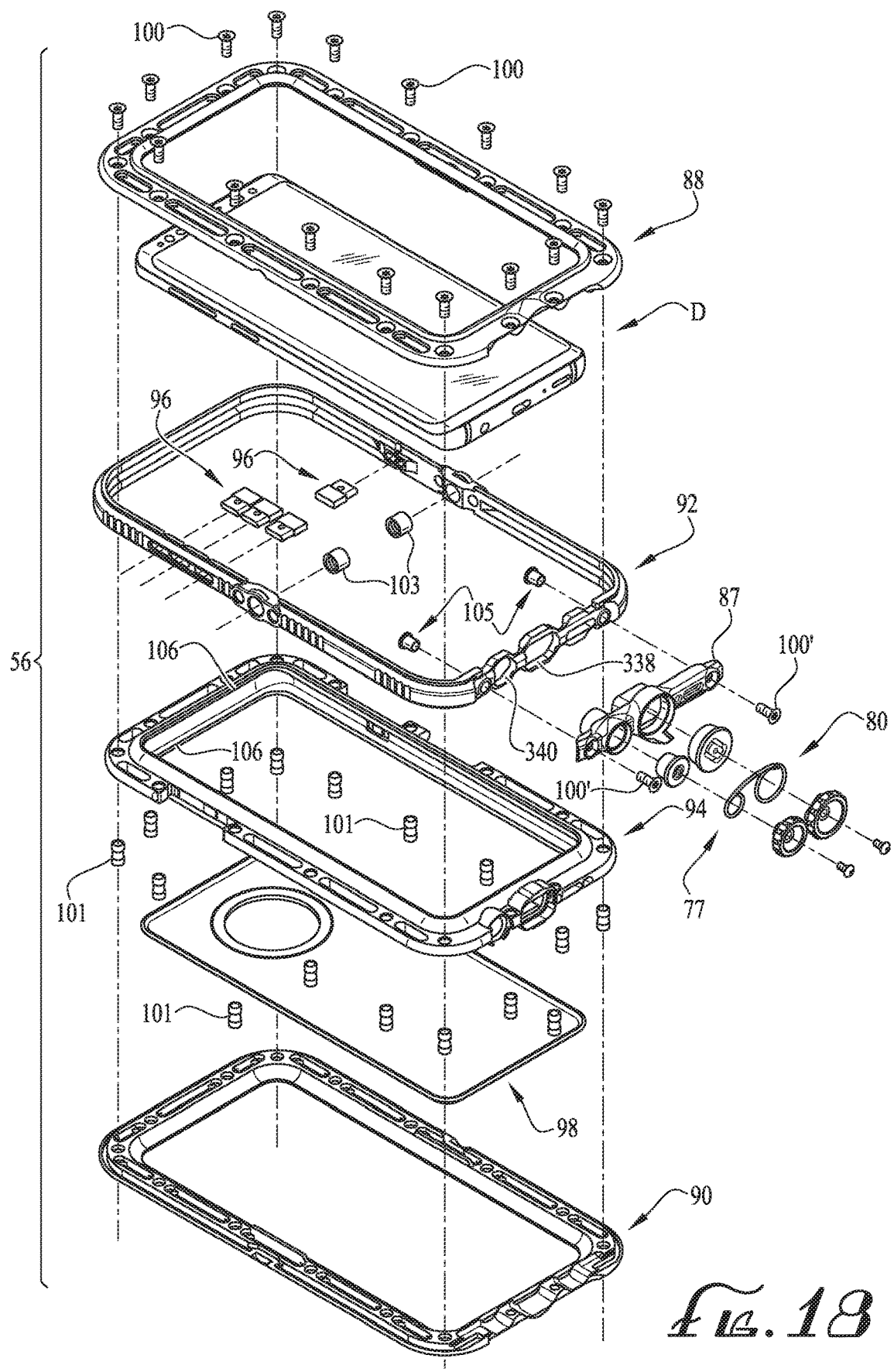
FIG. 18 is an exploded top perspective view of the rail of FIG. 8A.

Rail 52 of mounting system 50 as shown in FIGS. 8 & 11-18 can further function as device case 56 for device D. An exploded view of an exemplary example of rail 52 functioning as device case 56 for device D inserted therein (a smartphone in this example) is shown in FIG. 18. The primary structural components of rail 52 forming device case 56 comprise a first frame member 88, a sidewall frame member 92, and a second frame member 90. Sidewall frame member 92 is sandwiched between first frame member 88 and second frame member 90. As shown in FIG. 18, in embodiments where rail 52 is configured as a device case 56 for device D, first frame member 88 comprises first engagement surface 60, second frame member 90 comprises second engagement surface 62, and sidewall frame member 92 comprises third engagement surface 64.

During assembly, and as best seen in FIG. 18, first frame member 88 and second frame member 90 compressively bearing down on sidewall frame member 92 by tightening a plurality of screws 100 which insert through and firmly attach first frame member 88 to second frame member 90. Although screws 100 are only shown as being inserted from the top, i.e., from first a frame member 88 direction to a second frame member 90, direction, screws in a similar pattern can be threaded in from underneath, i.e., from second a frame member 90 direction to a first frame member 88, direction. First frame member 88, second frame member 90, and a sidewall frame member 92 can be made from a tough material, preferably a polymer or aluminum material. Because aluminum threads may easily strip, the screws may be threaded into an insert 101, 103, 105 made of stainless steel or high-strength material, such as a female-female threaded standoff, nut, binding barrel, or the like.

As shown in FIGS. 8A, 11, 14, 15, & 18, sidewall frame member 92 of device case 56 can comprise one or more adaptor attachment points 123, for securing another device or component thereof to rail 52 using compatible mounting systems. Sidewall frame member 92 also comprises indexing holes 120, 121 to facilitate properly orientation of another device or component thereof being secured to device case 56 as well as to prevent misalignment of an attached another device or component thereof while secured to device case 56. For example, device D encased in device case 56 can be secured to a tripod using adaptor attachment point 123. In some embodiments, adaptor attachment point 123 can be any standard screw thread known in the art, including, without limitation, ¼-20 UNC thread, a ⅜-16 UNC thread, or any similar screw thread standards known in the art.

In some embodiments, and as shown in FIGS. 72-74, a device case adaptor C1 comprises an indexing plate 500, an adaptor plate 530, and a retaining clip 540, such as, e.g., a C clip. Indexing plate 500 is typically disc-shaped and comprises a top surface 502 and a bottom surface 504, and a through hole 506 which is centrally located in indexing plate 500. Top surface 502 of indexing plate 500 comprises a circular ring of detents 518 positioned around through hole 506. Each detent of the ring of detents 518 is slopped or ramped on the left-hand side to provide stop mechanism in a clock-wise direction. In some embodiments, ring of detents 518 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, and as shown in FIG. 73, detents 518 are the same or similar size. In some embodiments, ring of detents 518 can be of two or more different sizes. Bottom surface 504 of indexing plate 500 includes a first indexing pin 520 and a second indexing pin 521 extend perpendicularly from bottom surface 504. First and second indexing pins 520, 521 are configured to align and insert into indexing holes 120, 121 of device case 56 in a manner that properly orientates device case adaptor C1 to device case 56 in and prevents misalignment while secured.

As shown in FIGS. 72-74, adaptor plate 530, is typically disc-shaped and comprises a top surface 532 and a bottom surface 534. Top surface 532 of adaptor plate 530 comprises a coupler 543 that is centrally located and extends perpendicularly from top surface 532. Coupler 543 comprises a body 549, a circumferential groove 548, and a head 544, which includes a leading edge 546 and a shoulder 550. Coupler 543 can be of any length with most of this length variation due to the length of body 549. Circumferential groove 548 is located in between body 549 and head 544. As illustrated in FIGS. 72-74, head 244 is configured to conform or substantially conform to the perimeter or circumferential shape of socket 222. Top surface 534 of adaptor plate 530 comprises a threaded screw 508 which includes a grove 542 that is centrally located and extends perpendicularly from bottom surface 506. Retaining clip 540 is secured in groove 542.

In some embodiments, adaptor plate 530 can further comprise one or more detent plunders to controllably rotate and temporarily fix the rotation of adaptor plate 530 relative to sidewall frame member 92 of device case 56. As shown in FIGS. 72-74, which illustrates only two of the six detent plungers in this example embodiment, detent plunger 550 includes a detent cylinder 552 comprising an open end 554 and open threaded end 556 opposite open end 554, and a detent ball 560 a detent compression spring 562. Detent ball 560 and detent compression spring 562 are captured within detent cylinder 552 by a set screw secured to open threaded end 556, and detent compression spring 562 outwardly biasing detent ball 560 toward open end 554 of detent cylinder 552 in a manner that causes detent ball 560 to protrude from open end 554 of detent cylinder 552 One or more detent plungers 550 are located on a side that will be in contact with of the underside portion of indexing plate 500. One or more detents 518 of indexing plate 500 are aligned in a manner that detent ball 560 protruding from an open end 554 will be seated in each of the one or more detents 518 of indexing plate 500 when assembled. This detent mechanism ensures that adaptor C1 will remain secured in place and that threaded screw 508 of adaptor plate 530 will not become loosened over time.

Figure 19:
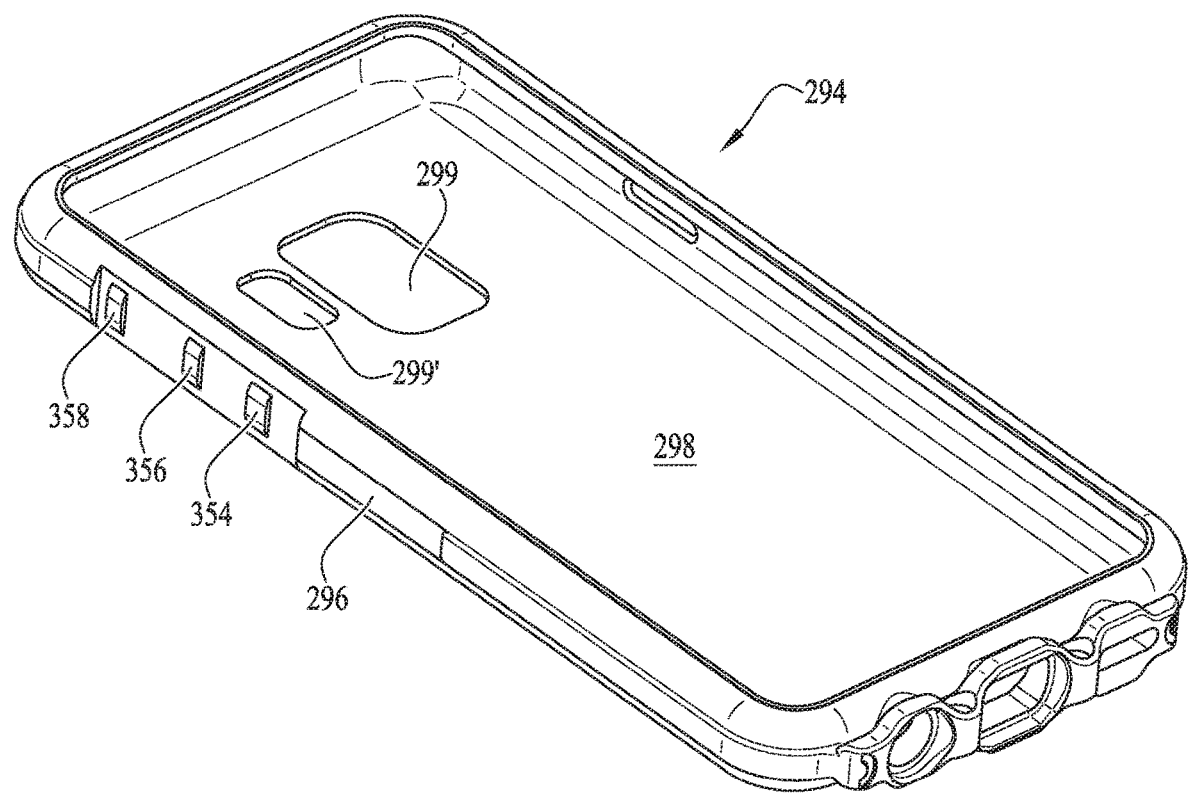
FIG. 19 is an top perspective view a gasket member disclosed herein.
Figure 20:
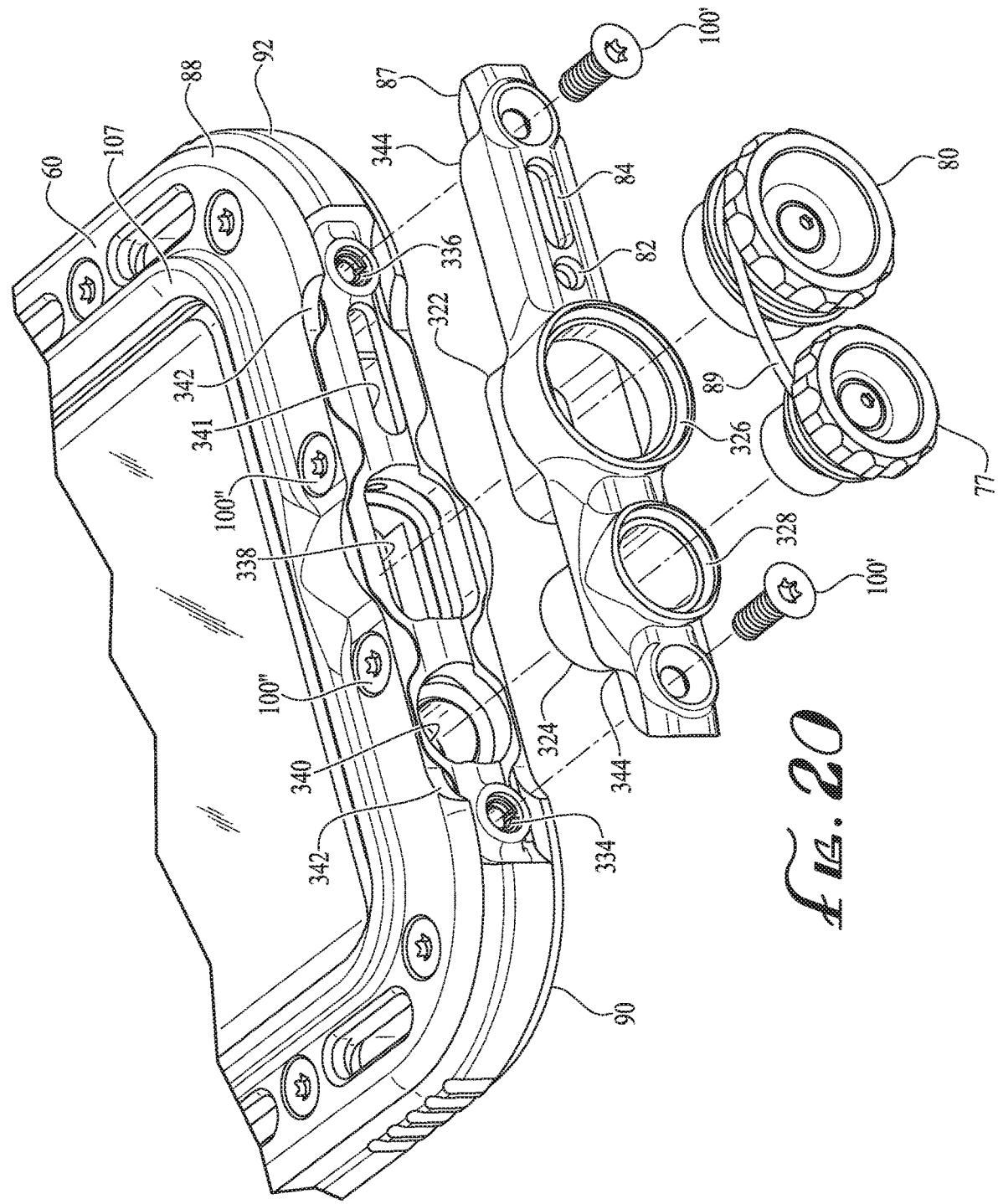
FIG. 20 is a magnified partially exploded top perspective view of the second end of the rail of FIG. 8A.

As shown in FIGS. 8A, 11-13, 17 & 18, third engagement surface 64 can additionally include various ports 82, 84, 326, 328 for access to speakers, microphones, audio jacks, volume, switches, power supply, etc. Ports 82, 84, 326, 328, can be uncovered or be associated with threaded sealing caps. In addition ports 82, 84, 326, 328 can be directly incorporated into third engagement surface 64 of sidewall frame member 92 or be incorporated in a sealing plate 87 which attached to third engagement surface 64. For example, in some embodiment, and referring to FIGS. 18 & 20, sidewall frame member 92 is configured to receive sealing plate 87 comprising ports 82, 84, 326, 328, fastened to an edge of sidewall frame member 92. As shown in FIGS. 18 & 20, threaded inserts 105 are inserted through holes in sidewall frame member 92 for threadably receiving screws 100' therein for fastening the sealing plate 87 thereto. As shown in FIGS. 18 & 20, sealing plate 87 includes one or more through ports 82, 84, 326, 328, align to one or more speakers, microphones, audio jacks, volume control, switches, power supply of device D. As shown in FIGS. 18 & 19, one or more through ports, as exemplified by through ports 326, 328 can be configured to threadably receives one or more sealing caps 77 and 80, which cover the one or more through ports. As shown in FIGS. 18 & 19, one or more through ports, as exemplified by through ports 82, 84 may not be associated with sealing caps 77 and 80, relying on gasket member 94 to provide a water-tight seal like a water-resistant seal or waterproof seal. Sealing caps 77 and 80 can be flexibly connected by a lanyard 89 that permits one cap to be removed and held by lanyard 89 to the other cap still threaded within sealing plate 87. Further, lanyard 89 permits sealing caps 77 and 80 to freely rotate for threading sealing caps 77 and 80 into and out of their respective threaded holes. Sealing plate 87 acts provides a seal between sealing caps 77 and 80 and gasket member 94, which will be described in more detail below in reference to FIGS. 20-23.

In some embodiments, where rail 52 is configured as device case 56 for device D, such device case 56 is preferably water resistant or waterproof. For example, in some embodiments, and referring to FIGS. 18 & 21-27, assemble device case 56 includes a gasket member, for example gasket member 94, fitted around an outer perimeter of device D. Gasket member 94 functions to form a barrier between device D and the outside environment, thereby providing water resistant or waterproof capabilities. In some embodiments, and referring to FIG. 19, gasket member 294 comprises a single component including a side portion 296 that fits around an outer perimeter of device D and a bottom portion 298 that covers the back of a device, which functions similar to bottom cover 98, discussed below. Gasket member 294 includes one or more open portions 299, for example 299, 299' of FIG. 17, configured to receive a transparent insert, such as a glass insert, to permit the sight and use of touch screens, cameras, flashes, flashlights, or other light emitting or detecting devices. All or part of gasket member 94, 194 is made of an elastomeric material or other deformable or sealable material that deforms under the pressure of assembled rail 52 to fill gaps and create a water resistant or water-proof interior space for containing device D, such as Buna-N rubber material, fluoroelastomer material (e.g., VITON), silicon, or other appropriate material or combination of materials.

Furthermore, in some embodiments, and referring to FIGS. 11-13 & 18, device case 56 further optionally comprises a top cover 86 placed atop device D, and/or further optionally comprises a bottom cover 98 placed beneath device D. Both top cover 86 and bottom cover 98 function to form a barrier between device D and the outside environment, thereby providing water resistant or waterproof capabilities. In addition, both top cover 86 and bottom cover 98 can optionally include a transparent portion, such as a window 99, to permit the sight and use of touch screens, cameras, flashes, flashlights, or other light requiring, emitting or detecting devices.

A water-tight seal like a water-resistant seal or waterproof seal is further illustrated in detail in FIGS. 21-27. As shown in FIG. 24, first frame member 88 and second frame member 90 capture sidewall frame member 92 between the two. One or more ridges 108 or other protrusions or shoulders are formed on or near the inner perimeter of sidewall frame member 92, and is configured to be received within slot 109 (or other concavity or step) of first frame member 88, which rests upon ridges 108 and is configured to receive second frame member 90, which similarly rests upon a second ridge 108' (or on the opposite side on ridge 108). As first frame member 88 is drawn toward second frame member 90 by tightening the screws 100 (with a second screw, not shown, threaded into a binding barrel 101 through a countersunk hole 103), gasket member 94 is compressed until first and second frame members 88, 90 bear against their respective ridges 108, 108' of sidewall frame member 92, or until gasket member 94 can no longer be compressed, e.g., even if there is a slight gap between first and second frame members 88, 90 and their respective ridges 108, 108'. In this example, binding barrel 101 acts as a standoff between first and second frame members 88, 90 that is sized so that it limits the compression of gasket member 94.

As shown in FIGS. 24 & 25, each of first and second frame members 88, 90 includes an overhang 104 extending inwardly about an inner perimeter and configured directly or indirectly (e.g., through gasket member 94) to bear against device D and/or if present top cover 86 and bottom cover 98, respectively. In embodiments where top cover 86 and bottom cover 98 are not present in device case 56, as shown in FIGS. 24 & 25, gasket member 94 can be configured so that overhangs 104 of first and second frame members 88, 90 can bear down on gasket member 94, which in turn bears down against device D, enhancing the seal and protecting against device D against the external environment like moisture. Further, a ridge 107 formed adjacent to inner perimeter extending orthogonally from against device D, such that against device D is protected from impact due to ridge 107 protruding above against device D.

In embodiments where top cover 86 and bottom cover 98 are present in device case 56, FIGS. 24 & 25, top and bottom perimeters of gasket member 94 can optionally comprise a groove or step 106 to receive top and bottom covers 86, 98. In addition, gasket member 94 can be configured to fold over perimetral edges of top and bottom covers 86, 98 at groove or step 106, so that overhangs 104 of first and second frame members 88, 90 can bear down on gasket member 94, which in turn bears down against top and bottom covers 86, 98, enhancing the water-tight seal like a water-resistant seal or waterproof seal in device case 56. Further, a ridge 107 formed adjacent to inner perimeter extending orthogonally from the plane of top cover 86 and bottom cover 98, such that top cover 86 and bottom cover 98 are protected from impact due to ridge 107 protruding above top cover 86 and bottom cover 98.

Figure 21:
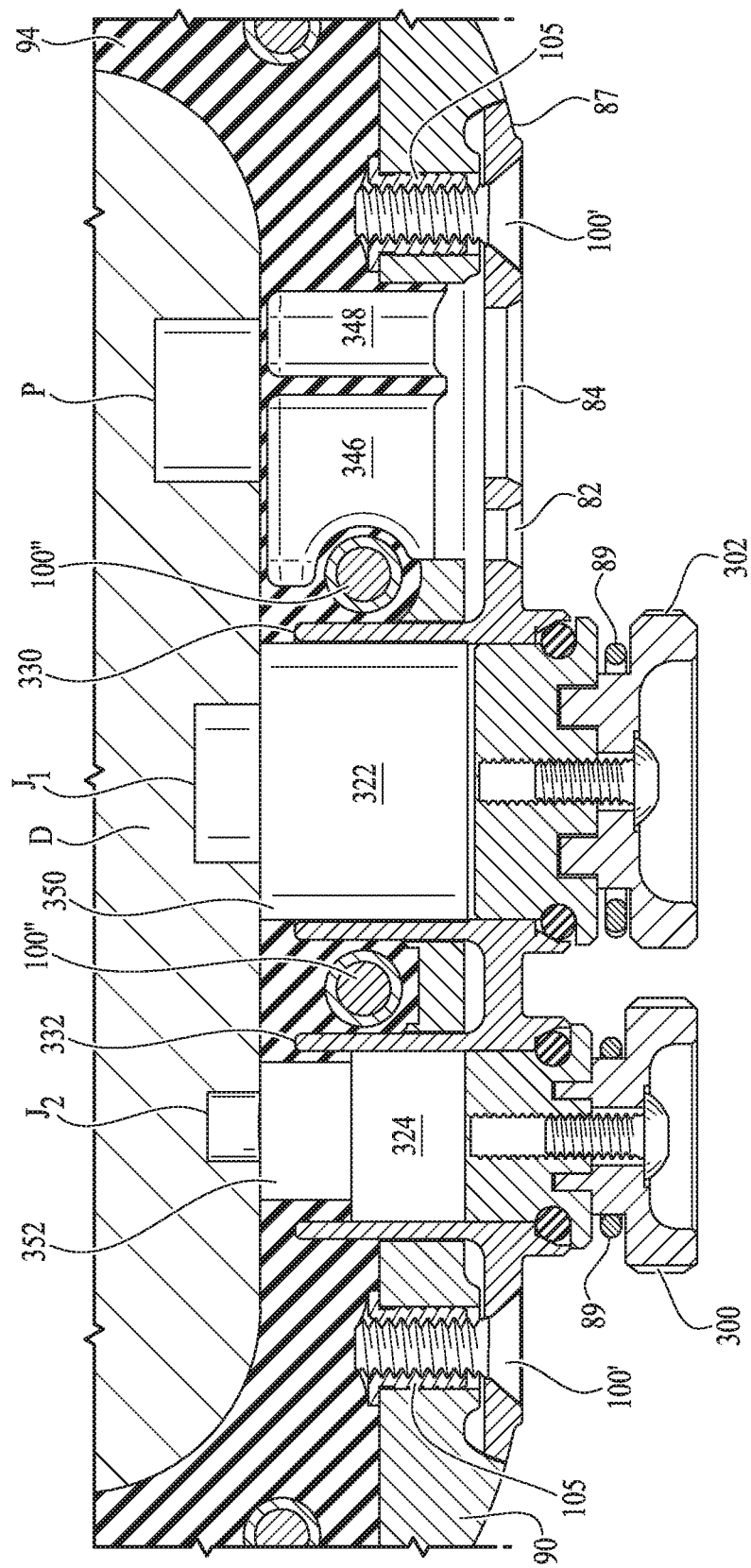
FIG. 21 is a magnified partial cross-sectional view of the rail of FIG. 17, taken at 21-21.
Figure 22:
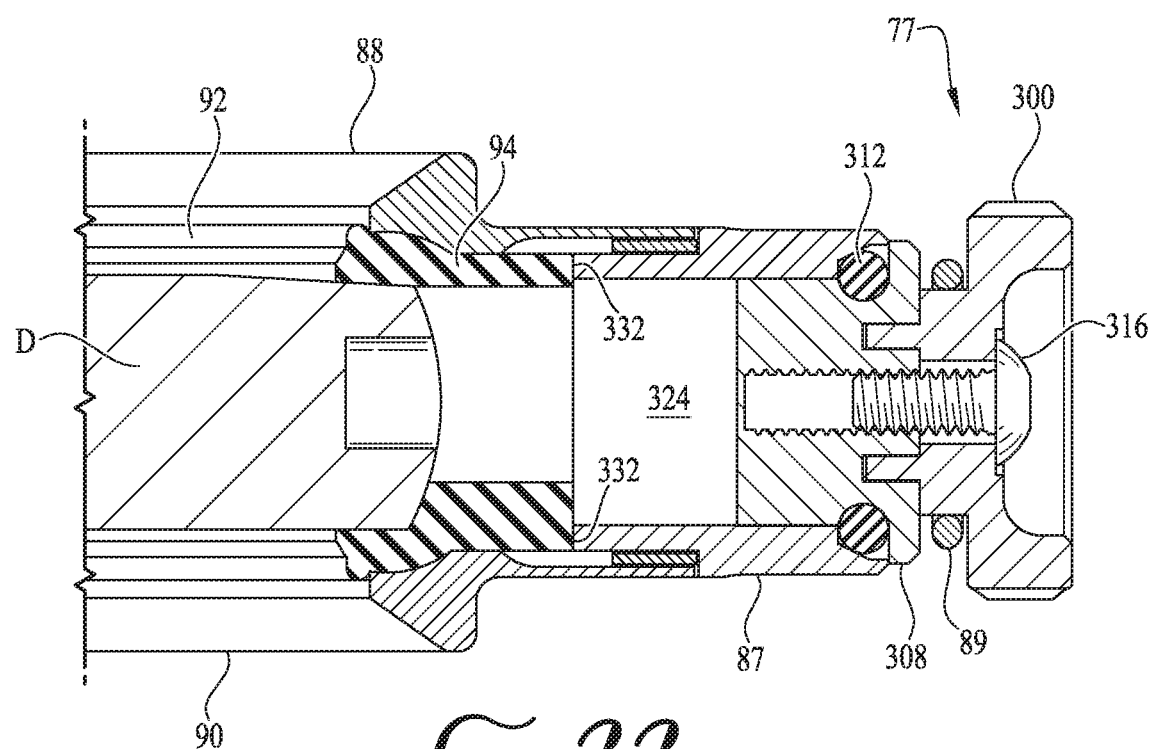
FIG. 22 is a magnified partial cross-sectional view of the mounting system of FIG. 12, taken at 22-22.
Figure 23:
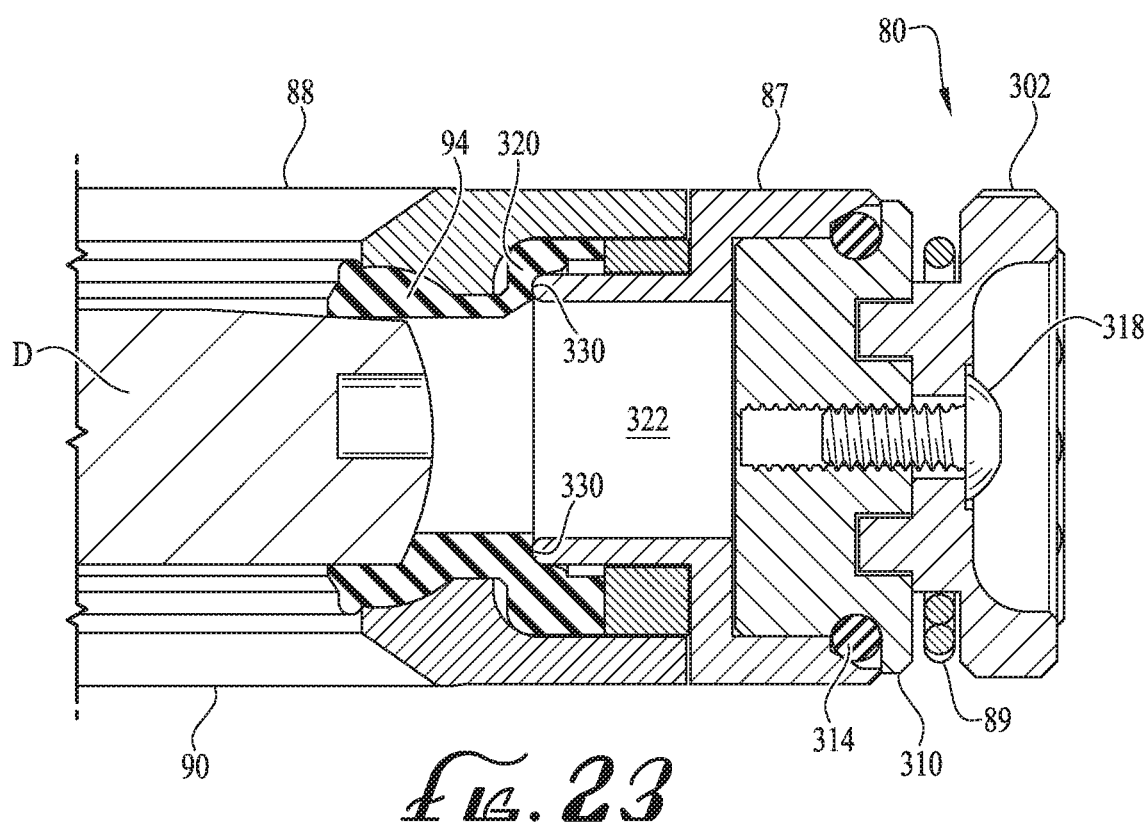
FIG. 23 is a magnified partial cross-sectional view of the mounting system of FIG. 12, taken at 23-23.

FIGS. 18-23 illustrate an embodiment for sealing the various data, audio, power, etc. jacks of present on device D, yet permitting access to these jacks without compromising the waterproof or water-resistant properties of device case 56. As shown in FIG. 20, a portion of one or more of first frame member 88, second frame member 90, and sidewall frame member 92 are concavitally shaped to form a mortise portion 342 configured to receive a tenon portion 344 of sealing plate 87. Sidewall frame member 92 includes an opening configured to receive sealing plate 87. In some embodiments, and as shown in FIGS. 18 & 21, sidewall frame member 92 includes through ports 338, 340, 341 configured to receive sealing plate 87 in a manner where sealing plate 87 is in direct opposition to sidewall frame member 92.

As shown in FIG. 20, sealing plate 87 is configured to be detachably connected to device case 56 by threading screws 100' through sealing plate 87 and into threaded holes 334 and 336. As shown in FIGS. 20 & 21 sealing plate 87 includes through ports 326 and 328 formed through sealing plate 87 to permit insertion therethrough various cables for connection to various jacks J1 and J2 of device D (e.g., the audio jack, the data and/or power jack, etc.). Sealing plate 87 can also include through ports 82 and 84 formed through sealing plate 87 to permit sound therethrough, for example, sound emanating from a speaker of device D or sound being picked up by a microphone present on device D. Hollow bosses 322 and 324 extend from a back portion of sealing plate 87 and are in alignment with through ports 326 and 328, respectively. Through ports 338, 340 are configured to received therein hollow bosses 322 and 324.

Referring now to FIGS. 20-23, in some embodiments, leading edges 330 and 332 of each of hollow bosses 322 and 324 of sealing plate 87 are configured to be pushed against gasket member 94, with leading edges 330 and 332 deforming gasket member 94 so that a leak-tight seal is formed between through ports 322 and 324 and gasket member 94. Through ports 326 and 328 can be threaded and receive sealing caps 77 and 80. Each of sealing caps 77 and 80 include an O-ring 312, 314 to provide a leak-tight seal between sealing caps 77 and 80 and their respective through ports 326 and 328. Lanyard 89 is tied about each of sealing caps 77 and 80 connecting the two, yet permitting independent twisting of each of caps 77 and 80 so that one can be threaded in and out without affecting the other.

Referring to FIG. 21, in some embodiments, gasket member 94 includes hollow portions 346 and 348 which are formed partially through gasket member 94, leaving a thin, yet water-proof wall to permit sound to travel therethrough, for communications through a microphone/speaker port P. Ports 82 and 84 align with hollow portions 346 and 348 to permit transmission of sound therethrough. Looking more closely at screws 100', which fasten sealing plate 87 to sidewall frame member 92 by threading into threaded inserts 105.

FIGS. 18, 26 & 27 illustrate button inserts 96 which can selectively be brought into contact with respective button protrusions B formed on gasket member 94, which permit pushing of various buttons on device D while still maintaining a water resistant or waterproof properties of device case 56. For example, button insert 96' contacts protrusion 358 on gasket member 94 for activating button B1 once pushed in by a user. Likewise, button inserts 96" and 96'" contact protrusions 356 and 354 on gasket member 94, respectively, control a rocket switch B2. Also, button insert 96"" contacts protrusion 360 on gasket member 94 for activating button B3 once pushed in by a user.

Looking at FIGS. 28-45, an exemplary example of bracket 54 is illustrated. Bracket 54 includes first jaw member 70 comprising an inner surface and an outer surface 154 and second jaw member 72 comprising an inner surface and an outer surface 156. Inner surface of first jaw member 70 comprises a first clamping portion 122 including one or more engagement bosses 74 and a first mating portion 150. Inner surface of second jaw member 72 comprises a second clamping portion 124 including one or more engagement bosses 75 and a second mating portion 152. Bracket 54 can also include a back plate 73 spanning between first jaw member 70 and second jaw member 72.

In preferred embodiments, first clamping portion 122 of first jaw member 70 comprises two engagement bosses 74, 74' and second clamping portion 124 of second jaw member 72 comprises two engagement bosses 75, 75'. First jaw member 70 and second jaw member 72 are fixed together in a clamping arrangement, with first jaw member 70 and second jaw member 72 configured to slidably translate toward or away from one another. This movement brings first clamping portion 122 including one or more engagement bosses 74 of first jaw member 70 toward or away from the corresponding second clamping portion 124 including one or more engagement bosses 75 of second jaw member 72. Because first clamping portion 122 including one or more engagement bosses 74 are opposed to second clamping portion 124 including one or more engagement bosses 75, their respective first and second jaws 70, 72 are configured to be brought toward each other in a clamp-like action. Insertion, or even partial insertion, of one or more engagement bosses 74, 75 into their respective one or more engagement slots 58 creates a strong clamping engagement between bracket 54 and rail 52, preventing separation of the two even under great force.

Although bracket 54 is illustrated as having two engagement bosses 74, 74' on first clamping portion 122 on first jaw 70, and two engagement bosses 75, 75' on second clamping portion 124 of second jaw 72 configured to engage within one or more engagement slots 58, engagement bosses 74, 75 are optional and modifiable. In addition, although a preferred embodiment of bracket 54 includes engagement bosses 74, 74', 75, 75', more or fewer engagement bosses 74, 75 can be arranged on bracket 54. In at least one embodiment, engagement bosses 74, 75 can be excluded and replaced with an alternative engagement face, such as two opposing smooth faces, two opposing knurled faces, two opposing toothed faces, two opposing coated/covered faces (e.g., a layer of rubber or other elastomeric material), and/or any combination thereof, and/or other configuration. In this example, bracket 54 can clamp to any number of attachment points compatible with the particular type of engagement face configuration. which may be on a rail or other object/base.

Figure 9:
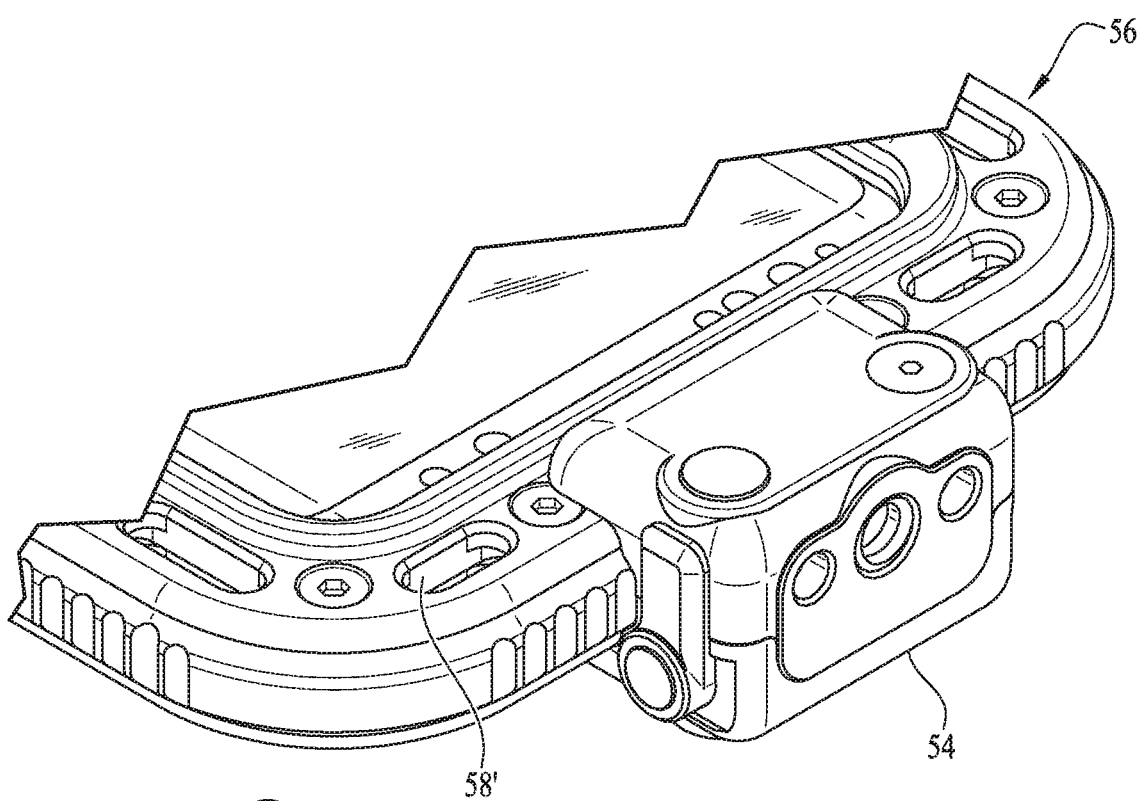
FIG. 9 is a magnified top perspective view of a mounting system disclosed herein, showing a bracket disclosed herein in a first position on the first end of a rail disclosed herein.
Figure 10:
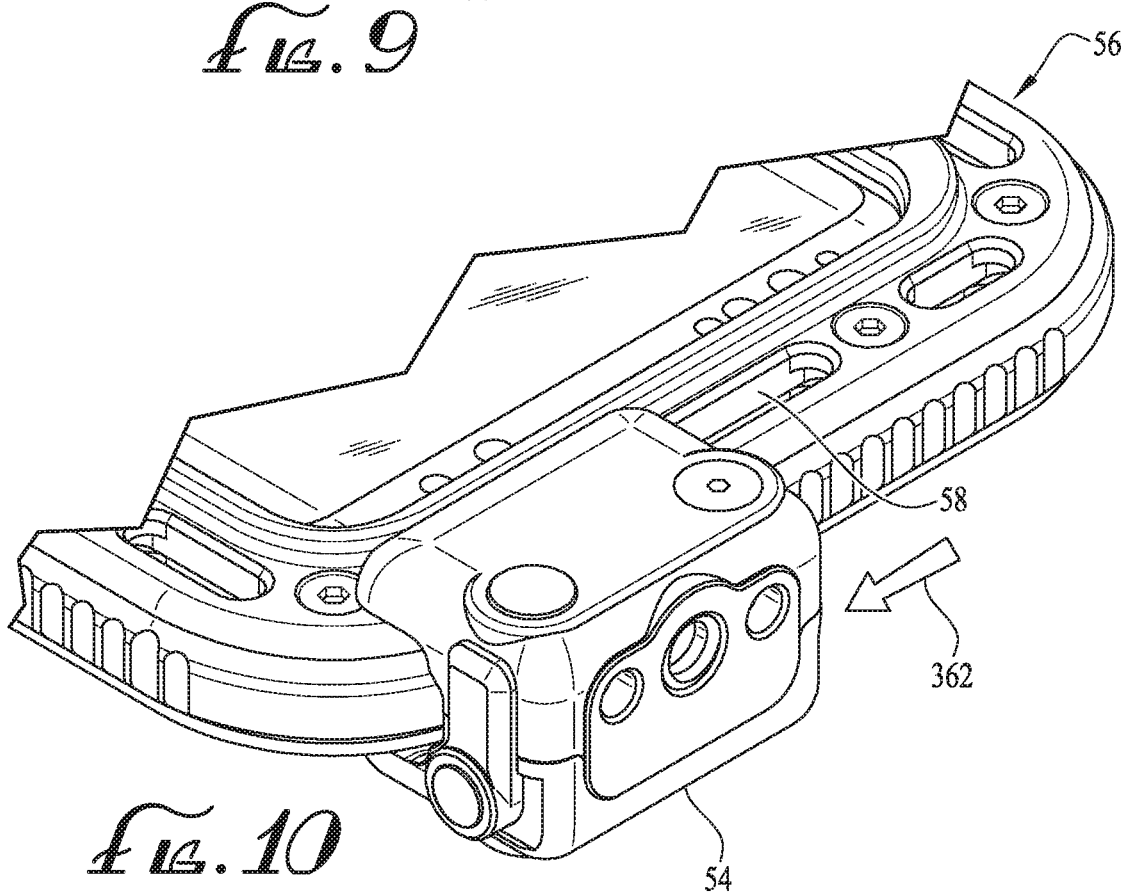
FIG. 10 is a magnified perspective view of the mounting system of FIG. 9, showing a bracket disclosed herein moved to a second position on the first end of a rail disclosed herein.
Figure 11:
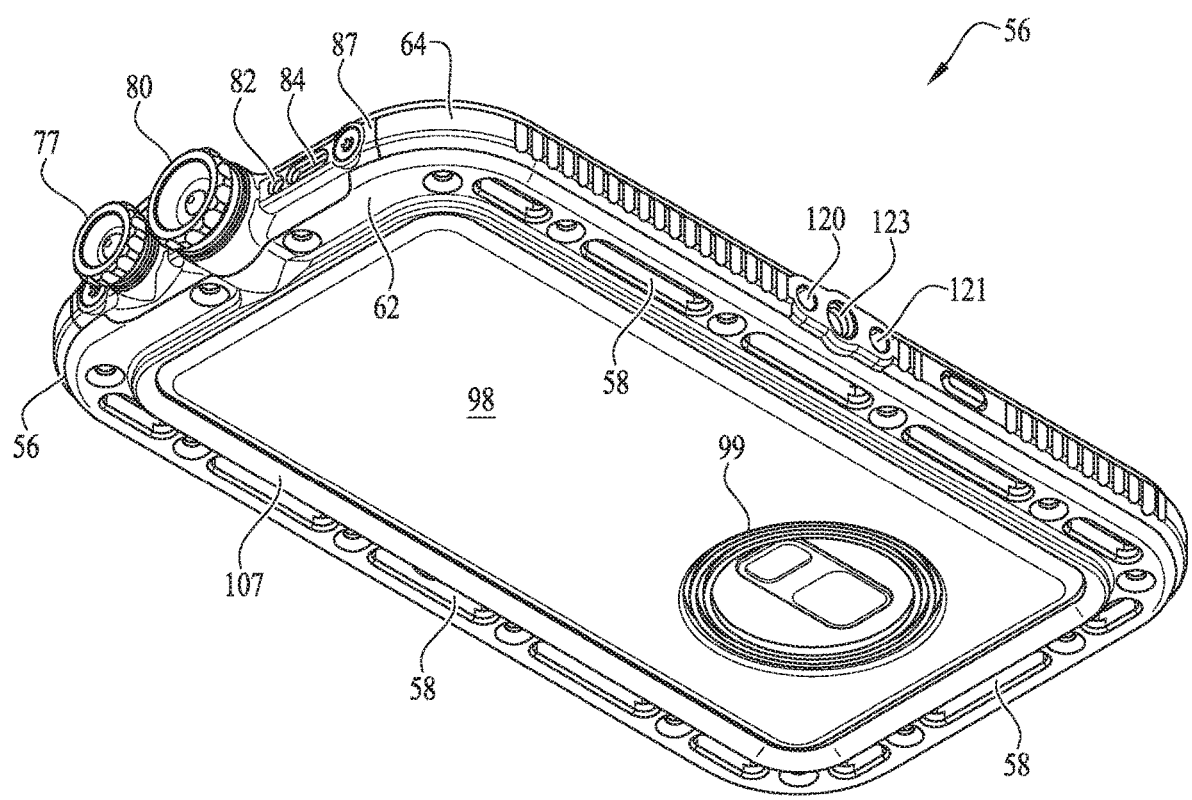
FIG. 11 is a bottom perspective of the rail of FIG. 8A.

Bracket 54 is capable of being clamped to rail 52 at any point where one or more engagement bosses 74, 75 can engage one or more engagement slots 58. To illustrate this capability, as shown in FIGS. 9 & 10, bracket 54 is shown engaged within a first engagement slot 58, which is located at one of the short sides of rail 54. Arrow 362 illustrates the movement of bracket 54 from being solely engaged within first engagement slot 58 (which is an elongated slot capable of receiving all of one or more engagement bosses 74, 75 simultaneously) to being engaged within both first engagement slot 58 and second engagement slot 58', with at least one engagement boss 74, 75 of one or more engagement bosses 74, 75 being engaged within first engagement slot 58, and at least one engagement boss 74, 75 of one or more engagement bosses 74, 75 being engaged within second engagement slot 58', with bracket 54 spanning the gap between first engagement slot 58 and second engagement slot 58'. Of course, when in the locked or clamped configuration, bracket 54 cannot be simply slid to the left as indicated by arrow 362. First, bracket 54 must be unlocked to disengage one or more engagement bosses 74, 75 from first engagement slot 58 achieved by separating first jaw member 70 from second jaw member 72 (which will be discussed in greater detail below). Next, bracket 54 can be either slid over rail 52 or removed altogether from rail 52 to reposition at least one engagement boss 74, 75 of one or more engagement bosses 74, 75 overtop second engagement slot 58' and at least one engagement boss 74, 75 of one or more engagement bosses 74, 75 overtop first engagement slot 58. Thereafter, first jaw member 70 and second jaw member 72 are manually compressed toward each other to reengage one or more engagement bosses 74, 75 to rail 52, within first engagement slot 58 and second engagement slot 58'.

As best shown in FIGS. 28, 32, 34, 35, 36, 40, 42 & 43, within a throat region of bracket 52 (between first jaw member 70 and second jaw member 72) is a recessed portion formed in first jaw 70 and a recessed portion formed in second jaw 72, to provide clearance for third engagement surface 64 of rail 54 or sidewall frame member 92. In addition, recessed portions also prevent suction forces to occur when bracket 54 is in the closed configuration as well as facilitate removal of debris, thereby ensuring and maintaining proper operability of bracket 54.

Referring to FIGS. 29, 33, 37, & 41 back plate 73 of bracket 54, extending cantilevered from first jaw member 70, provides additional guidance and strength to bracket 54 as it is clamped down on rail 52 and opened to release bracket from rail 52. Back plate 73 includes one or more adaptor attachment points 123, for securing another device or component thereof to bracket 54 using compatible mounting systems. Back plate 73 also comprises indexing holes 120, 121 to facilitate properly orientation of another device or component thereof being attached to back plate 73 as well as to prevent misalignment of an attached device or component thereof while secured to bracket 54. In some embodiments, adaptor attachment point 123 can be any standard screw thread known in the art, including, without limitation, ¼-20 UNC thread, a ⅜-16 UNC thread, or any similar screw thread standards known in the art.

Figure 46:
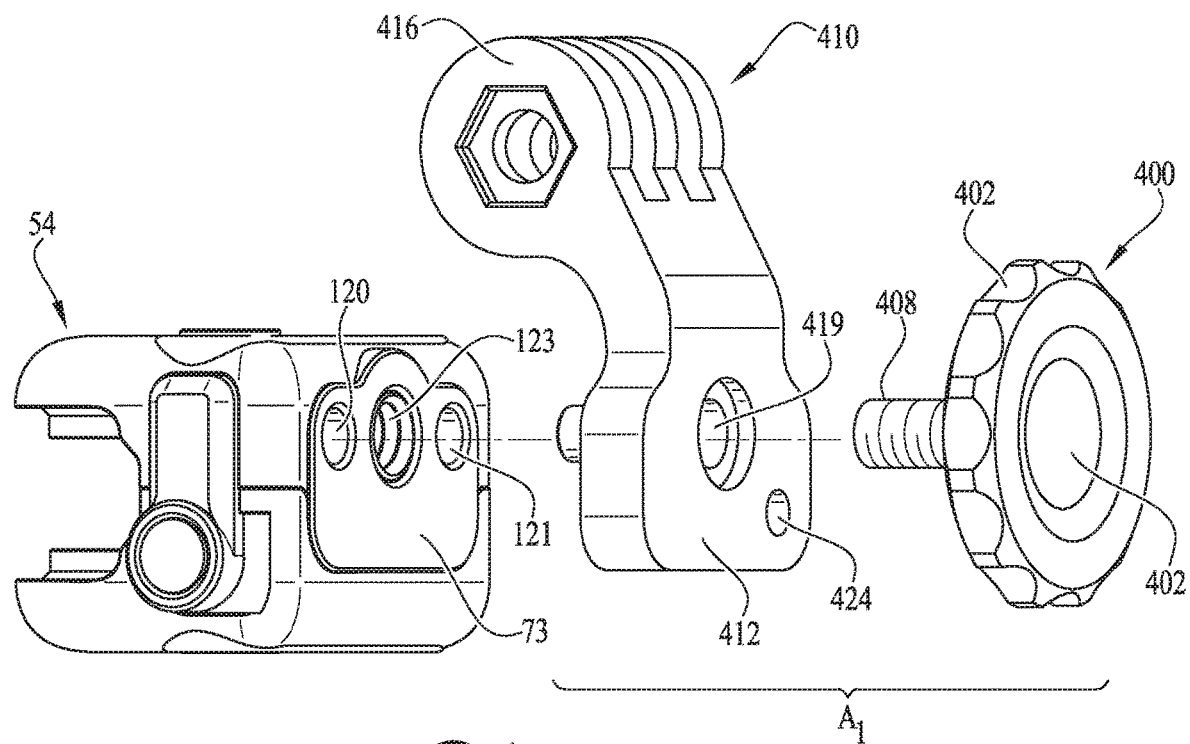
FIG. 46 is an exploded back perspective view of the bracket adaptor disclosed herein, illustrating attachment of the bracket adaptor to the bracket of FIG. 44.
Figure 47:
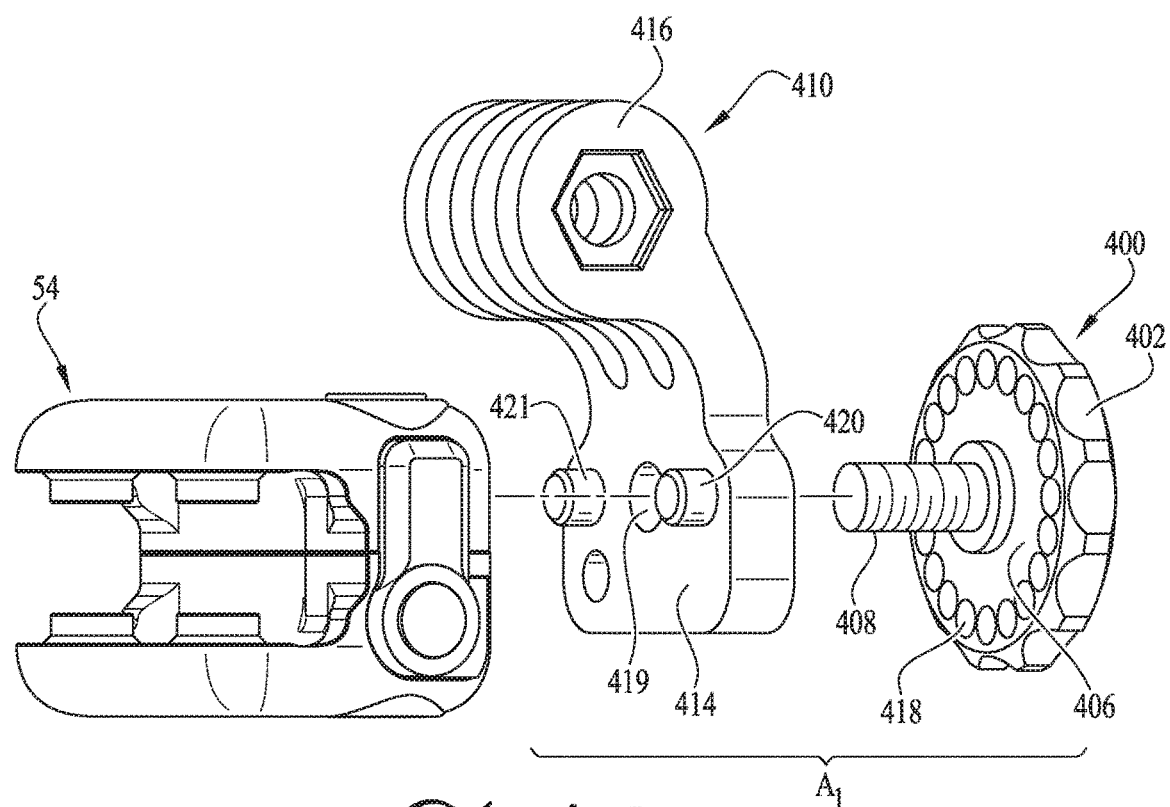
FIG. 47 is an exploded front perspective view of the bracket adaptor of FIG. 46, illustrating attachment of the bracket adaptor to the bracket of FIG. 44.

Back plate 73 comprising one or more adaptor attachment points 123 and indexing holes 120, 121 can be employed to attach an adaptor to bracket 54. In some embodiments, and as shown in FIGS. 46 & 47, a bracket adaptor A1, in this case, a GoPro adaptor, comprises an adaptor screw 400 and an adaptor base 410, where adaptor base 410 is secured to back plate 73 by threading adaptor screw 400 into attachment point 123. Adaptor screw 400 comprises a disc 402 having a top surface 404 and a bottom surface 406 and a threaded portion 408 centrally located on bottom surface 406 and extending perpendicularly from the bottom surface 406. Adaptor base 410 comprises a top surface 412, a bottom surface 414, an attachment portion 416 and a through hole 419 configured to align with attachment point 123 once adaptor base 410 is properly oriented to back plate 73. Bottom surface 414 includes a first protrusion 420 and a second protrusion 421 extend perpendicularly from bottom surface. First and second protrusions 420, 421 are configured to align and insert into indexing holes 120, 121 in a manner that properly orientates adaptor A1 to back plate 73 and prevents misalignment while secured.

A bracket adaptor, e.g., bracket adaptor A1, can further comprise a detent mechanism to controllably rotate and temporarily fix the rotation of adaptor screw 400 relative to back plate 73 of bracket 54. In some embodiments, detent mechanism includes a detent plunger or equivalent mounted to bracket adaptor A1 and one or more detents 418 (hemispherical depressions formed as concavities) positioned on an underside portion of adaptor screw 400. In some embodiments, and as discussed above, detent plunger include a detent cylinder comprising an open end 424 and an open threaded end opposite open end 424, and a detent ball and a detent compression spring. The detent ball and the detent compression spring are captured within the detent cylinder by a set screw secured to the open threaded end, with the detent compression spring outwardly biasing the detent ball toward the open end of the detent cylinder in a manner that causes the detent ball to protrude from the open end of the detent cylinder. One or more detent plungers are located on a side that will be in contact with of the underside portion of adaptor screw 400. One or more detents 418 of adaptor screw 400 are aligned in a manner that the detent ball protruding from an open end 424 will be seated in each of the one or more detents 418 as adaptor screw 400 is screwed into attachment point 123 and the underside portion of adaptor screw 400 comes into close proximity to the side of adaptor A1 that will be in contact with of the underside portion of adaptor screw 400. This detent mechanism ensures that bracket adaptor A1 will remain secured in place and adaptor screw 400 will not become loosened over time.

Figure 41:
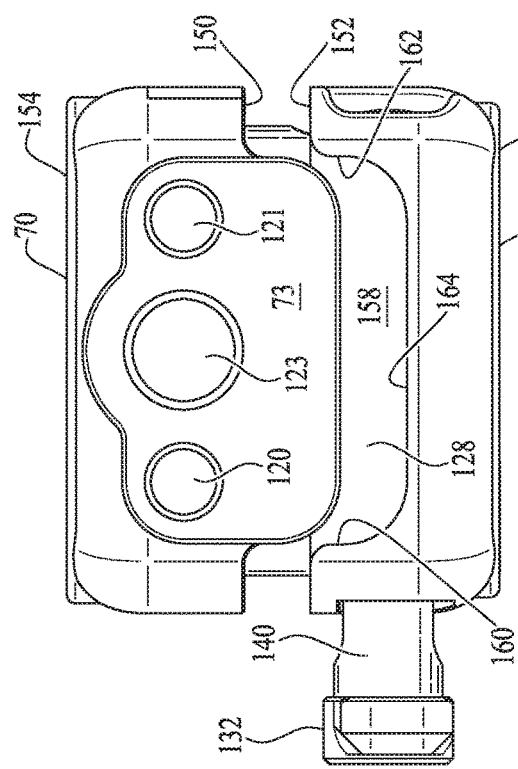
FIG. 41 is a back plan view of the bracket of FIG. 28 in the open configuration.
Figure 43:
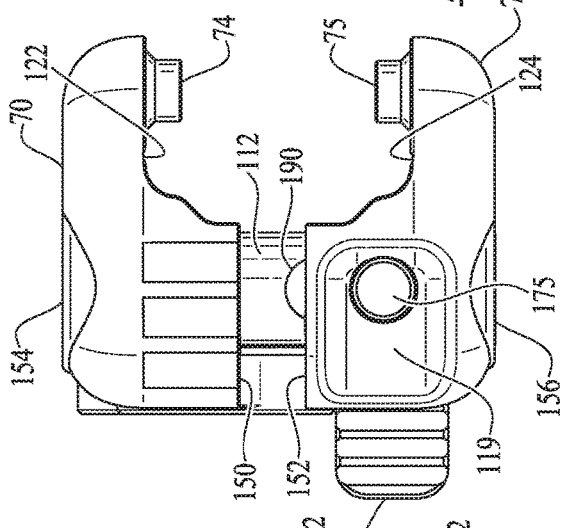
FIG. 43 is a second end plan view of the bracket of FIG. 28 in the open configuration.
Figure 40:
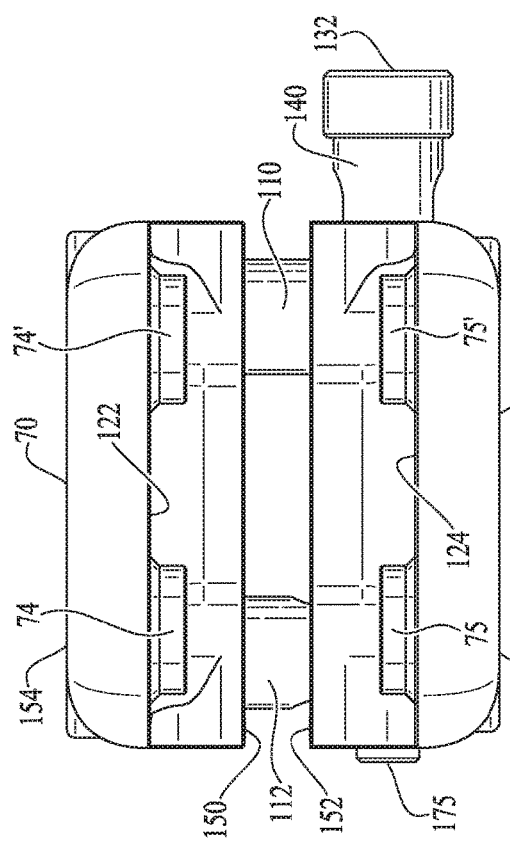
FIG. 40 is a front plan view of the bracket of FIG. 28 in the open configuration.
Figure 42:
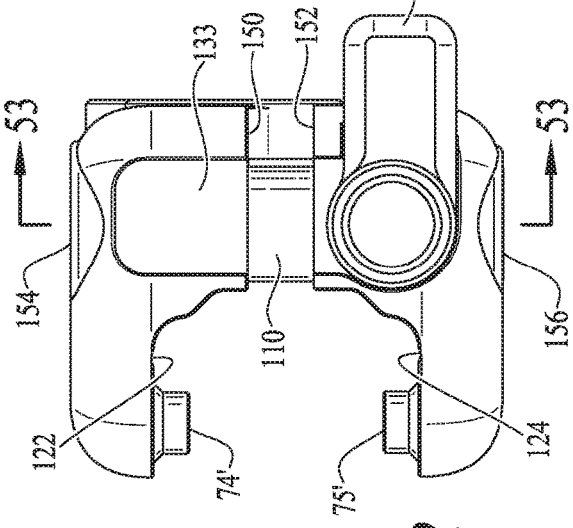
FIG. 42 is a first end plan view of the bracket of FIG. 28 in the open configuration.

As best seen in FIGS. 41 & 45, back plate 73 extends from first jaw member 70 toward second jaw member 72. Second jaw member 72 includes a back-plate recess 128 configured to receive back plate 73, permitting back plate 73 to slide within back-plate recess 128. Of course, this arrangement can be reversed, where, in one example, back plate 73 is cantilevered from second jaw member 72 and back-plate recess 128 is formed on first jaw member 70. Back-plate recess 128 includes a bottom wall 158 and sidewalls 160, 162, 164. In a preferred embodiment, and as shown in FIGS. 41 & 45, bottom wall 158 is arranged as being planar parallel to the direction of travel of back plate 73. Sidewalls 160, 162, 164 are configured to form three contiguous and/or adjacent sides. Sidewalls 160, 162 aid in limiting side-to-side tilt of first jaw member 70 relative to second jaw member 72 when in a locked configuration, due to back plate 73 contacting one or both of sidewalls 160, 162. Further, bottom wall 158 prevents back tilt of first jaw member 70 relative to second jaw member 72 due to back plate 73 contacting bottom wall 158. This is particularly important is designs where one or more engagement bosses 74 are spread apart from one or more engagement bosses 75 due to back tilt. Thus, because side-to-side tilt and back tilt is sufficiently limited or prohibited, one or more engagement bosses 74, 75 are prevented from disengaging their respective engagement slots 58, creating an exceptionally strong clamp for secure mounting on bracket 54 of further accessories.

Although back plate 73 is an optional feature, without back plate 73, more stress would be carried by pin assembly of bracket 54. Nonetheless, bracket 54 would still function in an embodiment without back plate 73.

Referring to FIGS. 40, 44, 45 & 51-54, movement of first jaw member 70 relative to second jaw member 72 is guided by a pin assembly comprising a guide pin 110 and a latching guide pin 112. A pin assembly of bracket 52 comprising guide pin 110 and latching pin 112 serve to guide movement of first and second jaw members 70, 72 relative to each other. Looking initially at guide pin 110, this component is cylindrical in shape and comprises a first end and a second end, the second end comprising a notch 195 and a threaded bore formed axially through second end and configured to receive a screw 114.

Referring to FIGS. 40-45 & 51-54, guide pin 110 is positioned within a guide pin bore 142 of first jaw 70, with the first end of guide pin 110 facing outer surface 154. In some embodiments, and as shown in FIGS. 40-45 & 51-54, guide pin bore 142 is a through hole formed perpendicularly through first jaw member 70 from first mating portion 150 to outer surface 154. Guide pin 110 is configured to slide within guide pin bore 142; thus, the tolerance of the two parts should be designed to form a sliding fit. A guide pin counterbore 146 is formed perpendicularly on second mating portion 152 of second jaw member 72 and is configured to receive the second end portion of guide pin 110. A bottom surface of guide pin counterbore 146 includes a step 147 that is configured to receive notch 195 of the first end of guide pin 110. This notch 195 and step 147 configuration prevents guide pin 110 from rotating and/or becoming misaligned within guide pin bore 142 and guide pin counterbore 146. Guide pin counterbore 146 also includes through hole formed perpendicularly though bottom surface of guide pin counterbore 146 to outer surface 156. Through hole of guide pin counterbore 146 is configured to receive therethrough screw 114. Screw 114 inserts through second jaw member 72 and threads tightly into threaded bore of second end of guide pin 110 to fasten guide pin 110 to second jaw member 72. A countersink can be formed on outer surface 156 of second jaw member 72 to provide clearance for receiving screw 114 head flush to or beneath the plane of outer surface 156.

Once secured, screw 114 (or other appropriate fastener, adhesive, weld, braze, or other appropriate bonding or fastening means) firmly holds guide pin 110 within the larger hole of guide pin counterbore 146. In this way, guide pin 110 serves to guide the movement of first jaw member 70 relative to second jaw member 72 with guide pin 110 held to second jaw member 72 via screw 114. Although described as being perpendicular to first mating portion 150, guide pin bore 142 and guide pin counterbore 146 can also be oriented parallel to the direction of jaw travel, if first mating portion 150 is irregular or angled.

Figure 48:
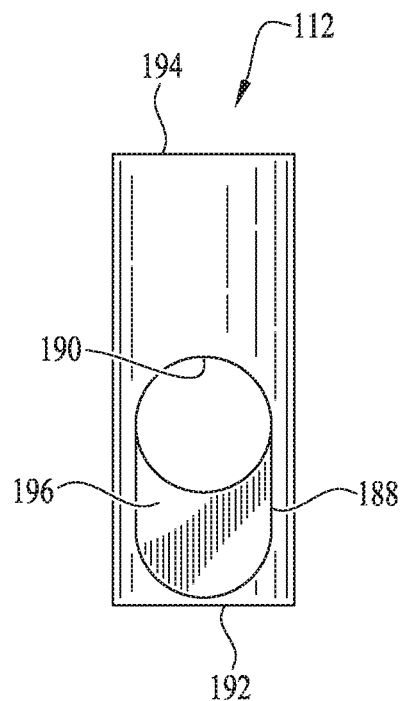
FIG. 48 is a first side view of a latching pin disclosed herein.
Figure 49:
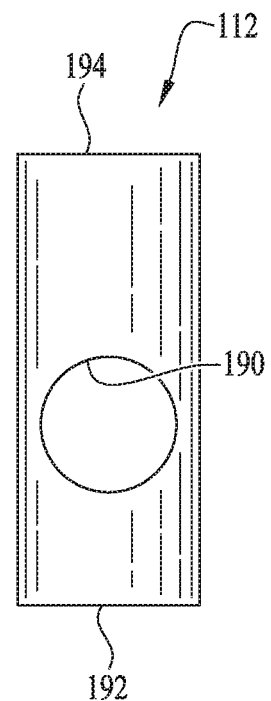
FIG. 49 is a second side view of the latching pin of FIG. 48.

Looking at latching pin 112, and as shown in FIGS. 48 & 49, latching pin 112 is cylindrical in shape and comprises a first end 192 and a second end 194, second end 194 comprising a notch 198 and a threaded bore formed axially through second end 194 and configured to receive a screw 116. As shown if FIGS. 48 & 49, latching pin 112 further comprises a bolt channel 188, a latch bolt hole 190, and a bolt stop 196. Bolt channel 188 runs along the length of latching pin 112 to an appropriate depth to define bolt stop 196 on a shelf-like area. Latch bolt hole 190 is radially formed within bolt channel 188 nearest second end 194, perpendicular to and through the longitudinal axis of latching pin 112. Bolt channel 188 is formed closer in proximity first end 192 of latching pin 112 (e.g., bolt channel 188 is offset from the middle of latching pin 112, and toward first end 192). As discussed below, latching pin 112 additionally receives latch bolt pin 174 of latch bolt 140 through latch bolt hole 190.

Referring to FIGS. 40-45, 48, 49 & 51-54, latching pin 112 is positioned within a latching pin bore 144 of first jaw 72, with first end 192 of latching pin 112 facing outer surface 156. In some embodiments, and as shown in FIGS. 40-45, 48, 49 & 51-54, latching pin bore 144 is a through hole formed perpendicularly through second jaw member 72 from second mating portion 152 to outer surface 156. Latching pin 112 is configured to slide within latching pin bore 144; thus, the tolerance of the two parts should be designed to form a sliding fit. A latching pin counterbore 148 is formed perpendicularly on first mating portion 150 of first jaw member 70 and is configured to receive second end 194 of latching pin 112. A bottom surface of latching pin counterbore 148 includes a step 149 that is configured to receive notch 198 of first end 192 of latching pin 112. This notch 198 and step 149 configuration prevents latching pin 112 from rotating and/or becoming misaligned within latching pin bore 144 and latching pin counterbore 148. Latching pin counterbore 148 also includes through hole formed perpendicularly though bottom surface of latching pin counterbore 148 to outer surface 154. Through hole of latching pin counterbore 148 is configured to receive therethrough a screw 116 that is threaded into the threaded bore formed axially through send end 194 of latching pin 112. Screw 116 inserts through first jaw member 70 and threads tightly into threaded bore of second end 194 of latching pin 112 to fasten latching pin 112 to first jaw member 70. A countersink can be formed on outer surface 154 of first jaw member 70 to provide clearance for receiving screw 116 head flush to or beneath the plane of outer surface 154.

Once secured, screw 116 (or other appropriate fastener, adhesive, weld, braze, or other appropriate bonding or fastening means) firmly holds latching pin 112 within the larger hole of latching pin counterbore 148. In this way, latching pin 112 serves to guide the movement of second jaw member 72 relative to the first jaw member 70 with latching pin 112 held to first jaw member 70 via screw 116. As discussed further below, but for a bolt 174 checking its motion, latching pin 112 would be permitted to slide up and down axially within latching pin bore 144. Although described as being perpendicular to second mating portion 152, latching pin bore 144 and latching pin counterbore 148 can also be oriented parallel to the direction of jaw travel, if second mating portion 152 is irregular or angled. Through hole of latching pin counterbore 148 is configured to receive therethrough a screw 116 that is threaded into a threaded bore formed axially through latching pin 112.

As shown in FIGS. 44, 45, & 51-54, jaw compression springs 166, 168 of bracket 52 are located between first jaw member 70 and second jaw member 72. Jaw compression springs 166, 168 are positioned in bracket 54 by a first and a second ends within respective locating holes formed in first and second mating portions 150, 152 of first and second jaw members 70, 72 respectively. As discussed further below, but for a bolt 174 checking its motion, jaw compression springs 166, 168 provide a separating bias that forces first jaw member 70 and second jaw member 72 apart.

Figure 50:
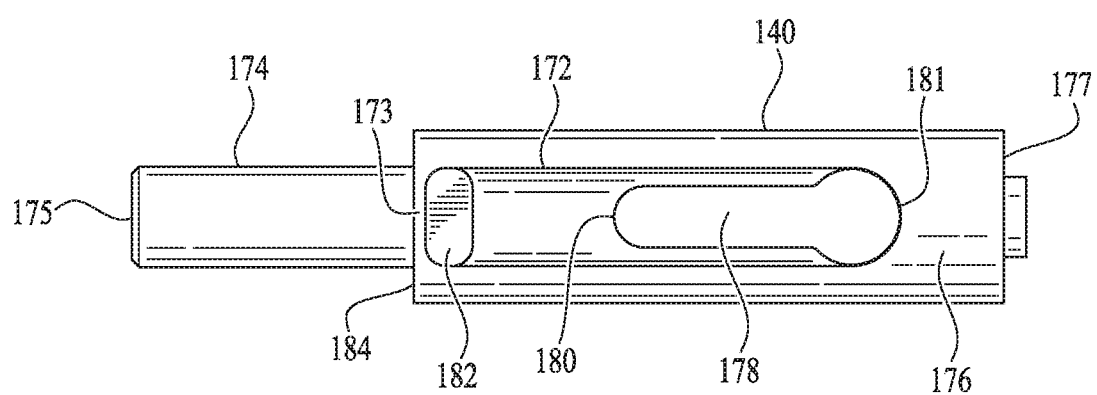
FIG. 50 is a side view of a latch bolt disclosed herein.

As best shown in FIGS. 44 & 45, a latch bolt assembly comprises a latch bolt 140 and a latch bolt bore 118 where a latch bolt 140 is capable of sliding within latch bolt bore 118 to lock and unlock bracket 54. In some embodiments, latch bolt assembly is housed within of second jaw member 72. Referring to FIG. 50, latch bolt 140 of latch bolt assembly includes a cylindrical body 176 with a latch bolt pin 174 protruding axially from an end of cylindrical body 176, where latch bolt pin 174 is smaller in diameter than cylindrical body 176 forming an annular shoulder 184. An elongated channel 172 runs along the length of cylindrical body 176 to form an enclosure for latch bolt compression spring 170 with a spring seat 182 being formed within elongated channel 172 nearest annular shoulder 184. Optionally, and as shown in FIGS. 44, 45 & 51-54, latch bolt compression spring 170 further comprises a spring insert 169. A limiter slot 178 is formed within elongated channel 172, where elongated channel 172 and limiter slot 178 are formed through cylindrical body 176 perpendicular to and through the longitudinal axis of cylinder body 176 (i.e., along the radial direction), defining a first limiter wall 180 and a second limiter wall 181. Limiter slot 178 prevents latch bolt compression spring 170 from contacting guide pin 110 and screw 114.

As best shown in FIGS. 44 & 45, latch bolt 140 engages with latching pin 112 to lock and unlock bracket 54. As shown in FIGS. 44, 45 & 51-54, latch bolt pin 174 rides within a bolt channel 188 of latching pin 112. At least a portion of latch bolt pin 174 is biased to reside within bolt channel 188 by latch bolt compression spring 170. In operation, and in the closed configuration, latching pin 112 additionally receives latch bolt pin 174 of latch bolt 140 through latch bolt hole 190.

Figure 51:
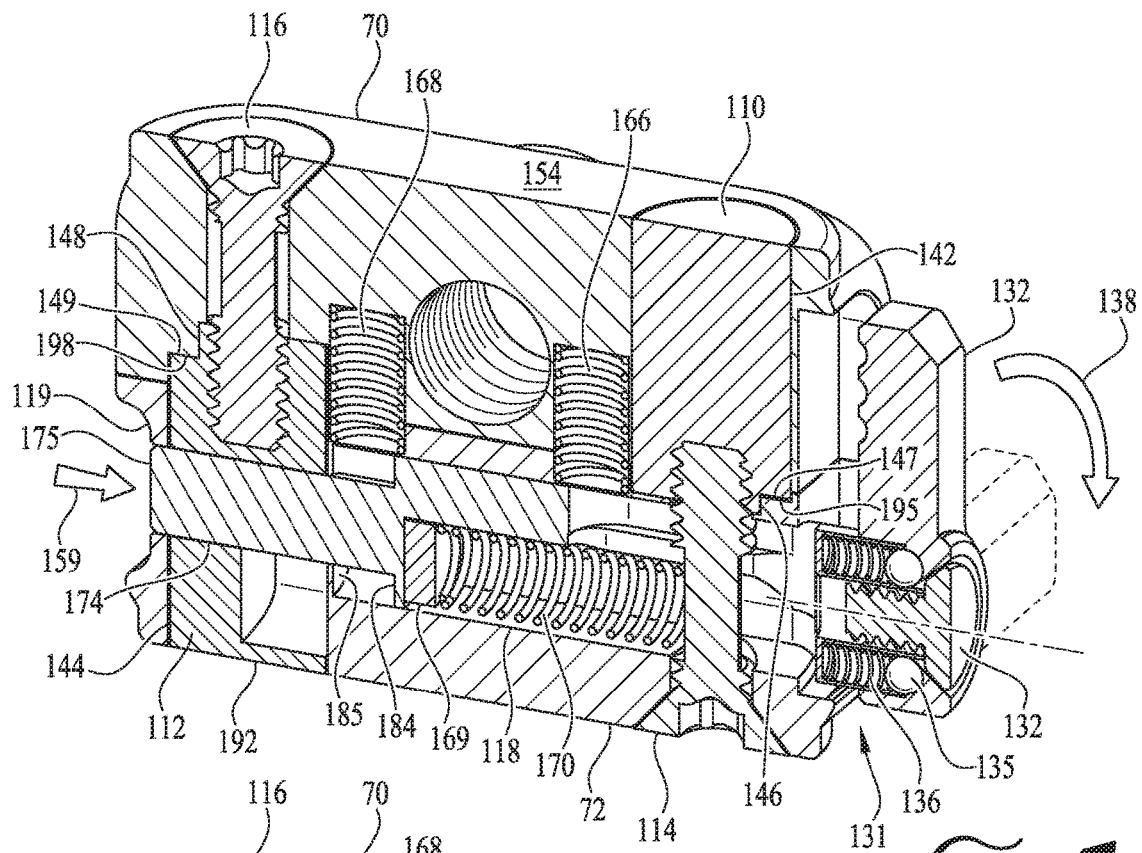
FIG. 51 is a cross-sectional top perspective view of the bracket of FIG. 34, showing the bracket in the closed and locked or unlatched configuration, with rotating tab slightly pulled from its recess and ready for rotation.
Figure 52:
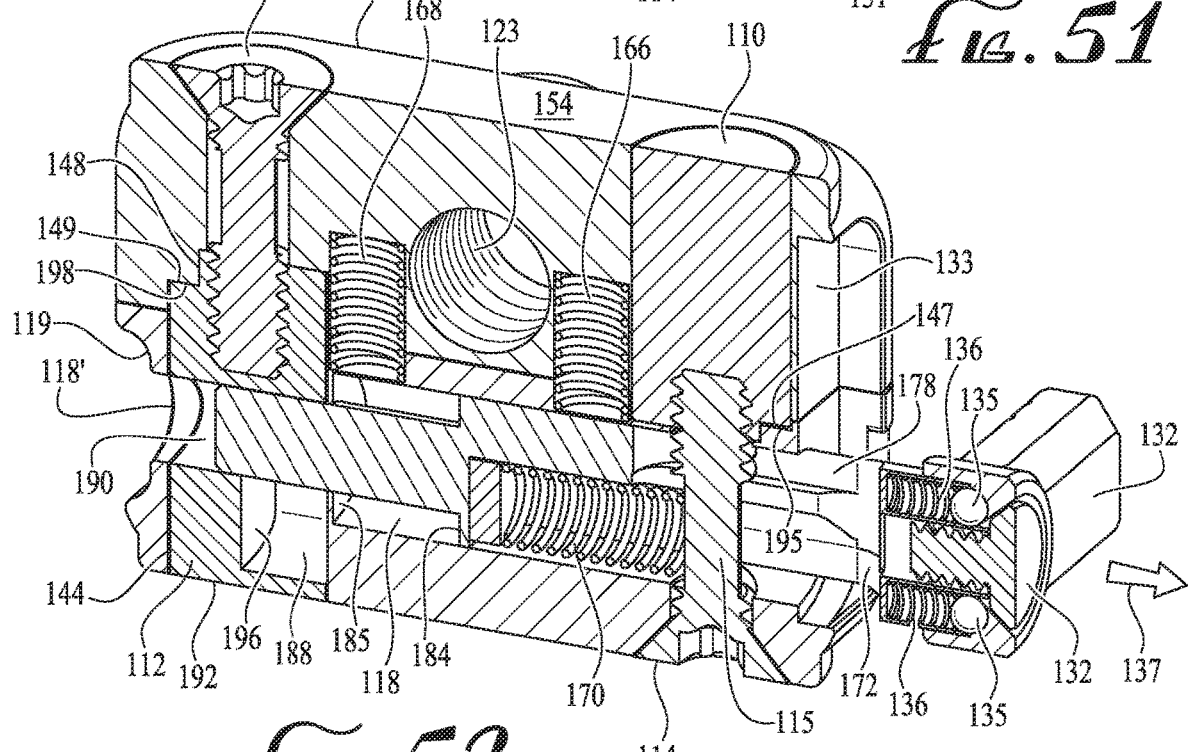
FIG. 52 is a cross-sectional top perspective view of the bracket of FIG. 42, showing the bracket in the closed and unlocked or unlatched configuration and ready for opening.
Figure 53:
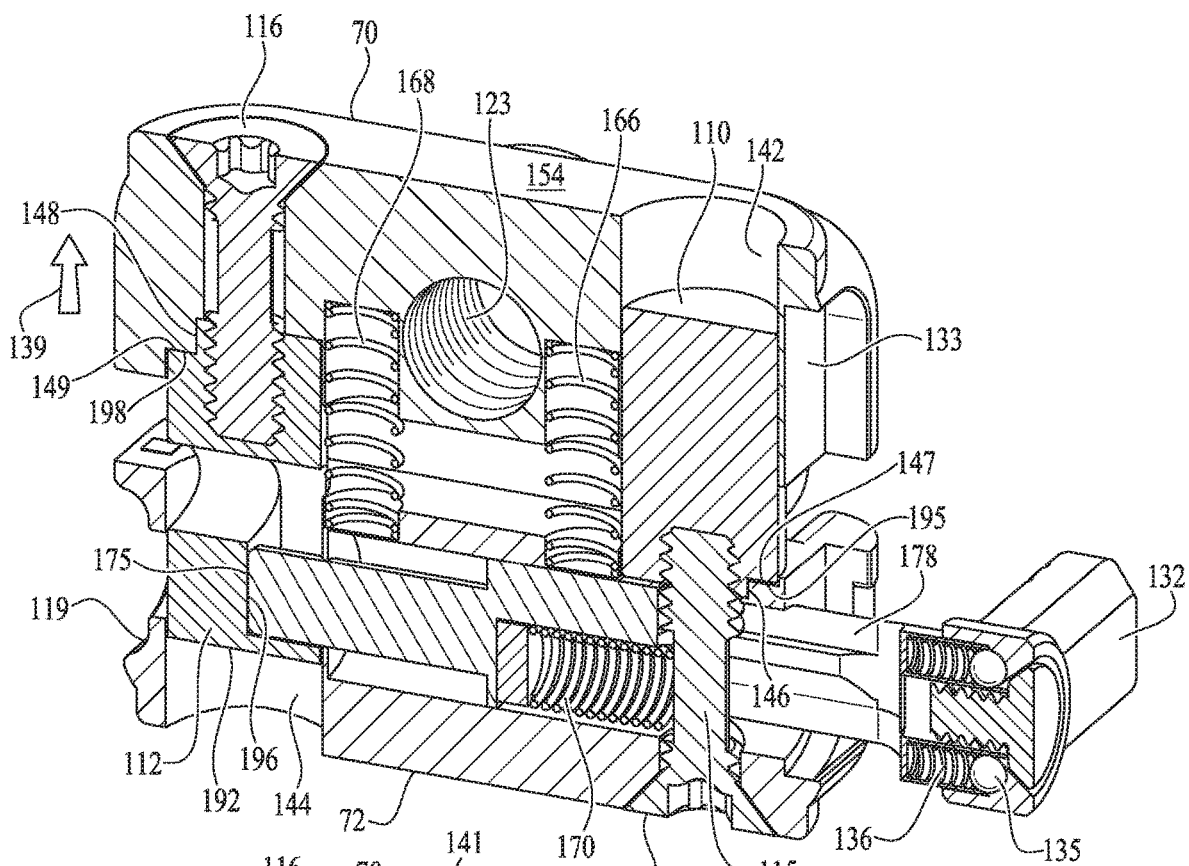
FIG. 53 is a cross-sectional top perspective view of the bracket of FIG. 42, taken at 53-53, showing the bracket in the open and unlocked or unlatched configuration.

As best shown in FIGS. 45 & 51-52, both latching pin bore 144 and latching pin counterbore 148 are intersected (preferably through the center and perpendicular to both their longitudinal axes) by a latch bolt bore 118. Latch bolt bore 118 is a counterbored through hole drilled through the length of second jaw member 72, with a small diameter portion 118' intersecting latching pin bore 144. The full diameter portion of latch bolt bore 118 is configured to receive latch bolt 140, latch bolt pin 174 first, with latch bolt pin 174 positioned within, and configured to slide within, the small diameter portion 118'. A rotating tab 132 is fastened to an end 177 of latch bolt 140 by screw 134 into threaded hole 171, and is permitted to rotate relative to latch bolt 140. Optional detent structures are formed within a cup on rotating tab 132 and on end 177 on latch bolt 140, which permits rotating tab 132 to rotate, yet give a user the option to stop rotation at the detent's discrete angles so that rotating tab 132 can be pushed or pulled, by deploying or stowing rotating tab 132 within a tab recess 133. In this example embodiment, a detent ball assembly 131 includes four recesses 186 formed in rotating tab 132 and configured to each receive a detent ball 135 each pushed into respective recesses 186 by a spring 136 within a cup at an end of latch bolt 140. As rotating tab 132 is rotated, recesses 186 move out of alignment with detent balls 135, detent balls 135 are pushed against springs 136, compressing them, until detent balls 135 realigns with neighboring recess 186, catching detent balls 135 which also temporarily catches the motion of rotating tab 132.

In an example assembly method, latching pin 112 is fastened to first jaw member 70. Guide pin 110 is fastened to second jaw member 72. Jaw compression springs 166, 168 are each seated within their respective locating holes. Latch bolt compression spring 170 is positioned within elongated channel 172 of latching bolt 140. First jaw member 70 is initially manually coupled to second jaw member 72 by inserting latching pin 112 into latching pin bore 144 (guide pin 110 is not yet inserted). Jaw compression springs 166, 168 are then manually compressed between first and second jaw members 70, 72 to bring latch bolt hole 190 into alignment with small diameter portion 118' of latch bolt bore 118. While holding this alignment, latch bolt 140 is inserted into latch bolt bore 118 with elongated channel 172 facing toward second mating portion 152, and with latch bolt pin 174 inserted though cylindrical latch bolt hole 190 and small diameter portion 118', with terminus 175 protruding externally from small diameter portion 118'. Screw 114 is inserted through guide pin counterbore 146, transversely through limiter slot 178 of elongated channel 172, and threaded into guide pin 110 (where the guide pin 110 was inserted through guide pin bore 142 from the outside). In this manner, screw 114 traps latch bolt compression spring 170 between spring seat 184 and shank 115 and/or threads of screw 114, with latch bolt bore 118 enclosing elongated channel 172 to restrict latch bolt compression spring 170 within elongated channel 172.

Once screw 114 is threaded into guide pin 110, latch bolt 140 is trapped within latch bolt bore 118. This is because screw 114 is inserted completely through limiter slot 178, with screw 114 configured to traverse the length of limiter slot 178 (with latch bolt 140 being pushed or pulled relative to screw 114, manually and by latch bolt compression spring 170). As screw 114 reaches an end of limiter slot 178, screw 114 shank or threads contacts one of limiter walls 180, 181, which checks the travel of latch bolt 140. In this way, the travel (e.g., axial translation) of latch bolt 140 limited to the length of limiter slot 178.

Assembly of the components of bracket 54 create a positive latching mechanism by which first jaw member 70 is slidably translatable relative to second jaw member 72 by which bracket 54 can adopt a closed configuration (or locked configuration) or an open configuration (or unlocked configuration). In an open or unlocked configuration, as shown in FIGS. 36-43, 52 & 53, latch bolt 140 is retracted and against the bias of latch bolt compression spring 170, and first jaw member 70 and second jaw member 72 are forced apart by the force of jaw compression springs 166, 168. Retraction of latch bolt 140 also causes rotating tab 132 to extend from bracket 54. In an open or unlocked configuration, first mating portion 150 and/or one or more engagement bosses 74 of first jaw member 70 are the furthest apart from second mating portion 152 and/or one or more engagement bosses 75 of first jaw member 72. In an open or unlocked configuration, bracket 54 can be easily removed from rail 52 and/or repositioned to a different location of rail 52.

In a closed or locked configuration, as shown in FIGS. 28-35, 51 & 54, latch bolt 140 is forced into latch bolt hole 190 of latching pin 112 by the force of latch bolt compression spring 170 and first jaw member 70 and second jaw member 72 are in close proximity to each other and against the bias of jaw compression springs 166, 168. In addition, movement of latch bolt 140 into latch bolt hole 190 causes rotating tab 132 to become seated in tab recess 133 of bracket 54. In a closed or locked configuration, first mating portion 150 and/or one or more engagement bosses 74 of first jaw member 70 are in close proximity to second mating portion 152 and/or one or more engagement bosses 75 of first jaw member 72. In a closed or locked configuration, bracket 54 can be secured in place on rail 52.

In operation, referring to FIGS. 51 & 52, and presuming that bracket 54 is initially in a locked configuration as shown in FIG. 51, a user grasps bracket 54 (and/or rail 52 and/or any appropriate attached accessory or purchase) and manually presses in terminus 175 of latch bolt pin 174, which forces latch bolt 140 to translate, as shown by arrow 159 such that rotating tab 132 is pushed out of tab recess 133, as shown by arrow 137. Tab recess 133 provides a cavity within which rotating tab 132 normally rests when in a locked configuration, so that rotating tab 132 is not inadvertently rotated and/or becomes snagged, thus unintentionally causing bracket 54 to unlock. Additionally, tab recess 133 can be expanded to permit locking when rotating tab 132 is rotated ninety degrees. With rotating tab 132 positioned out of tab recess 133, a user can rotate rotating tab 132 relative to latch bolt 140, so that rotating tab 132 extends beyond and/or at a sufficient distance from body of bracket 54 to permit a user to manually further pull rotating tab 132, thus further pulling latch bolt 140 axially out of latch bolt bore 118. The axial travel of latch bolt 140 is outwardly limited by screw 114 contacting the limiter wall 180. Latch bolt 140 is spring biased inward, such that latch bolt 140 is biased to retract into latch bolt bore 118.

When in a locked configuration (as in FIGS. 51, 52 & 54), latch bolt pin 174 is inserted through latch bolt hole 190 (generally fully through, but at least partially within) of latching pin 112, which prohibits latching guide pin 112 from traveling axially within latching pin bore 144. Preferably, terminus 175 extends out of small diameter portion 118' to permit a user to press terminus 175, which serves as a button and/or actuator to initiate a first step of an unlocking process. As a user pulls rotating tab 132, latch bolt pin 174 of latch bolt 140 is pulled out of latch bolt hole 190 of latching pin 112 such that terminus 175 is positioned within bolt channel 188, where limiter wall 180 contacting screw 114 prevents terminus 175 from being further retracted out of bolt channel 188. Thus, terminus 175 (and a portion of latch bolt pin 174 near terminus 175) remain within bolt channel 188, when in a second step in an unlocking process is completed and bracket 54 is in the unlocked configuration. This two-step unlocking process reduces inadvertent unlocking events, due to a user having to both push terminus 175 to expose rotating tab 132 and then pulling rotating tab 132 fully pull out latch bolt 140 to open bracket 54 (i.e., the open or unlocked configuration).

Jaw compression springs 166, 168 apply a continuous bias to separate first jaw member 70 and second jaw member 72, the motion of which is checked by latch bolt pin 174, with either terminus 175 being positioned within bolt channel 188 of latching pin 112 and/or latch bolt pin 174 positioned within latch bolt hole 190 of latching pin 112. When latch bolt pin 174 is positioned within latch bolt hole 190, bracket 54 is in the locked configuration, where first jaw member 70 and second jaw member 72 are in close proximity to one another. Once latch bolt pin is removed from latch bolt hole 190 to position terminus 175 within bolt channel 188 of latching pin 112, first jaw member 70 with attached latching pin 112 is permitted to travel away from second jaw member 72. The distance of travel of latching guide pin 112 is limited by the length of bolt channel 188.

As a user pulls rotating tab 132, jaw compression springs 166, 168 push first and second jaw members 70, 72 apart, snapping to the open configuration where first and second jaw members 70, 72 are furthest away from one another. As latching pin 112 moves relative to terminus 175, latch bolt pin 174 become misaligned with latch bolt hole 190 of latching pin 112 and become aligned with bolt stop 196 latching pin 112 (which is, in this example embodiment, the floor of bolt channel 188). Thus, when a user releases rotating tab 132, latch bolt compression spring 170 within latch bolt 140 forces terminus 175 into contact with bolt stop 196. So long as latch bolt pin 174 is at least partially misaligned with latch bolt hole 190, latch bolt 140 will protrude from latch bolt bore 118, holding rotating tab 132 out from body of bracket 54.

To lock (or latch) bracket 54 (on rail 52 or in isolated), a user manually pinches first jaw member 70 toward second jaw member 72. As terminus 175 slides across bolt stop 196 of latching pin 112, latch bolt pin 174 becomes aligned once again with latch bolt hole 190 (due to the latching guide pin 112 moving deeper within latching pin bore 144), latch bolt compression spring 170 (still under compression within elongated channel 172) immediately forces latch bolt pin 174 through latch bolt hole 190, immediately locking first and second jaw members 70, 72 together.

Figure 54:
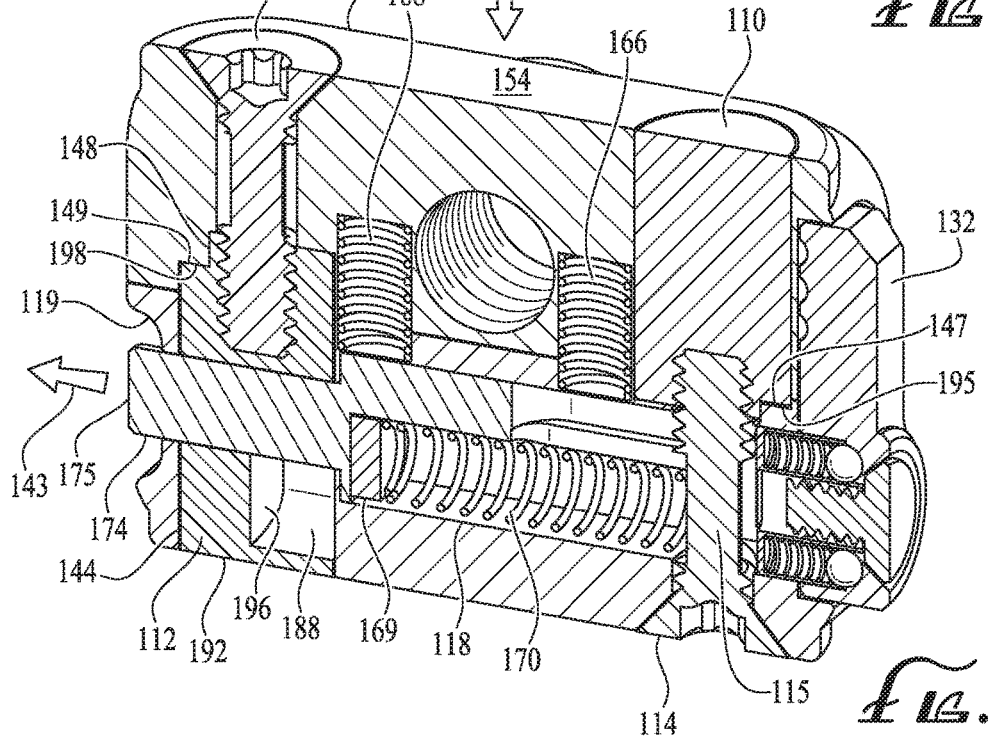
FIG. 54 is a cross-sectional top perspective view of the bracket of FIG. 34, taken at 54-54, showing the bracket in the closed and reclosed or re-latched configuration.

As discussed briefly above, rotating tab 132 is capable of rotating relative to latch bolt 140 when rotating tab 132 is pushed out of tab recess 133, to permit a user to reposition rotating tab 132 so rotating tab 132 can be easily pulled away from body of bracket 54. While within tab recess 133, rotating tab 132 is substantially restricted from rotating, due to mechanical interference of tab recess 133. Thus, once rotating tab 132 is rotated to align it with tab recess 133, terminus 175 of latch bolt pin 174 is permitted to push back through small diameter portion 118' of latch bolt bore 118, protruding from body of bracket 54. As best shown in FIGS. 51 & 54, although terminus 175 is described as protruding from body of bracket 54 to serve as a button, terminus 175 may protrude from a button recess 119 formed in body of bracket 54 surrounding opening small diameter portion 118' of latch bolt bore 118. The distance of the protrusion of terminus 175 of latch bolt pin 174 is less than the depth of button recess 119, so that inadvertent depression of terminus 175 is substantially prevented.

At least one of the purposes of bracket 54 is to create a connection between rail 52 and one or more devices or components thereof (e.g., a camera, a compass, an altimeter, a GPS unit, a night vision goggle (NVG), a battery pack, and/or a large variety of electronic and analog devices and other equipment), where bracket 54 connects directly to the device or component thereof or to the device or component thereof through a positioning arm, a rotating joint, a tilting joint, a hinge joint, a branched arm, and/or a variety of appropriate connectors and/or couplers and the like.

The present specification also discloses alternate embodiments of bracket 54. As shown in FIGS. 55 & 56, a bracket 54' can comprise a hinged coupler 197. In this example, bracket 54' attaches to rail 52 in the same manner (or substantially the same, if modifications are required to accommodate hinged coupler 197). As such, in this embodiment, bracket 54' comprises a first jaw 70', a second jaw 72', and a back plate 73' along with all components thereof, and functionality thereof as described herein and illustrated in FIGS. 28-54. In some embodiments, bracket 54' can comprise hinged coupler 197 positioned on first jaw member 70' or second jaw member 72'. In some embodiments, bracket 54' can comprise two hinged couplers 197, with a first hinged coupler 197 positioned on first jaw member 70' and a second hinged coupler 197' positioned on second jaw member 72'.

Figure 57:
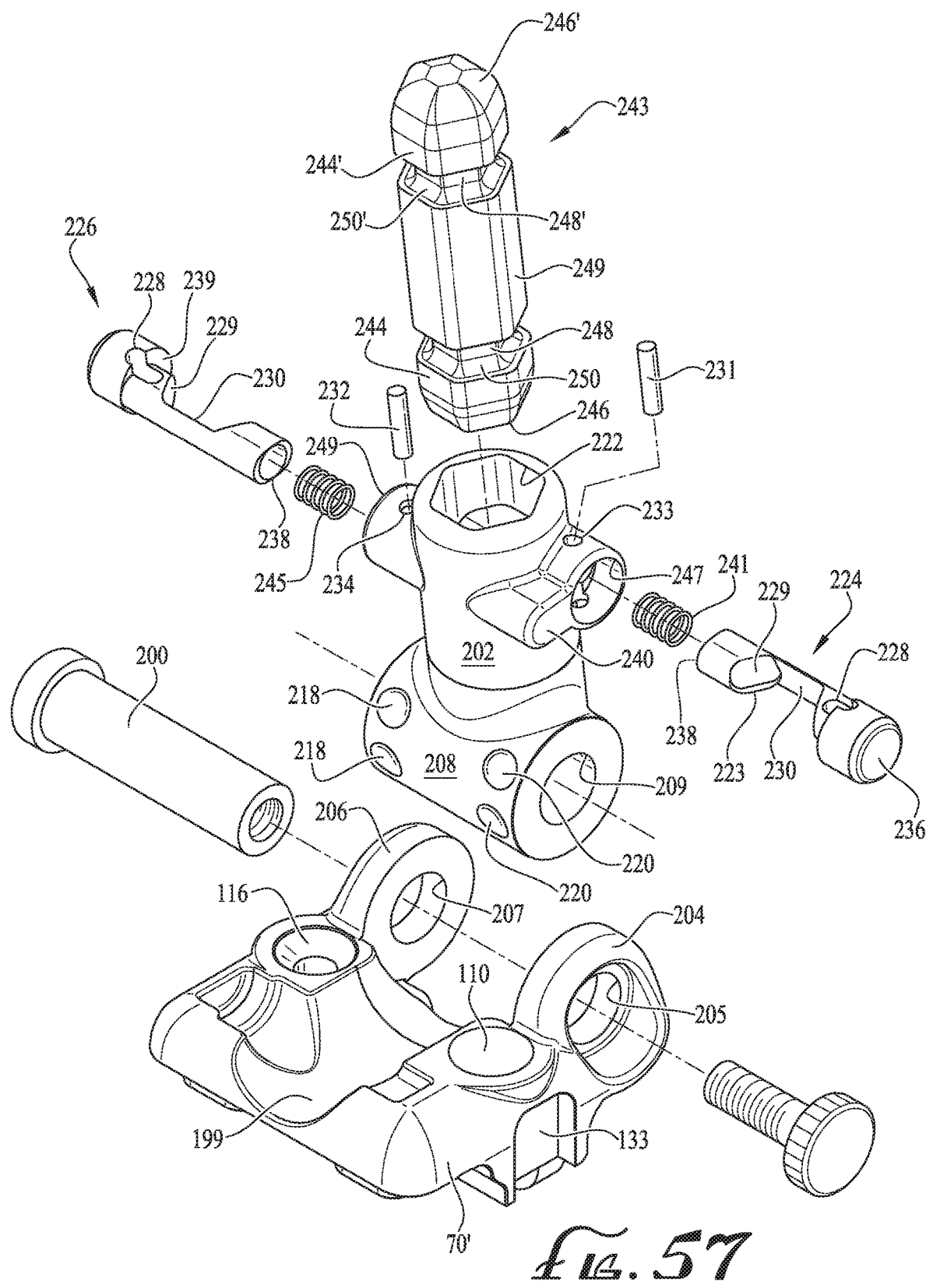
FIG. 57 is an exploded front top perspective view of the hinged coupler of FIG. 55.
Figure 58:
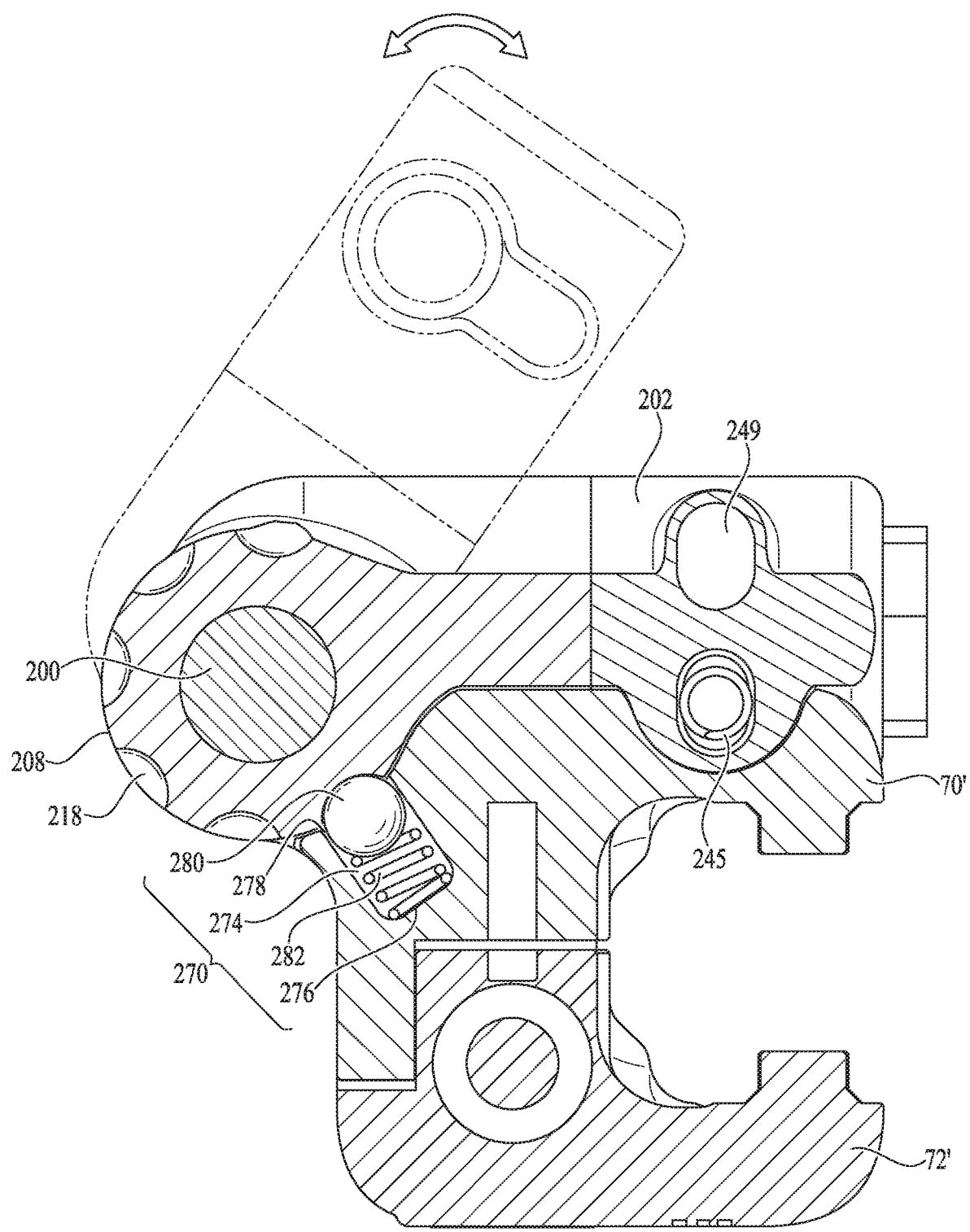
FIG. 58 is a cross-sectional side plan view of the hinged coupler of FIG. 55, taken at 58-58, showing detent assembly.

As best shown in FIGS. 55-57, hinged coupler 197 comprises a coupler base 199 and a latching socket 202. Coupler base 199 includes a first outer knuckle 204, a second outer knuckle 206, and a hinge pin 200. As discussed below, first outer knuckle 204, second outer knuckle 206, and hinge pin 200 are used to rotatably connect latching socket 202 to hinged coupler 197. In some embodiments, coupler base 199 of hinged coupler 197 is integrally formed on first and/or second jaw members 70', 72' as a single component by any known mechanism or process, such as, e.g., by being molded, cast, machined, etc. In some embodiments, coupler base 199 of hinged coupler 197 is a separate component that is attached to first and/or second jaw members 70', 72' by any known mechanism or process, such as, e.g., by being welded, brazed, adhered, screwed, or other appropriate fastening means). In some embodiments, and as illustrated in FIGS. 55 & 58, a surface of coupler base 199 is contoured to the shape of hinged coupler 197 to provide a fitted seat of hinged coupler 197 when in close proximity to coupler base 199.

Referring to FIG. 57, latching socket 202 includes a socket body 203 including a cylindrical drum portion 212, an inner knuckle 208 including a cylindrical sleeve portion 210, a first latching pin 224, a second latching pin 226, a first latching spring 241, a first latching spring 245, and a coupler 243. Inner knuckle 208 of latching socket 202 rotatably connects to coupler base 199 through hinge pin 200 passing through a hole 205 of first outer knuckle 204, a hole 207 of second outer knuckle 206, and a hole 209 of inner knuckle 208. In some embodiments, hinge pin 200 is a single piece. In some embodiments, and as shown in FIG. 57, hinge pin 200 is a two-part piece that screws together in order to properly attach inner knuckle 208 coupler base 199.

Hinge pin 200 permits inner knuckle 208 to rotate about coupler base 199. In some embodiments, the range of angular rotation of latching socket 202 about coupler base 199 in about 90 degrees to about 270 degrees. In some embodiments, the range of angular rotation of latching socket 202 about coupler base 199 in about 135 degrees to about 270 degrees. In some embodiments, the range of angular rotation of latching socket 202 about coupler base 199 in about 135 degrees to about 225 degrees. In some embodiments, the range of angular rotation of latching socket 202 about coupler base 199 in about 180 degrees to about 225 degrees. In some embodiments, the range of angular rotation of latching socket 202 about coupler base 199 in about 90 degrees to about 180 degrees. In some embodiments, the range of angular rotation of latching socket 202 about coupler base 199 in about 180 degrees to about 225 degrees. In some embodiments, the range of angular rotation of latching socket 202 about coupler base 199 in about 135 degrees to about 180 degrees.

Inner knuckle 208 of hinged coupler 197 can be rotated relative to coupler base 199 in a controlled and temporarily fixed position, such as, e.g., a locking mechanism, a friction hinge, or other appropriate means to control or catch the rotation of Inner knuckle 208. In some embodiment, hinged coupler 197 comprises a detent mechanism to controllably rotate and temporarily fix the rotation of inner knuckle 208 relative to coupler base 199. In some embodiments, detent mechanism includes one or more detent plungers or equivalent mounted to coupler base 199 and one or more detents (hemispherical depressions formed as concavities) positioned on inner knuckle 208. In some embodiments, as discussed above, detent plunger includes a detent ball captured in a cylinder and spring loaded to bias the detent ball toward the open end of the cylinder.

An exemplary embodiment of a detent mechanism to controllably rotate and temporarily fix the rotation of inner knuckle 208 relative to coupler base 199 is shown in FIGS. 57 & 58. As shown in FIG. 57, inner knuckle 208 includes two parallel rows of detents 218, 220 positioned about at least a portion of the circumference of the cylindrical surface of inner knuckle 208. In some embodiments, two parallel rows of detents 218, 220 are annularly spaced apart and aligned. In some embodiments, each of two parallel rows of detents 218, 220 comprise 1 to 20 detents, such as, e.g., 4 to 12 detents, 6 to 12 detents, 8 to 12 detents, 4 to 16 detents, 6 to 16 detents, 8 to 16 detents, 10 to 16 detents, 12 to 16 detents, 4 to 20 detents, 6 to 20 detents, 8 to 20 detents, 10 to 20 detents, 12 to 20 detents, or 16 to 20 detents. In some embodiments, as shown in FIG. 57, detents 218, 220 are the same or similar size. In some embodiments, as shown in FIGS. 62 & 63 detents 218, 220 can be of two or more different sizes.

In some embodiments, coupler base 199 comprises a first detent plunger 270 and a second detent plunger 270'. Referring to FIG. 58, each of detent plungers 270, 270' comprises a detent cylinder 274 including an open end 278 and a closed end 276 opposite open end 278 and a detent ball 280 and a detent compression spring 282. Detent ball 280 and detent compression spring 282 are captured in detent cylinder 274, with detent compression spring 282 loaded to outwardly bias detent ball 280 toward open end 278 of detent cylinder 276 in a manner that causes detent ball 280 to protrude from open end 278 of detent cylinder 276. First and second detent plungers 270, 270' are positioned inside of first and second outer knuckles 204, 206 respectively and in a manner where the outwardly biasing first and second detent balls 280 are directed toward and in contact with inner knuckle 208, with first detent ball 280 in alignment with parallel row of detents 218 in a manner where detent ball 280 is seated in one detent of row of detents 218, and second detent ball 280 in alignment with parallel row of detents 220 in a manner where detent ball 280 is seated in one detent of row of detents 220.

A detent mechanism disclosed herein enables the radial or angular position of inner knuckle 208 relative to coupler base 199 to be incrementally controlled and arrested at any one of the detents in the series, acting as incremental catches. Rotation or angular positions are controlled by the spacing of detents 218, 220. In addition, factors such as spring constant of detent compression spring 282 and the depth of detents 218, 220 control the degree of force required to change the position of inner knuckle 208.

Examples of some of the rotation or angular positions possible with latching socket 202 relative to coupler base 199 using a detent mechanism disclosed herein are illustrated in FIGS. 59-61. In FIG. 59, latching socket 202 is adjusted to a first angular position approximately corresponding to 9 o'clock. In FIG. 60, latching socket 202 is adjusted to a second angular position approximately corresponding to 2 o'clock. In FIG. 61, latching socket 202 is adjusted to a third angular position approximately corresponding to 10 o'clock. Of course other angular positions are possible. For example, in the illustrated example embodiment, the range of angular rotation is between 9 o'clock and 6 o'clock (e.g., 270 degrees) with one or more catch points to temporarily arrest the motion of the latching socket 202 relative to coupler base 199.

In addition to rotation of inner knuckle 208 relative to coupler base 199, inner knuckle 208 of hinged coupler 197 can also be rotated relative to latching socket 202. In some embodiments, inner knuckle 208 of hinged coupler 197 can be rotated relative to latching socket 202 in a controlled and temporarily fixed position, such as, e.g., a locking mechanism, a friction hinge, or other appropriate means to control or catch the rotation of latching socket 202. In some embodiment, and similar to the detent mechanism described above, hinged coupler 197 comprises a detent mechanism to controllably rotate and temporarily fix the rotation of latching socket 202 relative to inner knuckle 208. In preferred embodiments, complete or 360 degrees of rotation is enabled.

An exemplary embodiment of a detent mechanism used to controllably rotate and temporarily fix the rotation of latching socket 202 relative to inner knuckle 208 is shown in FIGS. 62 & 63. As shown in FIGS. 62 & 63, inner knuckle 208 comprises a barrel portion 207 and a cylindrical sleeve portion 210 which extends perpendicularly from barrel portion 207. Cylindrical sleeve portion 210 comprises a bottom which includes a centrally located threaded hole 214 and one or more detent cylinders positioned around the threaded hole, the one or more detent cylinders used to assembly one or more detent plungers. Latching socket 202 contains a through hole 216 configured to receive therethrough a screw 217 and a bottom surface of cylindrical drum portion 212 includes ring of detents 218 positioned about at least a portion of the circumference of cylindrical drum portion 212. In assembly, cylindrical sleeve 210 of inner knuckle 208 is configured to receive a cylindrical drum portion 212 of latching socket 202 and screw 214 is inserted past through hole 216 of latching socket 202 and secured into threaded hole 214 of inner knuckle 208. In some embodiments, ring of detents 218 comprise 1 to 12 detents, such as, e.g., 1 to 2 detents, 1 to 4 detents, 2 to 6 detents, 4 to 6 detents, 2 to 8 detents, 4 to 8 detents, 6 to 8 detents, 2 to 10 detents, 4 to 10 detents, 6 to 10 detents, 8 to 10, detents, 2 to 12 detents, 4 to 12 detents, 6 to 12 detents, 8 to 12 detents, or 10 to 12 detents. In some embodiments, as shown in FIG. 60, detents 218 are the same or similar size. In some embodiments, ring of detents 218 can be of two or more different sizes.

In some embodiment, four detent plungers 270, 270', 270", 270''' are located at a bottom portion of cylindrical sleeve 210. Referring to FIGS. 62 & 63, each of detent plungers 270, 270', 270", 270''' comprises a detent cylinder 274 including an open end 278 and a closed end 276 opposite open end 278 and a detent ball 280 and a detent compression spring 282. Detent ball 280 and detent compression spring 282 are captured in detent cylinder 274, with detent compression spring 282 loaded to outwardly bias detent ball 280 toward open end 278 of detent cylinder 276 in a manner that causes detent ball 280 to protrude from open end 278 of detent cylinder 276. Detent plungers 270, 270', 270", 270''' are positioned in a manner where the outwardly biasing detent balls 280 are directed toward and in contact with latching socket 202, with each detent ball 280 in alignment with ring of detents 218 in a manner where each of detent balls 280 is seated in one detent of ring of detents 218 of latching socket 202.

A detent mechanism disclosed herein enables the rotational position of latching socket 202 relative to inner knuckle 208 to be incrementally controlled and arrested at any one of the detents in the series, acting as incremental catches. Rotation or angular positions are controlled by the spacing of detents of ring of detents 218. In addition, factors such as spring constant of detent compression spring 282 and the depth of detents 218 control the degree of force required to change the position latching socket 202.

As shown in FIG. 57, distal end of latching socket 202 includes a socket 222 configured to receive an arm or other coupler therewithin. In this example embodiment, socket 222 is a hexagonal-shaped socket for receiving a hexagonal head 244 of a coupler 243, which prevents rotation between socket 222 and coupler 243. However, other socket shapes are compatible with latching socket 202, including circular, elliptical, polygonal, unique shapes, and other shapes which may allow or restrict rotation of the coupler. As shown in FIG. 57, on each inner side or at least one inner side of socket 222, parallel latching pin bores 247, 249 hold corresponding latching pins 224, 226 in place. As shown in FIG. 57, latching pins 224, 226 each include a first end 236, a second end 238 opposite first end 238. Second end 238 of latching pins 224, 226 includes a blind hole to form a spring cup (see hole at second end 238 of latching pin 226). One end of compression spring 241, 245 are seated in the spring cups of latching pins 224, 226 respectively. The diameter or circumference of the spring cup of latching pins 224, 226 is smaller than the diameter or circumference of latching pins 224, 226 and configured to house compression spring 241, 245. Latching pins 224, 226 can also include a shoulder 239 formed near and spaced apart from first end 236. In some embodiments, shoulder 239 is oblong or oval in cross-section shape and serves to prevent rotation of latching pins 224, 226 within a similarly oblong or oval in cross-section shape of latching pin bores 247, 249. Latching pins 224, 226 can also include a limiter slot 228 near first end 238 formed longitudinally through shoulder 239.

Figure 68:
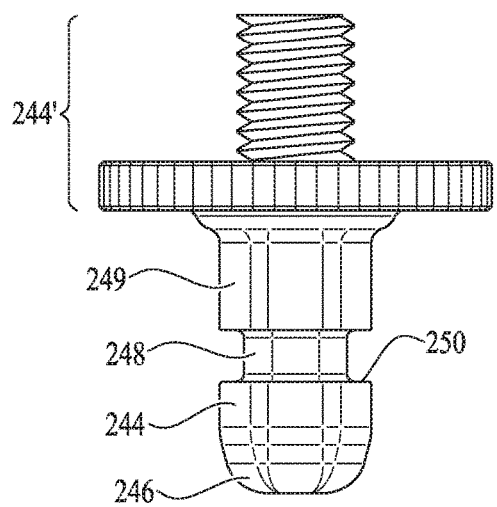
FIG. 68 is a front plan view of a coupler disclosed herein.

As shown in FIG. 57, latching pins 224, 226 can also include a keyway cutout 230 a notch formed longitudinally through and parallel with the length of the body of latching pins 224, 226. Each of latching pins 224, 226 include the same or similar keyway cutout 230 shape. In addition, the shape of keyway cutout 230 is configured to be the same or substantially similar to a portion of the perimeter or circumrenal shape of socket 222 and/or coupler 243. For instance, in the illustrated example of FIG. 57, socket 222 and/or coupler 243 are hexagonal in shape and keyway cutout 230 of latching pins 224, 226 each have a shape that is the same of substantially the same to one-half of a hexagon, i.e., three sides of a hexagon. In addition, each of keyway cutout 230 of latching pins 224, 226 is configured to be arranged opposite to one another, so that latching pins 224, 226 can be moved within their respective latching pin bores 247, 249 so that each keyway cutout 230 aligns with the interior wall of socket 222 so that socket 222 is unobstructed by any portion of latching pins 224, 226 (as shown in FIG. 68). In this way, latching pins 224, 226 do not protrude (or minimally protrude) into socket 22, such that coupler 243 can be fully inserted or removed from socket 222 without substantial mechanical interference.

Figure 64:
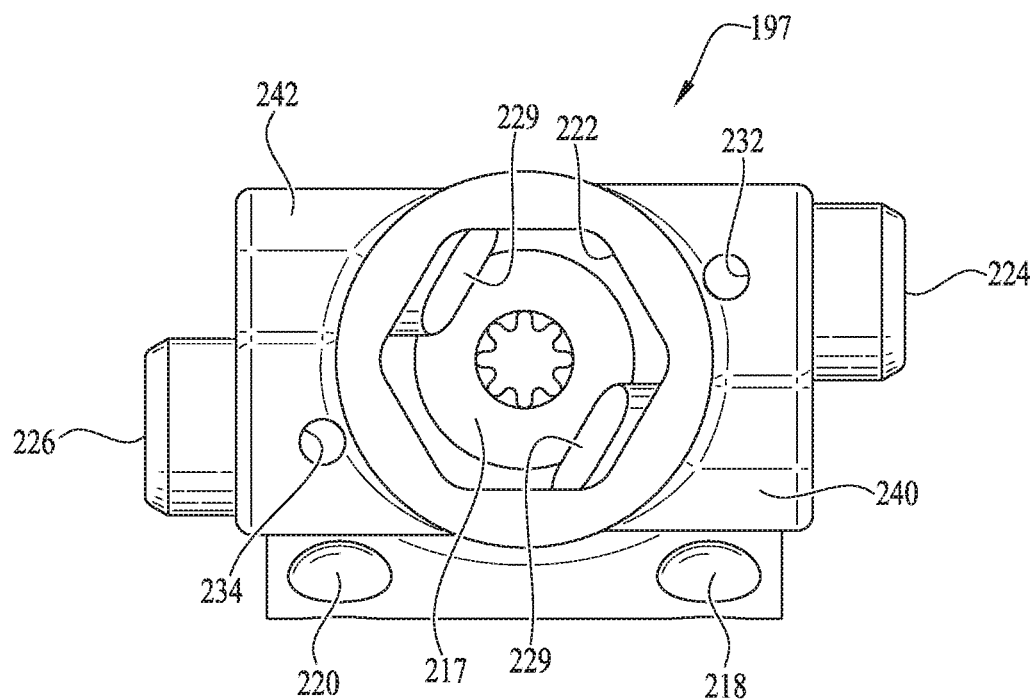
FIG. 64 is a top plan view of the socket of the hinged coupler of FIG. 55, showing latching pins in a locked position.
Figure 65:
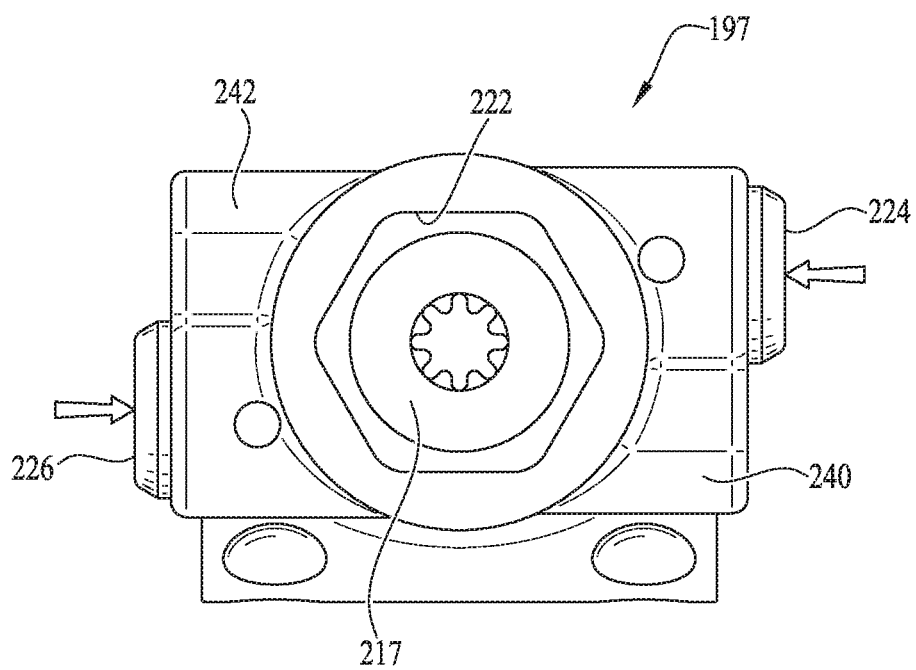
FIG. 65 is a top plan view of the socket of the hinged coupler of FIG. 55, showing latching pins in an unlocked position.

Referring to FIGS. 57, 64, 65, second end 238 of latching pin 224 extends toward a spring cylinder 242 while second end 238 of latching pin 226 extends toward a spring cylinder 240. Each of spring cylinders 240, 242 includes a blind hole located internally at the back end of latching pin bores 247, 249 to form a spring cup (not shown). One end of compression spring 241, 245 are seated within the spring cups at the back end of latching pin bores 247, 249 respectively. The diameter or circumference of the spring cup is generally smaller than the diameter or circumference of latching pin bores 247, 249 and is configured to house compression spring 241, 245. Thus, when hinged coupler 197 assembled, one end of compression spring 241, 245 are seated within the spring cups at the back end of latching pin bores 247, 249 respectively while the opposite end of compression spring 241, 245 are seated in the spring cups of latching pins 224, 226 respectively. In this configuration, spring cylinder 240 holds a compression spring 245 of latching pin 226 in a manner that compression spring 245 bias latching pin 224 outward from spring cylinder 240. Similarly, spring cylinder 242 holds a compression spring 241 of latching pin 224 in a manner that compression spring 241 bias latching pin 226 outward from spring cylinder 242.

Referring to FIG. 57, spring bias of compression spring 245 is limited by a pin 232 (which can be threaded) held within a pin hole 234 of spring cylinder 242. Pin 232 extends perpendicularly through the housing of spring cylinder 242, into latching pin bore 249 and in close proximity or in contact with limiter slot 228 of latching pin 226, such that as latching pin 226 move within latching pin bore 249, latching pin 226 movement is limited by the distance defined by limiter slot 228. Similarly, spring bias of compression spring 241 is limited by a pin 231 (which can be threaded) held within a pin hole 233 of spring cylinder 240. Pin 231 extends perpendicularly through the housing of spring cylinder 240, into latching pin bore 247 and in close proximity or in contact with limiter slot 228 of latching pin 224, such that as latching pin 224 move within latching pin bore 247, latching pin 224 movement is limited by the distance defined by limiter slot 228.

Referring to FIG. 57, coupler 243 comprises a body 249, one or more circumferential grooves 248, and one or more heads 244, each including a leading edge 246 and a shoulder 250. Coupler 243 can be of any length with most of this length variation due to the length of body 249. In preferred embodiments, and as illustrated in FIG. 57, coupler 243 comprises a centrally located body 249 with a first end and a second end, where a first head 244 located at the first end of body 249, a second head 244 located at the second end of body 249, and where a first circumferential groove 248 is located in between the first end of body 249 and first head 244 and a second circumferential groove 248' is located in between the second end of body 249 and second head 244'.

Although body 249 of coupler 243 is illustrated as a linear component with first and second ends, body 249 can furcate into two or more branches, where a terminus of each branch includes head 244', each configured for selectively receiving an accessory. In some embodiments, coupler 243 is comprised of three bodies 249 each having a terminus and arranged, e.g., in a T-shaped or Y-shaped configuration, with head 244' located at each terminus. In some embodiments, coupler 243 is comprised of four bodies 249 each having a terminus and arranged, e.g., in a x-shaped or cross-shaped configuration, with head 244' located at each terminus. In some embodiments, coupler 243 is comprised of five bodies 249 each having a terminus and arranged, e.g., in a star-shaped configuration, with head 244' located at each terminus.

The perimeter or circumferential shape of at least one or more heads 244 is configured to conform or substantially conform to the perimeter or circumferential shape of socket 222, although as shown in FIG. 57 the perimeter or circumferential shape of all or substantially all of coupler 243 conform to the perimeter or circumferential shape of socket 222. As shown in example embodiment of FIG. 57, first and second heads 244, 244' each have a perimeter or circumferential shape that is hexagonal and conform or substantially conform to the perimeter or circumferential shape of socket 222. Similarly, perimeter or circumferential shape of body 249 of coupler 243 is hexagonal and conforms or substantially conforms to the perimeter or circumferential shape of socket 222. However, as with socket 222, the perimeter or circumferential shape of heads 244 as well as the perimeter or circumferential shape of all or substantially all of coupler 243 can be any shape, including circular, elliptical, polygonal, unique shapes, and other shapes so long as that shape conforms or substantially conforms to the perimeter or circumferential shape of socket 222.

Figure 66:
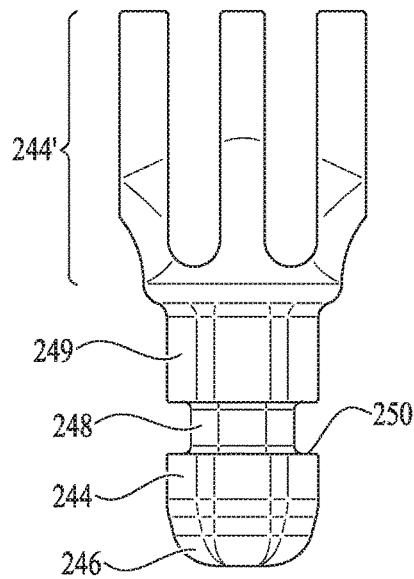
FIG. 66 is a front plan view of a coupler disclosed herein.
Figure 67:
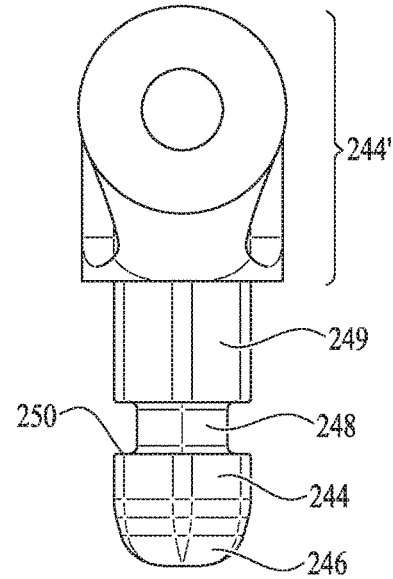
FIG. 67 is a side plan view of the coupler of FIG. 66.
Figure 69:
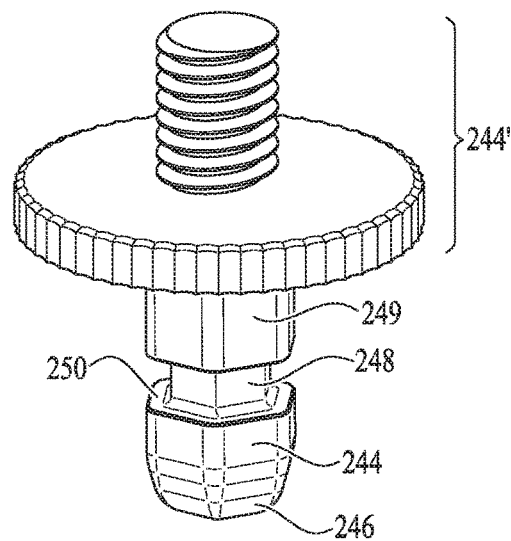
FIG. 69 is a front top perspective view of the coupler of FIG. 68.

As illustrated in FIGS. 66-71, while at least one or more heads 244 is configured to conform or substantially conform to the perimeter or circumferential shape of socket 222, one or more other heads can be configured to receive alternative sockets or adaptors. In some embodiments, and as illustrated in FIGS. 66 & 67, while head 244 is configured to conform or substantially conform to the perimeter or circumferential shape of socket 222, head 244' is configured as an adaptor A1, in this case, a Go-Pro adaptor. In some embodiments, and as illustrated in FIGS. 68 & 69, while head 244 is configured to conform or substantially conform to the perimeter or circumferential shape of socket 222, head 244' is configured as an adaptor A2, in this case, a screw adaptor.

In some embodiments, and as illustrated in FIGS. 70 & 71, while head 244 is configured to conform or substantially conform to the perimeter or circumferential shape of socket 222, head 244' is configured as an adaptor A3. As shown in FIGS. 70 & 71, adaptor A3 comprises inner knuckle 208 comprises a barrel portion 207 with a first end and a second end and a coupler 243 which extends perpendicularly from barrel portion 207. Device holder 308 extends from the first end of barrel portion 207 of inner knuckle 208 while device holder 310 extends from the second end of barrel portion 207 of inner knuckle 208. Inner knuckle 208 of adaptor A3 can be rotated about coupler base 199 relative to coupler base 199 in a controlled and temporarily fixed position as disclosed herein using, e.g., a detent mechanism as disclosed herein. In some embodiments, device holders 308 is configured to receive and secure ground positioning system (GPS) device D1, and device holders 310 is configured to receive and secure compass D2 and flashlight D3.

Referring to FIGS. 57, 64 & 65, in operation, latching pins 224, 226 are each normally biased to push latching pin 226 into socket 222, where edge 229 and locking edge 223 of each of latching pins 224, 226, are located within socket 222, in a misaligned configuration (as shown in FIG. 64). Radiused leading edge 246 (or beveled or otherwise configured obliquely) of coupler 243 is configured to obliquely contact beveled edge 229 (or radiused or otherwise configured obliquely) of latching pins 224, 226 as radiused leading edge 246 is inserted into socket 222. Insertion of radiused leading edge 246 pushes each of latching pins 224, 226 laterally outward through latching pin bores 247, 249 so that radiused leading edge 246 is pushed past latching pins 224, 226. When circumferential groove 248 of coupler 243 aligns with latching pins 224, 226, circumferential groove 248 provides clearance for latching pins 224, 226 to immediately move inward through their respective latching pin bores 247, 249 back into the misaligned configuration, where locking edge 223 of each of latching pins 224, 226 is positioned within circumferential groove 248 and over shoulder 250 of coupler 243. Because shoulder 250 and locking edge 223 have faces substantially parallel to one another, locking edge 223 prevents inadvertent withdrawal of coupler 243 due to locking edge 223 providing mechanical interference by contacting shoulder 250.

Coupler 243 is firmly held within socket 222 by latching pins 224, 226. In order to remove coupler 243, a user simultaneously presses on first ends 236, 237 of latching pins 224, 226, pushing inwardly and toward socket 222, as indicated by arrows 254 and 252 of FIG. 65; for example, by pinching with a forefinger and thumb. This positions latching pins 224, 226 back into the aligned configuration, where locking edge 223 is withdrawn from circumferential groove 248 and no longer remains in contact shoulder 250, allowing coupler 243 to be freely removed from socket 222.

Coupler 243 selectively forms a connection between bracket 54' and another component, e.g., an accessory for a device, another device, or an adaptor or connector for another component. In particular, head 244 of coupler 243 inserts within socket 222 (as shown ready to occur in FIG. 57), with head 244' at the opposite end ready to receive a component having a socket like socket 222. This entire assembly can also be mounted to rail 52 through bracket 54'. A component includes, without limitation, a device, a flashlight, LED lights, armor back plates, knives, pepper spray, alarms, magnetic mounts, grip attachments permitting remote or local control of a device, any device-mounted accessory, sirens, tethers, lanyards, locks, mounts, suction cups, straps, timepieces, writing instruments, weapons, batteries, an attachment to motor vehicles or bicycles or aircraft, stationary or mobile object with claims, anything that attaches to a screw thread, and so on, or other mechanical or electronic component. Examples of screw threads include ¼-20 UNC thread, a ⅜-16 UNC thread, or any other similar screw thread standards known in the art.

Although latching socket 202 and hinged coupler 197 are shown in the illustrated embodiments as being connected or integral with one another and with bracket 54', each is useful in themselves and/or in connection with other devices, known or unknown. For example, hinged coupler 197 can be used is a variety of applications where one component is required to be rotated relative to a second component connected through hinged coupler 197. In a further example, latching socket 202 can be used separately (e.g., without necessarily being permanently attached to another component) to temporarily attach to a second component.

Aspects of the present specification can be described as follows:

1. A bracket comprising a) a first jaw member, the first jaw member comprising an inner surface including a first mating portion and a first clamping portion, the first clamping portion including one or more engagement bosses, b) a second jaw member, the second jaw member comprising an inner surface including a second mating portion and a second clamping portion, the second clamping portion including one or more engagement bosses, c) a pin assembly comprising a latching pin including a latch bolt hole and a guide pin, the latching pin and the guide pin being perpendicular to the first and second clamping portions of the first and second jaw members, and d) a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, and wherein the bracket can adopt an open configuration and a closed configuration.
2. The bracket of embodiment 1, wherein the latching pin is secured to the first jaw member and slidably insertable through a latching pin bore present on second jaw member,
3. The bracket of embodiment 1 or 2, wherein the guide pin is secured to the second jaw member and slidably insertable through a guide pin bore present on first jaw member.
4. The bracket of any one of embodiments 1-3, wherein the latch bolt assembly is located in a direction perpendicular to the second clamping portion of the second jaw member.
5. The bracket of any one of embodiments 1-4, further comprising one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.
6. The bracket of any one of embodiments 1-5, wherein the latch bolt further comprises latch bolt spring that provides a separating bias that forces the latch bolt in a direction outward of latch bolt bore.
7. The bracket of any one of embodiments 1-6, wherein the latch bolt further comprises an elongated channel perpendicular to the longitudinal axis of the latch bolt, the elongated channel forming an enclosure to house the latch bolt spring.
8. The bracket of any one of embodiments 1-7, wherein the elongated channel further comprises a limiter slot.
9. The bracket of any one of embodiments 1-8, wherein the latch bolt further comprises a latch bolt pin protruding axially from the second end of the latch bolt, the latch bolt pin being cylindrical in shape and of smaller diameter than the cylindrical body of the latch bolt.
10. The bracket of any one of embodiments 1-9, wherein the latch bolt further comprises a rotating tab attached to the first end of the latch bolt.
11. The bracket of any one of embodiments 1-10, wherein when in the closed configuration, first and second jaw members are in close proximity to one another and the latch bolt is inserted in latch bolt hole of the latching pin.
12. The bracket of any one of embodiments 1-11, wherein when in the open configuration, first and second jaw members are apart from one another and the latch bolt is removed from latch bolt hole of the latching pin.
13. The bracket of any one of embodiments 1-12, wherein the one or more engagement bosses of the first clamping portions are two engagement bosses.
14. The bracket of any one of embodiments 1-13, wherein the one or more engagement bosses of the second clamping portion are two engagement bosses.
15. The bracket of any one of embodiments 1-14, further comprising a back plate and a back-plate recess, the back plate is cantilevered from the first jaw member and the back-plate recess is formed on the second jaw member.
16. The bracket of embodiment 15, wherein the back plate further comprises an attachment point and one or more indexing holes.
17. A device case comprising a) a first frame member, the first frame member including a first engagement surface comprising one or more engagement slots and a plurality of through holes, b) a second frame member, the second frame member including a second engagement surface comprising one or more engagement slots and a plurality of through holes, c) a sidewall frame member, the sidewall frame member including a third engagement surface, and d) a gasket, the gasket being composed of an elastomeric material and shaped to configure to at least fit around an outer perimeter of a device and align in close proximity with an inside surface of the sidewall frame member, wherein the sidewall frame member is sandwiched between and spaces apart the first frame member and the second frame member, and in a manner that forming an interior space for a device to fit therein and aligns each through hole of the plurality of through holes from the first frame member with each through hole of the plurality of through holes from the second frame member to form a plurality of paired through holes, wherein the first frame member and the second frame member compressively bear down on the sidewall frame member by securing the first frame member to the second frame member using a plurality of screws, each screw of the plurality of screws inserted through a paired through hole of the plurality of paired through holes from the first and second frame member, and wherein the device case forms a water-tight seal preventing moisture from entering the interior space.
18. The device case of embodiment 17, further comprising a plurality of inserts, each insert of plurality of inserts aligned with each paired through hole of the plurality of paired through holes from the first and second frame member.
19. The device case of embodiment 17 or 18, wherein a front inner perimeter the sidewall frame member includes a front ridge and a back inner perimeter the sidewall frame member includes a back ridge, the front ridge being inserted within a slot of first frame member and the back ridge being inserted within a slot of second frame member.
20. The device case of any one of embodiments 17-19, wherein the sidewall frame member further comprises an attachment point and one or more indexing holes.
21. The device case of any one of embodiments 17-20, wherein the gasket comprises one or more contacts protrusions, the one or more contacts protrusion located in the vicinity of one or more buttons present of the device to be encased.
22. The device case of any one of embodiments 17-21, wherein the gasket comprises one or more thin portions that are water-tight and located in the vicinity of one or more speaker or microphone ports present of the device to be encased.
23. The device case of any one of embodiments 17-22, further comprising a sealing plate, the sealing plate comprising one or more through ports.
24. The device case of embodiment 23, wherein a portion of the sidewall frame member is configured to receive the sealing plate.
25. The device case of embodiment 24, wherein a portion of the first frame member, the second frame member, or both the first and second frame members is configured to receive the sealing plate.
26. The device case of embodiment 23, wherein at least one of the one or more through ports include a sealing cap, the sealing cap comprising an O-ring.
27. The device case of embodiment 23, wherein at least one of the one or more through ports is located in the vicinity of one or more audio or power jacks present of the device to be encased.
28. The device case of any one of embodiments 17-27, further comprising one or more button inserts, the one or more button inserts being secured by the sidewall frame member.
29. An adaptor comprising a) an indexing plate, the indexing plate being disc-shaped and including a top surface, a bottom surface and a through hole centrally located in the indexing plate, the top surface of the indexing plate including a circular ring of detents positioned around the through hole, and the bottom surface of the indexing plate including one or more indexing pins extending perpendicularly from the bottom surface, b) an adaptor plate, the adaptor plate being disc-shaped and including a top surface, a bottom surface, the adaptor plate housing one or more detent plungers, the top surface of the adaptor plate including a coupler extending perpendicularly from the top surface, and the bottom surface of the adaptor plate including a threaded screw extending perpendicularly from the bottom surface, wherein each of the one or more detent plungers comprising a detent cylinder with an open end and an open threaded end opposite the open end and a detent ball and a detent compression spring, and wherein the detent ball and the detent compression spring captured within the detent cylinder by a set screw secured to open threaded end, the detent compression spring outwardly biasing detent ball toward the open end of the detent cylinder in a manner that causes the detent ball to protrude from the open end of the detent cylinder, and c) a retaining clip, the retaining clip securing the indexing plate to the adaptor plate, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the adaptor plate is selectively controlled when a detent from the from the ring of detents is selectively brought into alignment with the detent ball of each of the one or more detent plungers by relative rotation between the adaptor plate and the indexing plate.
30. A rail comprising a rail body, the rail body comprising a) a first engagement surface comprising one or more engagement slots, b) a second engagement surface comprising one or more engagement slots, c) a third surface, wherein the first engagement surface is adjacent the third surface, the second engagement surface is adjacent the third surface and the second engagement surface is parallel, spaced apart and facing oppositely the first engagement surface, with the third surface spanning between the first engagement surface and the second engagement surface.
31. The rail of embodiment 30, wherein the third engagement surface further comprises a plurality of through holes.
32. The rail of embodiment 30 or 31, further comprising a base support.
33. The rail of embodiment 32, wherein the base support comprises an adhesive layer on the side that will come in contact with a support.
34. The rail of embodiment 32, wherein the base support comprises one or more tabs configured for inserted into one or more pockets or pouches on a base support mount.
35. A mounting system comprising a) a bracket of any one of embodiments 1-16, and b) a rail of any one of embodiments 30-34, wherein the one or more engagement slots of the first engagement surface of the rail body are configured to receive the one or more engagement bosses of the first jaw member of the bracket and the one or more engagement slots of the second engagement surface of the rail body are configured to receive the one or more engagement bosses of the second jaw member of the bracket.
36. A mounting system comprising a) a bracket of any one of embodiments 1-16, and b) a rail, the rail comprising a rail body, the rail body comprising i) a first engagement surface comprising one or more engagement slots, ii) a second engagement surface comprising one or more engagement slots, and iii) a third surface, wherein the first engagement surface is adjacent the third surface, the second engagement surface is adjacent the third surface and the second engagement surface is parallel, spaced apart and facing oppositely the first engagement surface, with the third surface spanning between the first engagement surface and the second engagement surface, and wherein the one or more engagement slots of the first engagement surface of the rail body are configured to receive the one or more engagement bosses of the first jaw member of the bracket and the one or more engagement slots of the second engagement surface of the rail body are configured to receive the one or more engagement bosses of the second jaw member of the bracket.
37. The rail of embodiment 36, wherein the third engagement surface further comprises a plurality of through holes.
38. The rail of embodiment 36 or 37, further comprising a base support.
39. The rail of embodiment 38, wherein the base support comprises an adhesive layer on the side that will come in contact with a support.
40. The rail of embodiment 38, wherein the base support comprises one or more tabs configured for inserted into one or more pockets or pouches on a base support mount.
41. A mounting system comprising a) a device case of any one of embodiments 17-28, the sidewall frame member further comprises an attachment point and one or more indexing holes, and b) a device case adaptor, the device case adaptor comprising an indexing plate and an adaptor plate, the indexing plate including one or more indexing pins configured to align and insert into one or more indexing holes and the adaptor plate including a coupler on a first surface of the adaptor plate and a threaded screw on a second surface of the adaptor plate.

42. A hinged coupler bracket comprising a bracket of any one of embodiments 1-16 and further comprising a hinged coupler.

43. The hinged coupler bracket of embodiment 42, wherein the hinged coupler comprises a coupler base including a first outer knuckle and a second outer knuckle, an inner knuckle and a latching socket including a socket body and a socket formed within the socket body.

44. The hinged coupler bracket of embodiment 42 or 43, wherein the inner knuckle is rotatably coupled to the coupler base by a hinge pin inserted through the first outer knuckle, the inner knuckle and the second outer knuckle.

45. The hinged coupler bracket of any one of embodiments 42-44, wherein the coupler base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the coupler base.

46. The hinged coupler bracket of embodiment 45, wherein the first detent plunger is positioned by the first outer knuckle and oriented radially toward the inner knuckle and the second detent plunger is positioned by the second outer knuckle and oriented radially toward the inner knuckle.

47. The hinged coupler bracket of any one of embodiments 42-46, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.

48. The hinged coupler bracket of any one of embodiments 42-47, wherein the latching socket includes a) a latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore; c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

49. The hinged coupler bracket of embodiment 48, wherein the latching pin bore is formed orthogonally to the socket.

50. The hinged coupler bracket of embodiment 48 or 49, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

51. The hinged coupler bracket of embodiment 50, wherein the latching pin bore and the second latching pin bore are formed orthogonally to the socket, with the latching pin bore and the second latching pin bore axially parallel to one another.

52. The hinged coupler bracket of any one of embodiments 48-51, wherein the locking edge of the keyway is configured to be engaged with the latch engagement portion of the attachment when the attachment is inserted within the socket in the locked configuration.

53. The hinged coupler bracket of any one of embodiments 43-52, wherein the socket is hexagonally shaped.

54. A hinged coupler bracket comprising a) a first jaw member, the first jaw member comprising an inner surface including a first mating portion and a first clamping portion, the first clamping portion including one or more engagement bosses, and an outer surface comprising a hinged coupler, b) a second jaw member, the second jaw member comprising an inner surface including a second mating portion and a second clamping portion, the second clamping portion including one or more engagement bosses, c) a pin assembly comprising a latching pin including a latch bolt hole and a guide pin, the latching pin and the guide pin being perpendicular to the first and second clamping portions of the first and second jaw members, and d) a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, and wherein the bracket can adopt an open configuration and a closed configuration.

55. The hinged coupler bracket of embodiment 54, wherein the hinged coupler comprises a coupler base including a first outer knuckle and a second outer knuckle, an inner knuckle and a latching socket including a socket body and a socket formed within the socket body.

56. The hinged coupler bracket of embodiment 54 or 55, wherein the inner knuckle is rotatably coupled to the coupler base by a hinge pin inserted through the first outer knuckle, the inner knuckle and the second outer knuckle.

57. The hinged coupler bracket of any one of embodiments 54-56, wherein the coupler base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the coupler base.

58. The hinged coupler bracket of embodiment 57, wherein the first detent plunger is positioned by the first outer knuckle and oriented radially toward the inner knuckle and the second detent plunger is positioned by the second outer knuckle and oriented radially toward the inner knuckle.

59. The hinged coupler bracket of any one of embodiments 54-58, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.

60. The hinged coupler bracket of any one of embodiments 54-59, wherein the latching socket includes a) a latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore, c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

61. The hinged coupler bracket of embodiment 60, wherein the latching pin bore is formed orthogonally to the socket.

62. The hinged coupler bracket of embodiment 60 or 61, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

63. The hinged coupler bracket of embodiment 62, wherein the latching pin bore and the second latching pin bore are formed orthogonally to the socket, with the latching pin bore and the second latching pin bore axially parallel to one another.

64. hinged coupler bracket of any one of embodiments 60-63, wherein the locking edge of the keyway is configured to be engaged with the latch engagement portion of the attachment when the attachment is inserted within the socket in the locked configuration.
65. The hinged coupler bracket of any one of embodiments 55-64, wherein the socket is hexagonally shaped.
66. A hinged joint comprising: an inner knuckle rotatably coupled to an outer knuckle by a hinge pin passing through the inner knuckle and the outer knuckle; a detent mechanism that checks the relative motion about the hinge pin between the inner knuckle and the outer knuckle, the detent mechanism includes a detent plunger configured to engage a detent, wherein an angular position of the inner knuckle is selectively held when the detent plunger is engaged within the detent.
67. The hinged joint of embodiment 66 wherein the detent plunger is positioned on an outer knuckle body and oriented radially toward the inner knuckle, the detent is positioned on the inner knuckle and is selectively brought into alignment with the detent plunger by relative rotation between the inner knuckle and the outer knuckle.
68. The hinged joint of embodiment 66 or 67, wherein the detent is a plurality of depressions formed about the inner knuckle.
69. A bracket comprising: a first jaw member; a second jaw member slidably translatable parallel to a first direction, the second jaw member sliding relative to the first jaw member, a latching pin bore formed in the second jaw member arranged parallel to the first direction, a latch bolt bore being formed in the second jaw member arranged parallel to a second direction and perpendicular to the first direction, the latch bolt bore intersecting the latching guide pin bore; a latching pin extending from the first jaw member arranged parallel to the first direction and slidably inserted within the latching pin bore to guide travel of the second jaw member relative to the first jaw member in the first direction, a bolt channel being formed lengthwise on the latching pin, a bolt hole being formed within the bolt channel and being deeper than the bolt channel; and a latch bolt slidably inserted within the latch bolt bore, a terminus of the latch bolt being inserted within the bolt hole in a locked configuration where movement of the second jaw member away from the first jaw member is substantially prevented, the terminus of the latch bolt configured to be positioned out of the bolt hole and within the bolt channel in an unlocked configuration where sliding of the second jaw member away from the first jaw member is permitted, with the terminus riding within the bolt channel as the second jaw member moves away from the first jaw member.
70. The bracket of embodiment 69 further comprising: a guide pin extending from the second jaw member arranged parallel to the first direction and slidably inserted within a guide pin bore formed in the first jaw member arranged parallel to the first direction to guide travel of the first jaw member relative to the second jaw member in the first direction.
71. The bracket of embodiment 69 or 70 further comprising: a jaw expanding spring positioned between the first jaw member and the second jaw member, the jaw expanding spring configured to normally bias the first jaw member and the second jaw member away from one another; wherein, in the unlocked configuration, the first jaw member and the second jaw member are forced to slide away from one another by the jaw expanding spring.
72. The bracket of any one of embodiments 69-71, wherein the bolt channel limits travel of the first jaw member away from the second jaw member due to the terminus of the latch bolt being restricted to travel within the bolt channel.
73. The bracket of any one of embodiments 69-72, wherein the latch bolt comprises a limiter slot is formed lengthwise on the latch bolt, wherein a limiter extends through the limiter slot to limit travel of the latch bolt within the latch bolt bore as the latch bolt travels relative to the limiter.
74. The bracket of embodiment 73, wherein the latch bolt further comprises a body and a bolt axially extending from the body, the terminus distally located on the bolt, a spring channel being formed lengthwise on the body, the limiter slot located within the spring channel.
75. The bracket of embodiment 74, wherein the limiter slot includes a spring seat closest to the bolt, a retraction spring is positioned within the spring channel between the spring seat and the limiter, wherein, as the terminus of the latch bolt is manually forced from the bolt hole, the retraction spring biases the latch bolt back toward the latching guide pin due to the retraction spring being compressed between the spring seat and the limiter.
76. The bracket of embodiment 75, wherein a bolt stop is defined within the bolt channel adjacent to the bolt hole, the terminus of the bolt is configured to pushed against the bolt stop in the unlocked configuration under the bias of the retraction spring.
77. The bracket of embodiment 76, wherein, as the latching guide pin is moved relative to the terminus of the bolt, the terminus of the bolt is configured to ride against the bolt stop during the transition from the unlocked configuration to the locked configuration, wherein, when the bolt hole is brought into alignment with the terminus of the bolt, the retraction spring forces the bolt into the bolt hole to complete the transition to the locked configuration.
78. The bracket of any one of embodiments 69-77, wherein the latch bolt bore is formed completely through the second jaw member, and wherein the latch bolt is configured to extend through the latching guide such that the terminus of the latch bolt protrudes from the second jaw member in the locked configuration.
79. The bracket of embodiment 78, wherein the latch bolt bore comprises a rotating tab on an end of the latch bolt opposite the terminus, the rotating tab configured to rotate relative to the latch bolt, and wherein the rotating tab is positioned closely adjacent to the second jaw member in the locked configuration, to initiate the transition from the locked configuration to the unlocked configuration, the terminus is manually pushed into the latch bolt bore which causes the rotating tab to move away from second jaw member which provides clearance for manual purchase of the rotating tab for further pulling.
80. The bracket of embodiment 79, wherein a tab recess is formed on the second jaw member adjacent to the latch bolt bore and configured to receive the rotating tab when in the locked configuration to prevent inadvertent rotation of the tab.
81. The bracket of embodiment 79, wherein the rotating tab includes a detent mechanism interfacing between the end of the latch bolt and the rotating tab to temporarily arrest the rotation of the rotating tab at predetermined angular positions, wherein the rotating tab is configured to be rotated to an angular position where a portion of the rotating tab overhangs the second jaw member for improving manual purchase.
82. The bracket of any one of embodiments 69-81, wherein the first jaw member includes a first clamping face and the second jaw member includes a second clamping face spaced apart from and opposing the first clamping face in a clamping arrangement.

83. The bracket of embodiment 82, wherein a first engagement boss protrudes from the first clamping face and a second engagement boss protrudes from the second clamping face.
84. The bracket of embodiment 83, wherein the first engagement boss and the second engagement boss are each configured as an elongated boss.
85. The bracket of any one of embodiments 69-84, wherein a throat region is defined between the first jaw member and the second jaw member, a back side of the bracket defined opposite the throat region, a back plate is configured to slide within a back-plate recess to prevent undue flexure between the first jaw member and the second jaw member.
86. The bracket of embodiment 85, wherein the back plate is cantilevered from the first jaw member and the back-plate recess is formed on the second jaw member.
87. A bracket comprising: a first jaw member, a latching portion extending from the first jaw member arranged parallel to a first direction, a bolt channel being formed lengthwise on the latching portion, a bolt hole being formed within the bolt channel and being deeper than the bolt channel; a second jaw member slidably translatable relative to the first jaw member parallel to the first direction, a latching bore formed in the second jaw member arranged parallel to the first direction, a latch bolt bore being formed in the second jaw member arranged parallel to a second direction and perpendicular to the first direction, the latch bolt bore intersecting the latching guide pin bore, the latching portion slidably inserted within the latching bore; and a latch bolt slidably inserted within the latch bolt bore, a terminus of the latch bolt being inserted within the bolt hole in a locked configuration where movement of the second jaw member away from the first jaw member is substantially prevented, the terminus of the latch bolt configured to be positioned out of the bolt hole and within the bolt channel in an unlocked configuration where sliding of the second jaw member away from the first jaw member is permitted, with the terminus riding within the bolt channel as the second jaw member moves away from the first jaw member.
88. The bracket of embodiment 87, wherein the latching portion is a latching guide pin slidably inserted within the latching bore to guide travel of the second jaw member relative to the first jaw member in the first direction.
89. A rail for receiving a clamp having a first engagement boss spaced apart and in-line with a second engagement boss, the first engagement boss and the second engagement boss each having a boss width and a boss length, a first distance being defined between a first innermost edge of the first engagement boss and a second innermost edge of the second engagement boss, a second distance being defined between a first outermost edge of the first engagement boss and a second outermost edge of the second engagement boss, the rail comprising: a rail body having a first engagement surface, a second surface adjacent to the first engagement surface, and a third surface parallel, spaced apart, and facing oppositely of the first engagement surface with the second surface spanning between the first engagement surface and the third surface; a first engagement slot formed on the first engagement surface and configured to receive the first engagement boss and the second engagement boss, the first engagement slot having a first slot length at least as long as the second distance, and a first slot width at least as wide as the boss width; and a second engagement slot formed on the first engagement surface spaced apart and in-line with the first engagement slot, a slot spacing length between the first engagement slot and the second engagement slot, the slot spacing length at most as long as the first distance, and a second slot width at least as wide as the boss width; wherein, the combination of one or more of the first slot length, the first slot width, the slot spacing length, and the second slot width providing a fit that locates the first engagement boss and the second engagement boss of the clamp within at least the first engagement slot and prevents substantial movement of the clamp relative to the rail.
90. The rail of embodiment 89, wherein the first engagement slot and the second engagement slot are through slots.
91. The rail of embodiment 89 or 90, wherein the first engagement slot and the second engagement slot are the same length.
92. The rail of any one of embodiments 89-91, wherein the first engagement slot is longer than the second engagement slot.
93. The rail of embodiment 92, wherein the second engagement slot having a second slot length longer than the boss length and shorter than the second distance.
94. The rail of any one of embodiments 89-93, wherein the first engagement slot and the second engagement slot include a lead-in to ease the transition between the first engagement surface and each of the first engagement slot and the second engagement slot.
95. The rail of embodiment 94, wherein the lead-in is one or both of a chamfer and a fillet.
96. The rail of any one of embodiments 89-95, wherein the first engagement slot provides a locational clearance fit for receiving the first engagement boss and the second engagement boss for locating the clamp relative to the rail.
97. The rail of any one of embodiments 89-96, wherein the third surface is configured as a third engagement surface with a third engagement slot and a fourth engagement slot, the third engagement slot aligned with and matching the first engagement slot, the fourth engagement slot aligned with and matching the second engagement slot.
98. The rail of any one of embodiments 89-97, wherein the rail body comprises a first frame member, a second frame member, and a sidewall member, the first engagement surface being defined on a first frame member, the third surface being defined on a second frame member, and the second surface being defined on a sidewall frame member, the sidewall member being sandwiched between and spacing apart the first frame member and the second frame member, with the first frame member fastened to the second frame member.
99. The rail of embodiment 98, wherein a plurality of female threaded standoffs extend between the second frame member and the first frame member, a plurality of male threaded fasteners extend through each of the first frame member and the second frame member to thread into the plurality of female threaded standoffs to firmly fasten the first frame member and the second frame member.
100. The rail of embodiment 98 or 99, wherein the rail body is configured as a device protective case for a portable electronic device, and is configured to enclose a perimeter of the portable electronic device, the rail further comprising: a top cover plate configured to cover a screen of the portable electronic device and a bottom cover plate configured to cover a back of the portable electronic device; wherein, when assembled, the first frame member overlaps the top cover plate, the second frame member overlaps the bottom cover plate, the portable electronic device is configured to be sandwiched between the top cover plate and the bottom cover plate, the top cover plate is configured to be sandwiched between the first frame member and the screen, and the bottom cover plate is configured to be sandwiched between the second frame member and the back; and wherein, fastening the first frame member to the second frame member firmly holds device protective case and the portable electronic device therein firmly together in assembly.
101. The rail of embodiment 100 further comprising: an elastomeric gasket member having a groove configured to receive a perimeter edge of the portable electronic device with the elastomeric gasket member surrounding the perimeter edge; wherein the elastomeric gasket member is positioned between the first frame member and the top cover plate and positioned between the second frame member and the bottom cover; and wherein a water-tight seal is formed between the elastomeric gasket member and both the top cover plate and the bottom cover plate.
102. An adaptor comprising a) a hinged coupler comprising a coupler base and an inner knuckle, the inner knuckle comprising a barrel portion with a first end and a second end and a coupler extending perpendicularly from barrel portion, and b) a first device holder, the first device holder attached to the first end of the barrel portion of the inner knuckle,
103. An adaptor of embodiment 102 further comprising a second device holder, the second device holder attached to the second end of the barrel portion of the inner knuckle,
104. An adaptor of embodiment 102 or 103, wherein the inner knuckle is rotatably coupled to the coupler base.
105. An adaptor of embodiment 104, wherein the coupler base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the coupler base.
106. An adaptor comprising a coupler base including a first outer knuckle and a second outer knuckle, an inner knuckle and a latching socket including a socket body and a socket formed within the socket body.
107. The adaptor of embodiment 106, wherein the inner knuckle is rotatably coupled to the coupler base by a hinge pin inserted through the first outer knuckle, the inner knuckle and the second outer knuckle.
108. The adaptor of any one of embodiments 106 or 107, wherein the coupler base further comprises a first detent plunger and a second detent plunger, the first and second detent plungers each comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the inner knuckle further comprises a first row of detents that are annularly spaced apart and aligned and a second row of detents that are annularly spaced apart and aligned, the first and second row of detents being parallel to each other, wherein the first and second detent plungers are aligned with the first and second row of detents respectively, in a manner that the detent ball protruding from the open end of the detent cylinder will be seated in a detent from the first and second row of detents, and wherein an angular position of the inner knuckle is selectively controlled when a detent from the first and second row of detents is selectively brought into alignment with the detent ball of first and second detent plungers by relative rotation between the inner knuckle and the coupler base.
109. The adaptor of embodiment 108, wherein the first detent plunger is positioned by the first outer knuckle and oriented radially toward the inner knuckle and the second detent plunger is positioned by the second outer knuckle and oriented radially toward the inner knuckle.
110. The adaptor of any one of embodiments 106-109, wherein the inner knuckle is rotatably coupled to the latching socket by a detent mechanism, wherein a cylindrical drum portion of the latching socket is inserted into a cylindrical sleeve portion of the inner knuckle causing an end surface portion of the cylindrical sleeve portion to come into close proximity to an end surface of the cylindrical drum portion, wherein the inner knuckle further comprises one or more detent plungers, each of the one or more detent plungers comprising a detent cylinder with an open end and a closed end opposite the open end and a detent ball and a detent compression spring captured within the detent cylinder, the detent compression spring outwardly bias detent ball toward the open end of the detent cylinder in a manner that causes the detent ball to protrude from the open end of the detent cylinder, wherein the end surface of the cylindrical drum portion of the latching socket further comprises a ring of detents that are annularly spaced apart and located near the perimeter of the end surface of the cylindrical drum portion, wherein each of the one or more detent plungers is aligned with the ring of detents in a manner that the detent ball protruding from the open end of the detent cylinder of each of the one or more detent plungers will be seated in a detent from the ring of detents, and wherein a rotational position of the latching socket is selectively controlled when a detent from the from the ring of detents is selectively brought into alignment with the detent ball of each of the one or more detent plungers by relative rotation between the latching socket and the inner knuckle.
111. The adaptor of any one of embodiments 106-110, wherein the latching socket includes a) latching pin bore formed blindly in the body transversely to the socket and intersecting the socket, a spring bore being formed at a blind end of the latching pin bore and an open end of the latching pin bore opening through the socket body, b) a latching pin slidably fitted within the latching pin bore, the latching pin having a keyway notched laterally therein, the keyway including a locking edge, a purchase end of the latching pin protruding from the open end and a spring end positioned within the spring bore, c) a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in a unlocked configuration, the first end of the latching pin is manually pressed axially further into the latching pin bore to move the locking edge toward the spring bore.

112. The adaptor of embodiment 111, wherein the latching pin bore is formed orthogonally to the socket.

113. The adaptor of embodiment 111 or 112, wherein the latching socket further comprises a) a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and b) a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

114. The adaptor of embodiment 113, wherein the latching pin bore and the second latching pin bore are formed orthogonally to the socket, with the latching pin bore and the second latching pin bore axially parallel to one another.

115. The adaptor of any one of embodiments 111-114, wherein the locking edge of the keyway is configured to be engaged with the latch engagement portion of the attachment when the attachment is inserted within the socket in the locked configuration.

116. The adaptor of any one of embodiments 106-115, wherein the socket is hexagonally shaped.

EXAMPLES

The following non-limiting examples are provided for illustrative purposes only in order to facilitate a more complete understanding of representative embodiments now contemplated. These examples should not be construed to limit any of the embodiments described in the present specification, including those pertaining to the compounds, pharmaceutical compositions, or methods and uses disclosed herein.

Example 1

This example illustrates how to employ a mounting system disclosed herein to attach a video recorder onto a helmet.

A user has an motorcycle helmet and desires to secure a video recorder to the helmet. The user obtains a rail disclosed herein as shown in FIG. 5 and secures this rail, peels off a protective sheet from an adhesive layer present on the bottom side of the rail, and affixes the rail to an exterior surface portion of the helmet. The user then secures a bracket comprising a hinged coupler as shown in FIG. 55 to the rail by engaging the engagement bosses of first and second jaw members the bracket comprising a hinged coupler to engagement slots present on the rail. The use then attaches the video recorder to the helmet by screwing the threaded screw of a coupler disclosed herein as shown in FIG. 68 into a threaded hole present on the video recorder and then attaches the video recorder to the motorcycle helmet by inserting the other end of the coupler into the socket the hinged coupler thereby securing the video recorder to the motorcycle helmet.

In an alternative example, instead of employing a bracket comprising a hinged coupler as shown in FIG. 55, the user employs a bracket a shown in FIG. 28 and a bracket adaptor comprising a disc including first and second threaded screws centrally located, with the first threaded screw perpendicular to the top surface of the disc and the second threaded screw perpendicular to the bottom surface of the disc. The user attaches the bracket adaptor to the video recorder by screwing the first threaded screw of bracket adaptor into a threaded hole present on the video recorder. Either before or after attachment of bracket to rail affixed to the motorcycle helmet, the user attaches the video recorder to the bracket by screwing the second threaded screw of bracket adaptor into a threaded hole of an attachment point present on the bracket. If not already attached, the user then attaches the video recorder to the helmet by engaging the engagement bosses of first and second jaw members the bracket to engagement slots present on the rail, thereby securing the video recorder to the motorcycle helmet.

In an alternative example, the video recorder is a Go-Pro video recorder, and the user employs a bracket a shown in FIG. 28 and the bracket adaptor is the one shown at FIG. 46. Either before or after attachment of bracket to rail affixed to the helmet, the user attaches the bracket adaptor to the bracket by screwing the threaded screw of bracket adaptor into a threaded hole of an attachment point present on the bracket. The user then attaches the video recorder by aligning the holes present on the bracket adaptor and the bracket present on the video recorder, inserting a treaded pin and securing the threaded pin in a manner that attached the video recorder to the bracket attachment. In not already attached, the user then secures the bracket to the rail by engaging the engagement bosses of first and second jaw members the bracket to engagement slots present on the rail, thereby securing the video recorder to the motorcycle helmet.

In an alternative example to the ones above, the helmet is a bicycle helmet.

Example 2

This example illustrates how to employ a mounting system disclosed herein to attach a night vision google onto a helmet.

A user has an ACH helmet comprising a shroud bracket and desires to secure a night vision google (NVG) using this bracket. The user obtains a rail disclosed herein as shown in FIG. 6 and secures this rail into the shroud bracket. The use then obtains a rail disclosed herein as shown in FIG. 2 and secures this rail to a portion of the NVG. The user then secures a bracket comprising a hinged coupler as shown in FIG. 55 to the rail secured on the shroud bracket by engaging the engagement bosses of first and second jaw members the bracket comprising a hinged coupler to engagement slots present on the rail. The user similarly secures a bracket comprising a hinged coupler as shown in FIG. 55 to the rail secured on the NVG by engaging the engagement bosses of first and second jaw members the bracket comprising a hinged coupler to engagement slots present on the rail. The use then attaches the NVG to the helmet by inserting a coupler disclosed herein as shown in FIG. 57 into the sockets of both hinged couplers thereby securing the NVG to the helmet. In this set-up, when the user desires to stow away the NVG, the user can fold the NVG up in close proximity to the rail affixed to the helmet. Likewise, when use is desired, the use can move the NVG downward from the helmet in a manner that aligns the optical sights of the NVG with one or both eyes of the user to view the environment using the NVG.

Example 3

This example illustrates how to employ a mounting system disclosed herein to attach a device in a device case disclosed herein onto a load bearing equipment vest.

A user has a smart phone and desires to secure the phone to a load bearing equipment vest, like a MOLLE load bearing system, a PALS load bearing system, an IIFS load bearing system, or an ALICE load bearing system. The user obtains a rail disclosed herein as shown in FIG. 3 and secures this rail on the load bearing equipment vest using screws, rivets or both. The user then obtains a rail disclosed herein designed as a device case as shown in FIG. 8 and encloses the phone inside the device case. The user then secures a bracket comprising a hinged coupler as shown in FIG. 55 to the rail secured on the load bearing equipment vest by engaging the engagement bosses of first and second jaw members the bracket comprising a hinged coupler to engagement slots present on the rail. The user similarly secures a bracket comprising a hinged coupler as shown in FIG. 55 to the device case by engaging the engagement bosses of first and second jaw members the bracket comprising a hinged coupler to engagement slots present on the device case. The user then attaches the device case to the load bearing equipment vest by inserting a coupler disclosed herein as shown in FIG. 57 into the sockets of both hinged couplers thereby securing the device case to the load bearing equipment vest. In this set-up, when the user desires to stow away the device case, the user can fold the device case in close proximity to the load bearing equipment vest. Likewise, when use is desired, the use can extend the device case away from the load bearing equipment vest to view the device encased in the device case.

In an alternative example, instead of employing both brackets comprising a hinged coupler as shown in FIG. 55, the user employs a bracket a shown in FIG. 28 and a bracket adaptor comprising a disc including first and second threaded screws centrally located, with the first threaded screw perpendicular to the top surface of the disc and the second threaded screw perpendicular to the bottom surface of the disc. The user attaches the bracket adaptor to the device case by screwing the first threaded screw of bracket adaptor into a threaded hole of an attachment point present on the device case. Either before or after attachment of bracket to rail affixed to the load bearing equipment vest, the user attaches the device case to the bracket by screwing the second threaded screw of bracket adaptor into a threaded hole of an attachment point present on the bracket. If not already attached, the user then attaches the device case to the load bearing equipment vest by engaging the engagement bosses of first and second jaw members the bracket to engagement slots present on the rail, thereby securing the device case to the load bearing equipment vest.

Example 4

This example illustrates how to employ a mounting system disclosed herein to attach a device in a device case disclosed herein onto a dashboard of a vehicle.

A user has a smart phone and desires to secure the phone to the dashboard of a car. The user obtains a rail disclosed herein as shown in FIG. 3 and secures this rail, peels off a protective sheet from an adhesive layer present on the bottom side of the rail, and affixes the rail to an exterior surface portion of the dashboard. The user then obtains a rail disclosed herein designed as a device case as shown in FIG. 8 and encloses the phone inside the device case. The user then secures a bracket comprising a hinged coupler as shown in FIG. 55 to the rail secured on the dashboard by engaging the engagement bosses of first and second jaw members the bracket comprising a hinged coupler to engagement slots present on the rail. The user similarly secures a bracket comprising a hinged coupler as shown in FIG. 55 to the device case by engaging the engagement bosses of first and second jaw members the bracket comprising a hinged coupler to engagement slots present on the device case. The user then attaches the device case to the dashboard by inserting a coupler disclosed herein as shown in FIG. 57 into the sockets of both hinged couplers thereby securing the device case to the dashboard.

In an alternative example, instead of employing both brackets comprising a hinged coupler as shown in FIG. 55, the user employs a bracket a shown in FIG. 28 and a bracket adaptor comprising a disc including first and second threaded screws centrally located, with the first threaded screw perpendicular to the top surface of the disc and the second threaded screw perpendicular to the bottom surface of the disc. The user attaches the bracket adaptor to the device case by screwing the first threaded screw of bracket adaptor into a threaded hole of an attachment point present on the device case. Either before or after attachment of bracket to rail affixed to the dashboard, the user attaches the device case to the bracket by screwing the second threaded screw of bracket adaptor into a threaded hole of an attachment point present on the bracket. If not already attached, the user then attaches the device case to the dashboard by engaging the engagement bosses of first and second jaw members the bracket to engagement slots present on the rail, thereby securing the device case to the dashboard.

In an alternative example to the ones above, the rail is affixed to an interior surface of a window present in the car, like a windshield, rear window, driver window or passenger window.

Example 5

This example illustrates how to employ a mounting system disclosed herein to attach a video recorder onto a dashboard of a vehicle.

A user has a video recorder and desires to secure the video recorder to the dashboard of a car. The user obtains a rail disclosed herein as shown in FIG. 3 and secures this rail, peels off a protective sheet from an adhesive layer present on the bottom side of the rail, and affixes the rail to an exterior surface portion of the dashboard. The user then secures a bracket comprising a hinged coupler as shown in FIG. 55 to the rail by engaging the engagement bosses of first and second jaw members the bracket comprising a hinged coupler to engagement slots present on the rail. The use then attaches the video recorder to the dashboard by screwing the threaded screw of a coupler disclosed herein as shown in FIG. 68 into a threaded hole present on the video recorder and then attaches the video recorder to the dashboard by inserting the other end of the coupler into the socket the hinged coupler thereby securing the video recorder to the dashboard.

In an alternative example, instead of employing a bracket comprising a hinged coupler as shown in FIG. 55, the user employs a bracket a shown in FIG. 28 and a bracket adaptor comprising a disc including first and second threaded screws centrally located, with the first threaded screw perpendicular to the top surface of the disc and the second threaded screw perpendicular to the bottom surface of the disc. The user attaches the bracket adaptor to the video recorder by screwing the first threaded screw of bracket adaptor into a threaded hole present on the video recorder. Either before or after attachment of bracket to rail affixed to the dashboard, the user attaches the video recorder to the bracket by screwing the second threaded screw of bracket adaptor into a threaded hole of an attachment point present on the bracket. If not already attached, the user then attaches the video recorder to the dashboard by engaging the engagement bosses of first and second jaw members the bracket to engagement slots present on the rail, thereby securing the video recorder to the dashboard.

In an alternative example, the video recorder is a Go-Pro video recorder, and the user employs a bracket a shown in FIG. 28 and the bracket adaptor is the one shown at FIG. 46. Either before or after attachment of bracket to rail affixed to the dashboard, the user attaches the bracket adaptor to the bracket by screwing the threaded screw of bracket adaptor into a threaded hole of an attachment point present on the bracket. The user then attaches the video recorder by aligning the holes present on the bracket adaptor and the bracket present on the video recorder, inserting a treaded pin and securing the threaded pin in a manner that attached the video recorder to the bracket attachment. In not already attached, the user then secures the bracket to the rail by engaging the engagement bosses of first and second jaw members the bracket to engagement slots present on the rail, thereby securing the video recorder to the dashboard.

In an alternative example to the ones above, the rail is affixed to an interior surface of a window present in the car, like a windshield, rear window, driver window or passenger window.

Example 6

This example illustrates how to employ a mounting system disclosed herein to attach a device in a device case disclosed herein onto a load bearing equipment vest and additional components of the mounting system disclosed herein to the device case.

A user attaches a device case to a rail secured on a load bearing equipment vest using any of the procedures described in Example 3. The user then secures a bracket comprising a hinged coupler as shown in FIG. 55 to the device in a position opposite the location of where the device case is attached to the rail by engaging the engagement bosses of first and second jaw members the bracket comprising a hinged coupler to engagement slots present on the rail. The user then obtains an adaptor as shown in adaptor and attaches the adaptor to the device case by inserting a coupler disclosed herein as shown in FIG. 70 into the socket of the hinged coupler thereby securing the adaptor to the device case. The user then attached a GPS, a compass and a flashlight to the adaptor as shown in FIG. 71. In this set-up, when the user desires to stow away the devices, the user can fold the adaptor in close proximity to one side of the device case and then fold the device case-adaptor assembly in close proximity to the load bearing equipment vest. Likewise, when use is desired, the use can extend the device case-adaptor assembly away from the load bearing equipment vest to view the device encased in the device case, and then further extend the adaptor to view the devices contained therein.

Example 7

This example illustrates how to employ a mounting system disclosed herein to attach a device in a device case disclosed herein alternatively onto a dashboard or a load bearing equipment vest.

A user secures a rail disclosed herein as shown in FIG. 3 to a load bearing equipment vest using any of the procedures described in Example 3. The user secures a rail disclosed herein as shown in FIG. 3 to a dashboard using any of the procedures described in Example 4. The user encases a device in a device case disclosed herein as shown in FIG. 8 as described in Example 3. In use, when entering a vehicle the user can attach the device case to the rail secured on dashboard using any of the procedures described in Example 4. When leaving the vehicle the user can detach the device case from the rail on the dashboard and then attach the device case to the rail secured on the load bearing equipment vest using any of the procedures described in Example 3.

In an alternative example, instead of the device case, the user employs the mounting system disclosed herein for a video recorder. In this case, when entering a vehicle the user can attach the video recorder to the rail secured on dashboard using any of the procedures described in Example 5. When leaving the vehicle the user can detach the video recorder from the rail on the dashboard and then attach the video recorder to the rail secured on the load bearing equipment vest using any of the procedures described in Example 3 or attach the video recorder to the rail secured on a helmet using any of the procedures described in Example 1.

In closing, it is to be understood that although aspects of the present specification are highlighted by referring to specific embodiments, one skilled in the art will readily appreciate that these disclosed embodiments are only illustrative of the principles of the subject matter disclosed herein. Therefore, it should be understood that the disclosed subject matter is in no way limited to a particular compound, composition, article, apparatus, methodology, protocol, and/or reagent, etc., described herein, unless expressly stated as such. In addition, those of ordinary skill in the art will recognize that certain changes, modifications, permutations, alterations, additions, subtractions and sub-combinations thereof can be made in accordance with the teachings herein without departing from the spirit of the present specification. It is therefore intended that the following appended claims and claims hereafter introduced are interpreted to include all such changes, modifications, permutations, alterations, additions, subtractions and sub-combinations as are within their true spirit and scope.

Certain embodiments of the present invention are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the present invention to be practiced otherwise than specifically described herein. Accordingly, this invention includes all modifications and equivalents of the subject matter recited in the claims appended hereto as permitted by applicable law. Moreover, any combination of the above-described embodiments in all possible variations thereof is encompassed by the invention unless otherwise indicated herein or otherwise clearly contradicted by context.

Groupings of alternative embodiments, elements, or steps of the present invention are not to be construed as limitations. Each group member may be referred to and claimed individually or in any combination with other group members disclosed herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Use of the terms "may" or "can" in reference to an embodiment or aspect of an embodiment also carries with it the alternative meaning of "may not" or "cannot." As such, if the present specification discloses that an embodiment or an aspect of an embodiment may be or can be included as part of the inventive subject matter, then the negative limitation or exclusionary proviso is also explicitly meant, meaning that an embodiment or an aspect of an embodiment may not be or cannot be included as part of the inventive subject matter. In a similar manner, use of the term "optionally" in reference to an embodiment or aspect of an embodiment means that such embodiment or aspect of the embodiment may be included as part of the inventive subject matter or may not be included as part of the inventive subject matter. Whether such a negative limitation or exclusionary proviso applies will be based on whether the negative limitation or exclusionary proviso is recited in the claimed subject matter.

The terms "a," "an," "the" and similar references used in the context of describing the present invention (especially in the context of the following claims) are to be construed to cover both the singular and the plural, unless otherwise indicated herein or clearly contradicted by context. Further, ordinal indicators—such as "first," "second," "third," etc.—for identified elements are used to distinguish between the elements, and do not indicate or imply a required or limited number of such elements, and do not indicate a particular position or order of such elements unless otherwise specifically stated. All methods described herein can be performed in any suitable order unless otherwise indicated herein or otherwise clearly contradicted by context. The use of any and all examples, or exemplary language (e.g., "such as") provided herein is intended merely to better illuminate the present invention and does not pose a limitation on the scope of the invention otherwise claimed. No language in the present specification should be construed as indicating any non-claimed element essential to the practice of the invention.

When used in the claims, whether as filed or added per amendment, the open-ended transitional term "comprising", variations thereof such as "comprise" and "comprises", and equivalent open-ended transitional phrases thereof like "including," "containing" and "having", encompasses all the expressly recited elements, limitations, steps, integers, and/or features alone or in combination with unrecited subject matter; the named elements, limitations, steps, integers, and/or features are essential, but other unnamed elements, limitations, steps, integers, and/or features may be added and still form a construct within the scope of the claim. Specific embodiments disclosed herein may be further limited in the claims using the closed-ended transitional phrases "consisting of" or "consisting essentially of" (or variations thereof such as "consist of", "consists of", "consist essentially of", and "consists essentially of") in lieu of or as an amendment for "comprising." When used in the claims, whether as filed or added per amendment, the closed-ended transitional phrase "consisting of" excludes any element, limitation, step, integer, or feature not expressly recited in the claims. The closed-ended transitional phrase "consisting essentially of" limits the scope of a claim to the expressly recited elements, limitations, steps, integers, and/or features and any other elements, limitations, steps, integers, and/or features that do not materially affect the basic and novel characteristic(s) of the claimed subject matter. Thus, the meaning of the open-ended transitional phrase "comprising" is being defined as encompassing all the specifically recited elements, limitations, steps and/or features as well as any optional, additional unspecified ones. The meaning of the closed-ended transitional phrase "consisting of" is being defined as only including those elements, limitations, steps, integers, and/or features specifically recited in the claim whereas the meaning of the closed-ended transitional phrase "consisting essentially of" is being defined as only including those elements, limitations, steps, integers, and/or features specifically recited in the claim and those elements, limitations, steps, integers, and/or features that do not materially affect the basic and novel characteristic(s) of the claimed subject matter. Therefore, the open-ended transitional phrase "comprising" (and equivalent open-ended transitional phrases thereof) includes within its meaning, as a limiting case, claimed subject matter specified by the closed-ended transitional phrases "consisting of" or "consisting essentially of." As such embodiments described herein or so claimed with the phrase "comprising" are expressly or inherently unambiguously described, enabled and supported herein for the phrases "consisting essentially of" and "consisting of."

Lastly, the terminology used herein is for the purpose of describing particular embodiments only and is not intended to limit the scope of the present invention, which is defined solely by the claims. Accordingly, the present invention is not limited to that precisely as shown and described.

The invention claimed is:

1. A mounting system comprising
    a. a bracket, the bracket comprising a first jaw member, the first jaw member comprising an inner surface including a first mating portion and a first clamping portion, the first clamping portion including one or more engagement bosses, a second jaw member, the second jaw member comprising an inner surface including a second mating portion and a second clamping portion, the second clamping portion including one or more engagement bosses, a pin assembly comprising a latching pin including a latch bolt hole and a guide pin, the latching pin and the guide pin being perpendicular to the first and second clamping portions of the first and second jaw members, and a latch bolt assembly comprising a latch bolt slidably insertable through a latch bolt bore, the latch bolt having cylindrical body and including a first end and a second end, wherein the latch bolt assembly is housed in the second jaw member, wherein the pin assembly connects the first and second jaw members, wherein the pin assembly is configured to slidably translate the first and second jaw members toward one another in a first direction or away from one another in a direction opposite the first direction, and wherein the bracket can adopt an open configuration and a closed configuration;
    b. a rail including a rail body, the rail body comprising a first engagement surface comprising one or more engagement slots, a second engagement surface comprising one or more engagement slots, a third surface, wherein the first engagement surface is adjacent the third surface, the second engagement surface is adjacent the third engagement surface and the second engagement surface is parallel, spaced apart and facing oppositely the first engagement surface, with the third engagement surface spanning between the first engagement surface and the second engagement surface;

wherein the one or more engagement slots of the first engagement surface of the rail body are configured to receive the one or more engagement bosses of the first jaw member of the bracket and the one or more engagement slots of the second engagement surface of the rail body are configured to receive the one or more engagement bosses of the second jaw member of the bracket.

2. The mounting system of claim 1, wherein the bracket further comprises one or more jaw compression springs, each of the one or more jaw compression springs including a first end and a second end, wherein the first end is seated in a locating hole present on the first mating portion of the first jaw member and the second end is seated in a locating hole present on the second mating portion of the second jaw member, wherein one or more jaw compression springs provide a separating bias that forces the first jaw member and the second jaw member apart.

3. The mounting system of claim 1, wherein the latch bolt of the bracket further comprises latch bolt spring that provides a separating bias that forces the latch bolt in a direction outward of latch bolt bore.

4. The mounting system of claim 1, wherein when the bracket is in the closed configuration, first and second jaw members are in close proximity to one another and the latch bolt is inserted in latch bolt hole of the latching pin.

5. The mounting system of claim 1, wherein when the bracket is in the open configuration, first and second jaw members are apart from one another and the latch bolt is removed from latch bolt hole of the latching pin.

6. The mounting system of claim 1, wherein the bracket further comprises a back plate and a back-plate recess, the back plate is cantilevered from the first jaw member and the back-plate recess is formed on the second jaw member.

7. The mounting system of claim 1, wherein the third engagement surface of the rail further comprises a plurality of through holes.

8. The mounting system of claim 1, wherein the rail further comprising a base support.

9. The mounting system of claim 8, wherein the base support of the rail comprises an adhesive layer on the side that will come in contact with a support.

10. The mounting system of claim 8, wherein the base support of the rail comprises one or more tabs configured to be inserted into one or more pockets or pouches on a base support mount.

11. The mounting system of claim 1, wherein the rail is a device case, the device case comprising
a. a first frame member, the first frame member including the first engagement surface, the first engagement surface further comprising a plurality of through holes,
b. a second frame member, the second frame member including the second engagement surface, the second engagement surface further comprising a plurality of through holes,
c. a sidewall frame member, the sidewall frame member including the third engagement surface, and
d. a gasket, the gasket being composed of an elastomeric material and shaped to configure to at least fit around an outer perimeter of a device and align in close proximity with an inside surface of the sidewall frame member,
wherein the sidewall frame member is sandwiched between and spaces apart the first frame member and the second frame member, and in a manner that forming an interior space for a device to fit therein and aligns each through hole of the plurality of through holes from the first frame member with each through hole of the plurality of through holes from the second frame member to form a plurality of paired through holes,
wherein the first frame member and the second frame member compressively bear down on the sidewall frame member by securing the first frame member to the second frame member using a plurality of screws, each screw of the plurality of screws inserted through a paired through hole of the plurality of paired through holes from the first and second frame member, and
wherein the device case forms a water-tight seal preventing moisture from entering the interior space.

12. The mounting system of claim 11, wherein the sidewall frame member further comprises an attachment point and one or more indexing holes.

13. The mounting system of claim 12, further comprising a device case adaptor, the device case adaptor comprising an indexing plate and an adaptor plate, the indexing plate including one or more indexing pins configured to align and insert into one or more indexing holes and the adaptor plate including a coupler on a first surface of the adaptor plate and a threaded screw on a second surface of the adaptor plate.

14. The mounting system of claim 11, wherein the sidewall frame member is configured to receive the sealing plate, the sealing plate comprising one or more through ports.

15. The mounting system of claim 1, wherein the bracket further comprises an outer surface comprising a hinged coupler, the hinged coupler comprising a coupler base including a first outer knuckle and a second outer knuckle, an inner knuckle and a latching socket including a socket body and a socket formed within the socket body.

16. The mounting system of claim 15, wherein the inner knuckle is rotatably coupled to the coupler base by a hinge pin inserted through the first outer knuckle, the inner knuckle and the second outer knuckle.

17. The mounting system of claim 15, wherein the inner knuckle is rotatably coupled to the latching socket.

18. The mounting system of claim 15, wherein the latching socket includes
a. a latching pin bore formed blindly in the body transversely to the socket and intersecting the socket, a spring bore being formed at a blind end of the latching pin bore and an open end of the latching pin bore opening through the socket body
b. a latching pin slidably fitted within the latching pin bore, the latching pin having a keyway notched laterally therein, the keyway including a locking edge, a purchase end of the latching pin protruding from the open end and a spring end positioned within the spring bore;
c. a spring positioned within the spring bore between the blend end of the latching pin bore and the spring end of the latching pin, the spring biasing the latching pin toward the open end of the spring bore; wherein, in a locked configuration, the keyway is biased to be misaligned with the latching pin bore so that the locking edge of the keyway is positioned within the latching pin bore; and wherein, in an unlocked configuration, the first end of the latching pin is manually pressed axially further into the latching pin bore to move the locking edge toward the spring bore.

19. The mounting system of claim 18, wherein the latching socket further comprises
   a. a second latching pin bore formed blindly in the body transversely to the socket and intersecting the socket, a second spring bore being formed at a second blind end of the second latching pin bore and an second open end of the latching pin bore opening through the socket body, the second latching pin bore positioned apart from the latching pin bore; and
   b. a second latching pin slidably fitted within the second latching pin bore, the second latching pin having a second keyway notched laterally therein, the second keyway including a second locking edge, a second purchase end of the latching pin protruding from the second open end and a second spring end positioned within the second spring bore.

20. The mounting system of claim 15, further comprising an adaptor, the adaptor comprising
   a. a hinged coupler comprising a coupler base and an inner knuckle, the inner knuckle comprising a barrel portion with a first end and a second end and a coupler extending perpendicularly from barrel portion, and
   b. a first device holder, the first device holder attached to the first end of the barrel portion of the inner knuckle.

* * * * *